(12) United States Patent
Iwasa et al.

(10) Patent No.: US 6,468,887 B2
(45) Date of Patent: Oct. 22, 2002

(54) SEMICONDUCTOR DEVICE AND A METHOD OF MANUFACTURING THE SAME

(75) Inventors: Shoichi Iwasa; Tatsuya Kawamata, both of Tokyo (JP)

(73) Assignee: Nippon Steel Corporation, Tokyo (JP)

( * ) Notice: Subject to any disclaimer, the term of this patent is extended or adjusted under 35 U.S.C. 154(b) by 0 days.

(21) Appl. No.: 09/906,708

(22) Filed: Jul. 18, 2001

(65) Prior Publication Data

US 2002/0125536 A1 Sep. 12, 2002

Related U.S. Application Data

(62) Division of application No. 09/054,399, filed on Apr. 3, 1998, now Pat. No. 6,288,431.

(30) Foreign Application Priority Data

Apr. 4, 1997 (JP) ............................................. 9-102743
Jun. 13, 1997 (JP) ............................................. 9-173112

(51) Int. Cl.$^7$ ..................... H01L 21/3205; H01L 21/336
(52) U.S. Cl. .................... 438/585; 438/149; 438/159; 438/197; 438/283; 438/593
(58) Field of Search ................................ 438/400, 283, 438/299, 197; 436/585, 593, 480, 149, 159, 166

(56) References Cited

U.S. PATENT DOCUMENTS 4,979,014 A  * 12/1990  Hieda et al. ................. 257/394
5,391,506 A  *  2/1995  Tada et al. ................... 438/300
5,607,865 A  *  3/1997  Choi et al. ..................... 257/63
5,612,255 A  *  3/1997  Chapple-Sokol et al. ... 438/197
5,872,037 A  *  2/1999  Iwamatsu et al. ........... 438/268

FOREIGN PATENT DOCUMENTS

| JP | 1-248557 | 10/1989 |
| JP | 4-294585 | 10/1992 |
| JP | 5-198817 | 8/1993 |
| JP | 6-310595 | 11/1994 |

* cited by examiner

Primary Examiner—Michael Trinh
(74) Attorney, Agent, or Firm—Connolly Bove Lodge & Hutz LLP

(57) ABSTRACT

In a semiconductor device of this invention, a pillar projection serving as a very thin active region is formed on the surface of a p-type silicon semiconductor substrate. A gate electrode 21 is formed to cover a central portion of the pillar projection. A pair of impurity diffusion layers 22 are formed on the pillar projection on the two sides of the gate electrode. An element isolation insulating film 23 is formed to sandwich and bury the side surfaces of the pillar projection. This semiconductor device has high performance equivalent to that of an SOI structure. The semiconductor device of this invention has three channels corresponding to a pair of a source and a drain, is selectively formed on the same semiconductor substrate as a common bulk transistor, and has a very fine structure and high drivability.

30 Claims, 42 Drawing Sheets

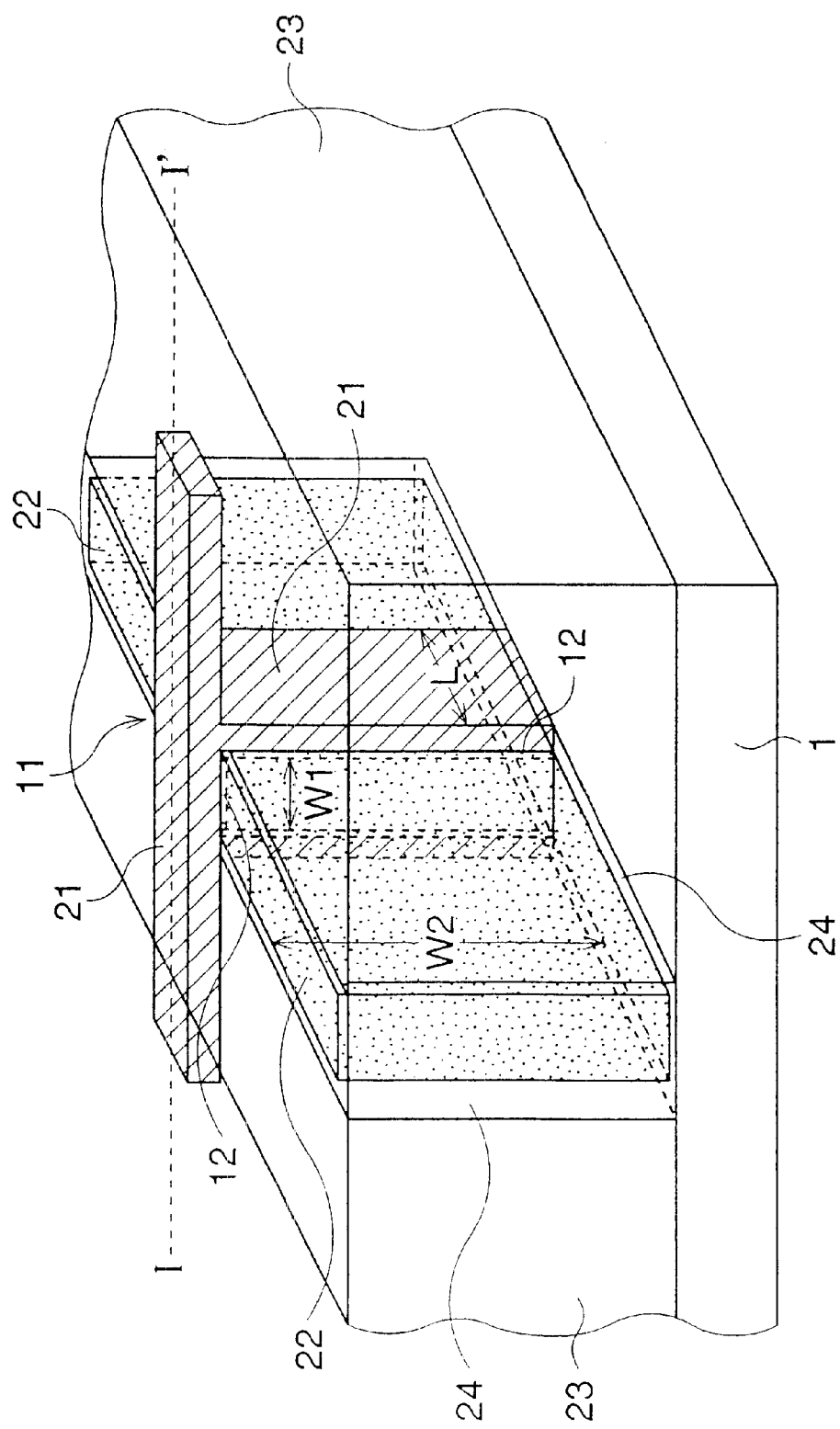

SEMICONDUCTOR DEVICE AND A METHOD OF MANUFACTURING THE SAME

CROSS REFERENCE TO RELATED APPLICATIONS

The present application is a divisional of U.S. patent application Ser. No. 09/054,399, filed Apr. 3, 1998, now U.S. Pat. No. 6,288,431.

BACKGROUND OF THE INVENTION

1. [Field of the Invention]

The present invention relates to a so-called DELTA (DEpleted Lean channel TrAnsistor) semiconductor device and a method of fabricating the same.

2. [Description of the Related Art]

A so-called DELTA semiconductor element has attracted attention as a semiconductor element meeting demands for a finer diffusion layer and a higher integration degree in recent years. This semiconductor element has an SOI structure in which a pillar projecting semiconductor layer is formed on a semiconductor substrate via an insulating layer for element isolation, a gate electrode is formed to cover a central portion of this semiconductor layer via a gate insulating film, and a source and a drain are formed in the semiconductor layer on the two sides of the gate electrode. A channel between the source and the drain is depleted to achieve high drivability.

More specifically, Japanese Patent Laid-Open No. 6-310595 has disclosed a method of forming an element isolation region above a semiconductor substrate including a pillar projection by ion-implanting oxygen into the semiconductor substrate.

Also, Japanese Patent Laid-Open No. 5-198817 or 4-294585 has disclosed a structure in which a gate electrode is so formed as to bury upper and lower portions of a pillar projection or a trench and a source and a drain are formed on the bottom of the trench.

Furthermore, as one example of semiconductor devices similar to the DELTA semiconductor device, Japanese Patent Laid-Open No. 1-248557 has disclosed a semiconductor device in which a gate electrode is so formed as to surround the side surfaces of a pillar projection formed on a semiconductor substrate, diffusion regions serving as a source and a drain are formed on the upper surface of the pillar projection and in the semiconductor substrate around the pillar projection, and a capacitor is so formed as to be connected to the diffusion region on the upper surface of the pillar projection.

In the semiconductor device disclosed in Japanese Patent Laid-Open No. 6-310595, however, an element isolation insulating film must be formed on a semiconductor substrate, although the film is not a thick oxide film such as a field oxide film formed by a LOCOS process. This unavoidably complicates the fabrication process.

In the semiconductor device disclosed in Japanese Patent Laid-Open No. 5-198817 or 4-294585, only a source and a drain are formed in upper and lower portions of a pillar projection formed on a semiconductor substrate. That is, this device structure does not meet demands for multiple channels in recent years.

In the semiconductor device disclosed in Japanese Patent Laid-Open No. 1-248557, agate electrode is so formed as to cover the side surfaces of a pillar projection by anisotropic etching. Therefore, it is impossible to make the film thickness and the shape of the gate electrode uniform. Consequently, the shape of the gate electrode becomes very difficult to control as the dimensions of an element are further decreased.

SUMMARY OF THE INVENTION

It is an object of the present invention to provide a semiconductor device having three channels corresponding to a pair of a source and a drain, selectively formed on the same semiconductor substrate as a common bulk transistor, and having a very fine structure and high drivability, and a method of fabricating this semiconductor device.

A semiconductor device of the present invention is a semiconductor device comprising a gate, a source, and a drain, wherein a surface of a semiconductor substrate is processed into a shape having a pillar projection which functions as an element active region, the gate is formed via a gate insulating film so as to cover a substantially central portion of a surface of the pillar projection, the source and drain are formed by doping an impurity into portions of the pillar projection on two sides of the gate, and an element isolation insulating film is so formed on the semiconductor substrate as to bury side surfaces of the pillar projection, and said gate electrode is formed between at least a part of side surfaces of said element isolation insulating film and said pillar projection, with in a space between side surfaces of said element isolation insulating film and a gate insulating film formed on the side surfaces of said pillar projection.

Another aspect of the semiconductor device of the present invention comprises a semiconductor substrate processed into a shape having an integrally formed pillar projection on a surface, a conductive film formed by patterning via a first insulating film so as to cover a substantially central portion of a surface of the pillar projection, a pair of diffusion regions formed by doping an impurity into portions of the pillar projection on two sides of the conductive film, and a second insulating film so formed on the semiconductor substrate as to bury side surfaces of the pillar projection, and said conductive film comprises an extension portion extending on said second insulating film.

Still another aspect of the semiconductor device of the present invention comprises a semiconductor substrate processed into a shape having an integrally formed pillar projection on a surface, first and second conductive films formed via a first insulating film so as to cover substantially central portions of two side surfaces of the pillar projection and opposing each other while electrically isolated from each other, a third conductive film formed via a second insulating film so as to cover a substantially central portion of an upper surface of the pillar projection and electrically isolated from the first and second conductive films, a pair of diffusion regions formed by doping an impurity into portions of the pillar projection on two sides of the first, second, and third conductive films, and a third insulating film so formed on the semiconductor substrate as to bury the side surfaces of the pillar projection.

Still another aspect of the semiconductor device of the present invention comprises a semiconductor substrate processed into a shape having an integrally formed pillar projection on a surface, first and second conductive films formed via a first insulating film so as to cover substantially central portions of two side surfaces of the pillar projection and opposing each other while electrically isolated from each other via the first insulating film and the pillar projection, diffusion regions formed by doping an impurity into an upper surface region of the pillar projection and a surface region of the semiconductor substrate below the first and second conductive films formed via the first insulating film, and a second insulating film so formed on the semiconductor substrate as to bury the side surfaces of the pillar projection.

Still another aspect of the semiconductor device of the present invention is a semiconductor device comprising a semiconductor substrate and first, second, and third transistors having first, second, and third gates and a source and a drain shared by the first, second, and third gates, wherein the semiconductor substrate is processed into a shape having a pillar projection which functions as an element active region on a surface, the first and second gates are formed via a first gate insulating film so as to cover substantially central portions of two side surfaces of the pillar projection and oppose each other while electrically isolated from each other, the third gate is formed via a second gate insulating film so as to cover a substantially central portion of an upper surface of the pillar projection and electrically isolated from the first and second gates, the source and drain are formed by doping an impurity into portions of the pillar projection on two sides of the first, second, and third gates, and an element isolation insulating film is so formed on the semiconductor substrate as to bury side surfaces of the pillar projection.

Still another aspect of the semiconductor device of the present invention is a semiconductor device comprising a semiconductor substrate and first and second transistors having first and second gates and a source and a drain shared by the first and second gates, wherein the semiconductor substrate is processed into a shape having a pillar projection which functions as an element active region on a surface, the first and second gates are formed via a gate insulating film so as to cover a substantially central portion of a surface of the pillar projection and oppose each other while electrically isolated from each other, the source is formed by doping an impurity into a surface region of the semiconductor substrate below the pillar projection, the drain is formed by doping an impurity into an upper surface region of the pillar projection, and an element isolation insulating film is so formed on the semiconductor substrate as to bury side surfaces of the pillar projection.

A method of fabricating a semiconductor device of the present invention comprises the first step of forming a first insulating film having a low etching rate on a semiconductor substrate, the second step of processing the first insulating film and the semiconductor substrate to form a pillar projection having a predetermined width on a surface of the semiconductor substrate, the third step of forming a second insulating film only on side surfaces of the pillar projection and the first insulating film, the fourth step of forming a third insulating film having an enough thickness to bury the pillar projection and the first insulating film and polishing the third insulating film by using the first insulating film as a stopper, the fifth step of partially removing the second and third insulating films together with the first insulating film, the sixth step of forming narrow gaps by selectively removing portions of the second insulating film, thereby exposing portions of the two side surfaces of the pillar projection and portions of the surface of the semiconductor substrate near the pillar projection, the seventh step of forming a fourth insulating film covering inner walls of the narrow gaps, the eighth step of forming a conductive film on the third insulating film so as to bury the narrow gaps via the fourth insulating film and processing the conductive film into a predetermined shape, and the ninth step of doping an impurity into the pillar projection to form a pair of diffusion regions on two sides of the conductive film.

Another aspect of the method of fabricating a semiconductor device of the present invention comprises the first step of forming a first insulating film having a low etching rate on a semiconductor substrate, the second step of processing the first insulating film and the semiconductor substrate to form a pillar projection having a predetermined width on a surface of the semiconductor substrate, the third step of forming a second insulating film only on side surfaces of the pillar projection and the first insulating film, the fourth step of forming a third insulating film having an enough thickness to bury the pillar projection and the first insulating film and polishing the third insulating film by using the first insulating film as a stopper, the fifth step of partially removing the second and third insulating films together with the first insulating film, the sixth step of forming narrow gaps by selectively removing portions of the second insulating film, thereby exposing portions of the two side surfaces of the pillar projection and portions of the surface of the semiconductor substrate near the pillar projection, the seventh step of forming a fourth insulating film covering inner walls of the narrow gaps, the eighth step of forming a first conductive film on the third insulating film so as to bury the narrow gaps via the fourth insulating film and processing the first conductive film into a predetermined shape, the ninth step of forming a pair of diffusion regions by doping an impurity into the pillar projection by using the first conductive film as a mask, the tenth step of processing the first conductive film to divide the first conductive film via the fourth insulating film on the pillar projection, and the eleventh step of forming, by patterning, a second conductive film opposing an upper surface of the pillar projection via the fourth insulating film and insulated from the first conductive film.

Still another aspect of the method of fabricating a semiconductor device of the present invention comprises the first step of forming a first insulating film on a semiconductor substrate by patterning and forming a second insulating film so as to cover the first insulating film, the second step of anisotropically etching an entire surface of the second insulating film to leave the second insulating film behind only on side surfaces of the first insulating film, the third step of selectively removing only the first insulating film, the fourth step of processing the semiconductor substrate by using the second insulating film as a mask, thereby forming a pillar projection having a predetermined width on a surface of the semiconductor substrate, the fifth step of forming a third insulating film only on side surfaces of the pillar projection, the sixth step of forming a fourth insulating film having an enough thickness to bury the pillar projection and the second insulating film and polishing the fourth insulating film by using the second insulating film as a stopper, the seventh step of partially removing the third and fourth insulating films together with the second insulating film, the eighth step of forming narrow gaps by selectively removing portions of the third insulating film, thereby exposing portions near the two side surfaces of the pillar projection and portions of the surface of the semiconductor substrate near the pillar projection, the ninth step of forming a fifth insulating film covering inner walls of the narrow gaps, the tenth step of forming a conductive film on the fourth insulating film so as to bury the narrow gaps via the fifth insulating film and processing the conductive film into a predetermined shape, and the eleventh step of forming a pair of diffusion regions by doping an impurity into the pillar projection by using the conductive film as a mask.

Still another aspect of the method of fabricating a semiconductor device of the present invention comprises the first step of forming a first insulating film having a low etching rate on a semiconductor substrate, the second step of processing the first insulating film and the semiconductor substrate to form a pillar projection having a predetermined width on a surface of the semiconductor substrate, the third step of forming a second insulating film only on side surfaces of the pillar projection and the first insulating film, the fourth step of forming a third insulating film having an enough thickness to bury the pillar projection and the first insulating film and polishing the third insulating film by using the first insulating film as a stopper, the fifth step of partially removing the second and third insulating films together with the first insulating film, the sixth step of forming narrow gaps by selectively removing portions of the second insulating film, thereby exposing portions of the two side surfaces of the pillar projection and portions of the surface of the semiconductor substrate near the pillar projection, the seventh step of forming a fourth insulating film covering inner walls of the narrow gaps, the eighth step of doping an impurity into an entire surface to form diffusion layers in an upper surface region of the pillar projection and a surface region of the semiconductor substrate, the ninth step of forming a first conductive film on the third insulating film so as to bury the narrow gaps via the fourth insulating film, and the tenth step of processing the first conductive film to divide the first conductive film.

Still another aspect of the method of fabricating a semiconductor device of the present invention is a method of fabricating a semiconductor device comprising a gate, a source, and a drain, comprising the first step of forming a cap insulating film having a low etching rate on a semiconductor substrate, the second step of processing the cap insulating film and the semiconductor substrate to form a pillar projection having a predetermined width on a surface of the semiconductor substrate, the third step of forming a side-wall insulating film only on side surfaces of the pillar projection and the cap insulating film, the fourth step of forming an element isolation insulating film having an enough thickness to bury the pillar projection and the cap insulating film and polishing the element isolation insulating film by using the cap insulating film as a stopper, the fifth step of partially removing the side-wall insulating film and the element isolation insulating film together with the cap insulating film, the sixth step of forming narrow gaps by selectively removing portions of the side-wall insulating film, thereby exposing portions of the two side surfaces of the pillar projection and portions of the surface of the semiconductor substrate near the pillar projection, the seventh step of forming a gate insulating film covering inner walls of the narrow gaps, the eighth step of forming a conductive film on the element isolation insulating film so as to bury the narrow gaps via the gate insulating film, the ninth step of patterning the conductive film into a gate shape, and the tenth step of forming the source and drain by doping an impurity into the pillar projection by using the conductive film as a mask.

Still another aspect of the method of fabricating a semiconductor device of the present invention is a method of fabricating a semiconductor device comprising a semiconductor substrate and first, second, and third transistor having first, second, and third gates and a source and a drain shared by the first, second, and third gates, comprising the first step of forming a cap insulating film having a low etching rate on a semiconductor substrate, the second step of processing the cap insulating film and the semiconductor substrate to form a pillar projection having a predetermined width on a surface of the semiconductor substrate, the third step of forming a side-wall insulating film only on side surfaces of the pillar projection and the cap insulating film, the fourth step of forming an element isolation insulating film having an enough thickness to bury the pillar projection and the cap insulating film and polishing the element isolation insulating film by using the cap insulating film as a stopper, the fifth step of partially removing the side-wall insulating film and the element isolation insulating film together with the cap insulating film, the sixth step of forming narrow gaps by selectively removing portions of the side-wall insulating film, thereby exposing portions of the two side surfaces of the pillar projection and portions of the surface of the semiconductor substrate near the pillar projection, the seventh step of forming a gate insulating film covering inner walls of the narrow gaps, the eighth step of forming a first conductive film on the element isolation insulating film so as to bury the narrow gaps via the gate insulating film and processing the first conductive film into a predetermined shape, the ninth step of forming the source and drain by doping an impurity into the pillar projection by using the first conductive film as a mask, the tenth step of processing the first conductive film to divide the first conductive film on the pillar projection, thereby forming the first and second gates, the eleventh step of forming an insulating interlayer on the first and second gates and processing the insulating interlayer to expose only a portion of the gate insulating film formed on an upper surface of the pillar projection, and the twelfth step of forming a second conductive film on the insulating interlayer including the exposed gate insulating film and processing the second conductive film to form the third gate by patterning.

Still another aspect of the method of fabricating a semiconductor device of the present invention is a method of fabricating a semiconductor device comprising a semiconductor substrate and first and second transistors having first and second gates and a source and a drain shared by the first and second gates, comprising the first step of forming a cap insulating film having a low etching rate on a semiconductor substrate, the second step of processing the cap insulating film and the semiconductor substrate to form a pillar projection having a predetermined width on a surface of the semiconductor substrate, the third step of forming a side-wall insulating film only on side surfaces of the pillar projection and the cap insulating film, the fourth step of forming an element isolation insulating film having an enough thickness to bury the pillar projection and the cap insulating film and polishing the element isolation insulating film by using the cap insulating film as a stopper, the fifth step of partially removing the side-wall insulating film and the element isolation insulating film together with the cap insulating film, the sixth step of forming narrow gaps by selectively removing portions of the side-wall insulating film, thereby exposing portions of the two side surfaces of the pillar projection and portions of the surface of the semiconductor substrate near the pillar projection, the seventh step of forming a gate insulating film covering inner walls of the narrow gaps, the eighth step of doping an impurity into an entire surface to form the drain in an upper surface region of the pillar projection and the source in a surface region of the semiconductor substrate, the ninth step of forming a conductive film on the element isolation insulating film so as to bury the narrow gaps via the gate insulating film, and the tenth step of processing the first conductive film to divide the first conductive film on the pillar projection, thereby forming the first and second gates.

Still another aspect of the method of fabricating a semiconductor device of the present invention comprises the first step of forming a first insulating film serving as an element isolation insulating film on a semiconductor substrate, the second step of processing the first insulating film to form a trench which exposes a portion of a surface of the semiconductor substrate, the third step of forming a polycrystalline silicon film covering the first insulating film so as to bury the trench, the fourth step of forming a second insulating film on the polycrystalline silicon film, the fifth step of processing the polycrystalline silicon film and the second insulating film to form a pillar projection made of the polycrystalline silicon film and a cap insulating film of the pillar projection on the semiconductor substrate in the trench, the sixth step of performing a heat treatment to change the pillar projection into a single crystal, the seventh step of forming a third insulating film on the surface of the semiconductor surface exposed in the trench and side surfaces of the pillar projection, the eighth step of doping an impurity into an entire surface under conditions by which the impurity passes through the cap insulating film and doping an impurity under conditions by which the impurity stops in the cap insulating film, thereby forming a pair of diffusion regions in an upper surface region of the pillar projection and a surface region of the semiconductor substrate, the ninth step of forming a conductive film on an entire surface and processing the conductive film into a predetermined shape, and the tenth step of polishing the conductive film by using the cap insulating film as a stopper until a surface of the cap insulating film is exposed, thereby dividing the conductive film.

Still another aspect of the method of fabricating a semiconductor device of the present invention comprises the first step of forming a first insulating film serving as an element isolation insulating film on a semiconductor substrate, the second step of processing the first insulating film to form a first trench which exposes a portion of a surface of the semiconductor substrate, the third step of forming a polycrystalline silicon film covering the first insulating film so as to bury the first trench, the fourth step of forming a second insulating film on the polycrystalline silicon film, the fifth step of processing the polycrystalline silicon film and the second insulating film to form a pillar projection, which is made of the polycrystalline silicon film and fills the first trench except for a substantially central portion, and a cap insulating film of the pillar projection on the semiconductor substrate in the first trench, the sixth step of performing a heat treatment to change the pillar projection into a single crystal, the seventh step of forming a third insulating film on the surface of the semiconductor substrate exposed in the first trench and side surfaces of the substantially central portion of the pillar projection, the eighth step of forming a first conductive film on an entire surface so as to bury an exposed portion in the first trench, the ninth step of processing the first conductive film and the cap insulating film to expose an upper surface of the pillar projection on two sides of the first conductive film and the cap insulating film, the tenth step of forming a pair of diffusion layers by doping an impurity into the pillar projection from the exposed upper surface of the pillar projection by using the first conductive film as a mask, and the eleventh step of polishing the first conductive film by using the cap insulating film as a stopper to divide the first conductive film by the cap insulating film.

A storage medium of the present invention stores, in a computer readable form, individual steps of an operation of determining multi-valued storage information stored in the semiconductor device described above.

A semiconductor device of the present invention comprises a conductive film (gate) which covers a substantially central portion of a pillar projection, which is integrally formed on a semiconductor substrate, via a first insulating film (gate insulating film), and a pair of diffusion regions (a source and a drain) formed by doping an impurity into those portions of the pillar projection on the two sides of the conductive film. A second insulating film (element isolation insulating film) is so formed as to bury the pillar projection. Three channels are formed from the conductive film and the pillar projection as will be described below.

That is, a first channel is formed on the upper surface of the pillar projection by defining the dimension in a direction substantially perpendicular to the longitudinal direction of the conductive film as a gate length L and the dimension in a direction substantially perpendicular to the longitudinal direction of the pillar projection as a channel width W1. Second and third channels are so formed as to oppose each other on the two side surfaces of the pillar projection by defining L described above as the gate length and the height of the pillar projection from the semiconductor substrate as substantially a channel width W2. The channel width W1 also defines the thickness of a depletion layer of a transistor formed by the second and third channels. This results in a behavior equivalent to that a two-gate transistor structure in an SOI structure. If the channel width W1 is made very small, e.g., about 0.15 μm or less, the second and third channels are completely depleted.

That is, in the semiconductor device of the present invention, it is unnecessary to form an element isolation insulating film in the semiconductor substrate because element isolation is performed by the second insulating film. This readily achieves a very high integration degree. Additionally, the pillar projection and the semiconductor substrate are integrally formed. Therefore, very high drivability like that of an SOI structure is achieved although the active region is fixed to the substrate potential.

Furthermore, in the semiconductor device of the present invention, a buried insulating layer crossing the conductive film and having a predetermined film thickness is formed in a predetermined portion of the pillar projection by oxygen ion implantation. Since it is easy to accurately control the formation position of this buried insulating film, the channel width W2 of the second and third channels can be freely set.

Also, a semiconductor device of the present invention comprises first and second conductive films (first and second gates) which cover a substantially central portion of a pillar projection, which is integrally formed on a semiconductor substrate, via a first insulting film (first gate insulating film), and which are electrically isolated from each other, a third conductive film (third gate) which covers a substantially central portion of the upper surface of the pillar projection via a second insulating film (second gate insulating film) and is electrically isolated from the first and second conductive films, and a pair of diffusion regions (a source and a drain) formed by doping an impurity into portions of the pillar projection on the two sides of the first and second conductive films. Accordingly, the semiconductor device of the present invention realizes a structure equivalent to three transistors connected in parallel. By using first to third transistors, a plurality of characteristics having different conductances can be accomplished. For example, four different conductances are achieved when only the first transistor is turned on, only the first and second transistors are turned on, all of the first to third transistors are turned on, and all of the first to third transistors are turned off.

That is, the semiconductor device of the present invention can achieve not only a high integration degree but also a plurality of conductances with very high drivability like that of an SOI structure.

The present invention, therefore, realizes a semiconductor device having a plurality of channels corresponding to a pair of a source and a drain, selectively formed on the same semiconductor substrate as a common bulk transistor, and having a very fine structure and high drivability.

BRIEF DESCRIPTION OF THE DRAWINGS

FIG. 1 is a schematic perspective view showing the major components of a MOS transistor according to the first embodiment of the present invention;

DETAILED DESCRIPTION OF THE PREFERRED EMBODIMENTS

Figure 2A:
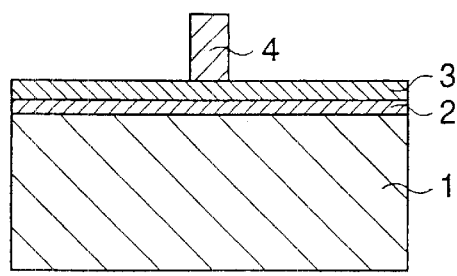
FIGS. 2A to 2D are schematic sectional views showing a method of fabricating the MOS transistor according to the first embodiment of the present invention in order of steps.

Several embodiments of a semiconductor device and a method of fabricating the same according to the present invention will be described in detail below with reference to the accompanying drawings.

First Embodiment

The first embodiment will be described below. This first embodiment exemplifies a so-called DELTA MOS transistor obtained by forming a projecting active region on a semiconductor substrate. The structure and the fabrication method of this MOS transistor will be described. FIG. 1 is a schematic perspective view showing the main parts of the MOS transistor of the first embodiment. FIGS. 2A to 2D and 3A to 3D are schematic sectional views showing the method of fabricating this MOS transistor in order of steps.

In the MOS transistor of this first embodiment, a pillar projection 11 serving as a very thin active region is formed on the surface of a p-type silicon semiconductor substrate 1. A gate electrode 21 is so formed as to cover a central portion of the pillar projection 11. A pair of impurity diffusion layers 22 are formed on the pillar projection 11 on the two sides of the gate electrode 21. An element isolation insulating film 23 is formed to bury the side surfaces of the pillar projection 11.

The gate electrode 21 is made of a polycrystalline silicon film. The gate electrode 21 covers the pillar projection 11 via a gate oxide film 12 formed from the central portion of the pillar projection 11 to the silicon semiconductor substrate 1 near a lower portion of the pillar projection 11. That is, the gate electrode 21 is so patterned as to oppose the pillar projection 11 and the nearby silicon semiconductor substrate 1 via the gate oxide film 12.

The pair of impurity diffusion layers 22 are formed by ion-implanting an n-type impurity such as phosphorus (P) into the two sides of the gate electrode 21 of the pillar projection 11. The impurity diffusion layers 22 function as the source and the drain of this MOS transistor.

The element isolation insulating film 23 is made of a silicon oxide film and so formed as to bury the side surfaces of the pillar projection 11 via a PSG (Phospho Silicate Glass) film 24. The element isolation insulating film 23 has a function of insulating the pillar projection 11 serving as an active region from the surroundings.

In the MOS transistor of the first embodiment, three channels are formed from the gate electrode 21 and the pillar projection 11 as will be described below. That is, a first channel is formed on the upper surface of the pillar projection 11 by defining the dimension in a direction substantially perpendicular to the longitudinal direction of the gate electrode 21 as a gate length L and the dimension in a direction substantially perpendicular to the longitudinal direction of the pillar projection 11 as a channel width W1. Second and third channels are so formed as to oppose each other on the two side surfaces of the pillar projection 11 by defining L described above as the gate length and the height of the pillar projection 11 from the silicon semiconductor substrate 1 as substantially a channel width W2.

The channel width W1 also defines the thickness of a depletion layer of a transistor formed by the second and third channels. This results in a behavior equivalent to that a two-gate transistor structure in an SOI structure. If the channel width W1 is made very small, e.g., about 0.15 μm or less, the second and third channels are completely depleted. That is, in this MOS transistor it is unnecessary to form an element isolation insulating film in the silicon semiconductor substrate 1 because element isolation is performed by the element isolation insulating film 23. This readily achieves a very high integration degree. Additionally, the pillar projection 11 and the silicon semiconductor substrate 1 are integrally formed. Therefore, very high drivability like that of an SOI structure is achieved although the active region is fixed to the substrate potential.

A method of fabricating the MOS transistor of the first embodiment will be described below with reference to FIGS. 2A to 2D and 3A to 3D corresponding to a section taken along a broken line I–I' in FIG. 1.

First, as shown in FIG. 2A, the surface of a p-type silicon semiconductor substrate 1 is thermally oxidized to form a pad thermal oxide film 2 about 10 to 30 nm thick. A silicon nitride film 3 about 100 to 300 nm thick is then formed on the pad thermal oxide film 2 by low-pressure CVD.

Subsequently, the entire surface is coated with a photoresist, and photolithography (e.g., EB direct-writing lithography) is performed to leave the photoresist behind only in a portion where an active region is to be formed, thereby forming a resist mask 4.

Figure 2B:
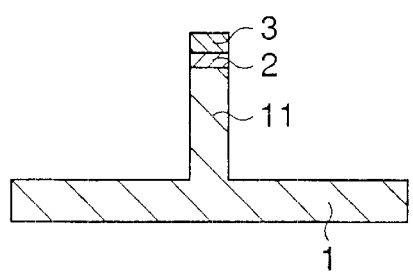

Next, as shown in FIG. 2B, the resist mask 4 is used as an etching mask to dry-etch the silicon nitride film 3, the pad thermal oxide film 2, and the silicon semiconductor substrate 1, thereby forming a pillar projection 11 having a predetermined height on the silicon semiconductor substrate 1. The height of this pillar projection 11 is the channel width W2 of the second and third channels.

Figure 2C:
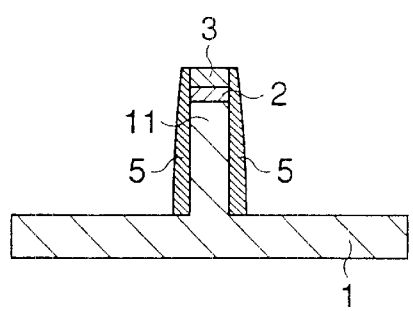

After the resist mask 4 is removed by ashing or the like, a PSG film 24 about 150 to 300 nm thick is formed on the entire surface so as to bury the pillar projection 11, the pad thermal oxide film 2, and the silicon nitride film 3. Subsequently, the entire surface of this PSG film 24 is anisotropically etched to leave the PSG film 24 behind only on the side surfaces of the pillar projection 11, the pad thermal oxide film 2, and the silicon nitride film 3, thereby forming side walls 5 having a predetermined thickness as shown in FIG. 2C. The film thickness of the side walls 5 defines the film thickness of the gate electrode 21 in the region of the second and third channels. Since no photolithography is used in the formation of the side walls 5, the film thickness of the side walls 5 can be set to a predetermined value smaller than the exposure limit.

Figure 2D:
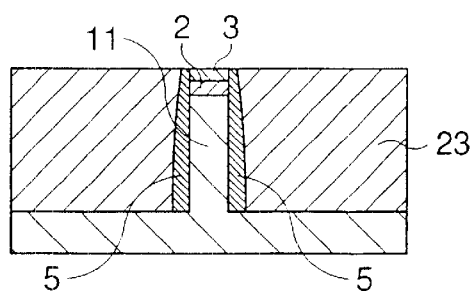

Next, a silicon oxide film having an enough thickness to bury the pillar projection 11, the pad thermal oxide film 2, and the silicon nitride film 3 is formed on the entire surface by low-pressure CVD. Subsequently, as shown in FIG. 2D, the silicon nitride film 3 is used as a stopper to planarize the surface of the silicon oxide film by, e.g., CMP (Chemical-Mechanical Polishing), forming an element isolation insulating film 23.

Figure 3A:
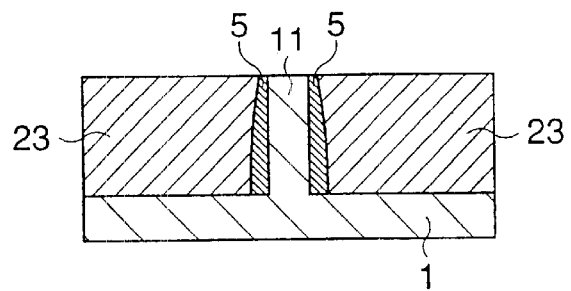
FIGS. 3A to 3D are schematic sectional views showing the method of fabricating the MOS transistor according to the first embodiment of the present invention in order of steps following the step shown in FIG. 2D.

As shown in FIG. 3A, the pad thermal oxide film 2 and the silicon nitride film 3 on the pillar projection 11 are etched away to expose the upper surface of the pillar projection 11.

Figure 3B:
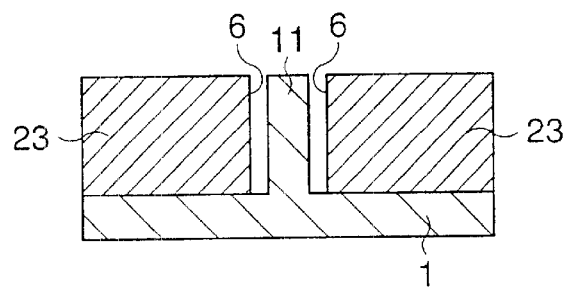

As shown in FIG. 3B, the side walls 5 formed on the side surfaces of the pillar projection 11 are selectively removed by, e.g., HF vapor phase cleaning to form narrow gaps 6 having the shape of a prospective gate electrode 21 on the side surfaces of the pillar projection 11. That is, the narrow gaps 6 are so formed as to have a spacing substantially equal to the film thickness of the prospective gate electrode 21 on the side surfaces of the pillar projection 11, a width substantially equal to the gate length L, and a height substantially equal to the channel width W2 of the second and third channels.

Figure 3C:
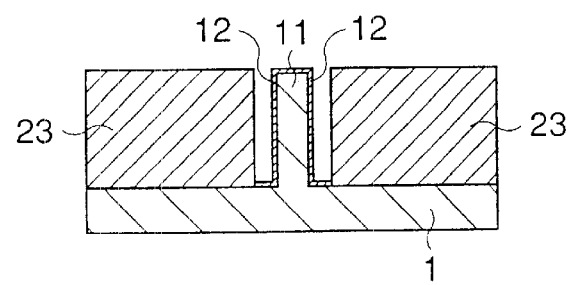

As shown in FIG. 3C, the side surfaces of the pillar projection 11 and the bottom surfaces of the narrow gaps 6 (i.e., exposed portions of the surface of the silicon semiconductor substrate 1) are thermally oxidized to form a gate oxide film 12 about 5 to 10 nm thick.

Figure 3D:
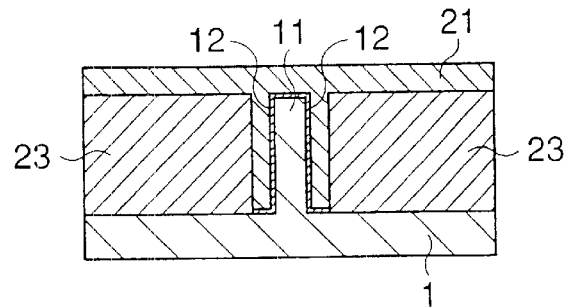

As shown in FIG. 3D, a phosphorus-doped or nondoped polycrystalline silicon film is formed by low-pressure CVD on an element isolation insulating film 23 so as to bury the narrow gaps 6. Thereafter, a gate electrode 21 is formed by sequentially performing photolithography and dry etching for the polycrystalline silicon film on the element isolation insulating film 23.

Next, the gate electrode 21 is used as a mask to ion-implant an n-type impurity such as phosphorus into the pillar projection 11. Annealing is then performed to form a pair of impurity diffusion layers 22 functioning as a source and a drain.

Finally, various steps of forming interconnecting lines and insulating interlayers are performed to complete the MOS transistor of the first embodiment.

Several modifications of the semiconductor device according to the first embodiment will be described below. Note that the same reference numerals as in the MOS transistor of the first embodiment denote the same parts in these modifications, and a detailed description thereof will be omitted.

First Modification

The first modification will be described below. A semiconductor device of this first modification has substantially the same structure as the MOS transistor of the first embodiment, but a method of fabricating the semiconductor device is partially different from that of the first embodiment. FIGS. 4A to 4E are schematic sectional views showing the several initial steps of the method of fabricating the MOS transistor of this modification.

Figure 4A:
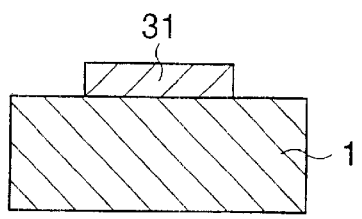
FIGS. 4A to 4E are schematic sectional views showing the several initial steps of a method of fabricating a MOS transistor according to the first modification of the first embodiment of the present invention.

First, as shown in FIG. 4A, a silicon oxide film is deposited on the surface of a p-type silicon semiconductor substrate 1. Photolithography and dry etching are sequentially performed for this silicon oxide film to form a pattern 31 of the silicon oxide film.

Figure 4B:
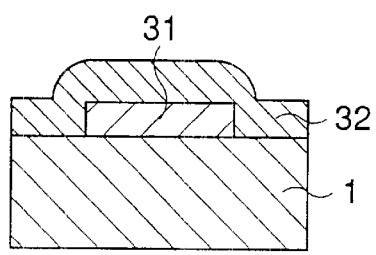

Next, as shown in FIG. 4B, a silicon nitride film 32 is deposited on the entire surface so as to cover the pattern 31.

Figure 4C:
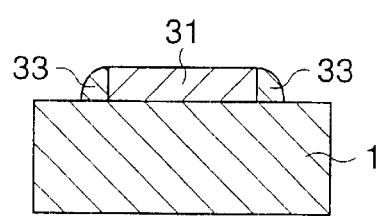

As shown in FIG. 4C, the entire surface of the silicon nitride film 32 is anisotropically etched to leave the silicon nitride film 32 behind only on the side surfaces of the pattern 31, thereby forming side walls 33. Since no photolithography is used in the formation of the side walls 33, the width of the side walls 33 can be set to a predetermined value smaller than the exposure limit.

Figure 4D:
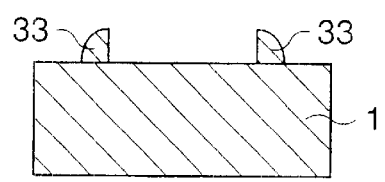

Subsequently, as shown in FIG. 4D, the silicon semiconductor substrate 1 is dipped into an HF solution to remove the pattern 31 and leave only the side walls 33 behind on the silicon semiconductor substrate 1.

Figure 4E:
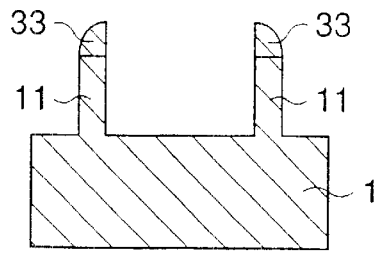

As shown in FIG. 4E, the side walls 33 are used as masks to dry-etch the silicon semiconductor substrate 1, forming pillar projections 11 similar to that shown in FIG. 2A of the first embodiment. The width of the pillar projections 11 can be set to a predetermined value smaller than the exposure limit. Thereafter, a DELTA MOS transistor is completed through steps similar to the steps shown in FIGS. 2B to 2D and 3A to 3D.

In the MOS transistor of this first modification, as in the case of the first embodiment, the channel width W1 also defines the thickness of a depletion layer of a transistor formed by the second and third channels. This results in a behavior equivalent to that of a two-gate transistor structure in an SOI structure. If the channel width W1 is made very small, e.g., about 0.15 $\mu$m or less, the second and third channels are completely depleted. That is, in this MOS transistor it is unnecessary to form an element isolation insulating film in the silicon semiconductor substrate 1 because element isolation is performed by the element isolation insulating film 23. This readily achieves a very high integration degree. Additionally, the pillar projection 11 and the silicon semiconductor substrate 1 are integrally formed. Therefore, very high drivability like that of an SOI structure is achieved although the active region is fixed to the substrate potential.

Second Modification

The second modification will be described below. A semiconductor device of this second modification has substantially the same structure as the MOS transistor of the first embodiment. However, this semiconductor device is a semiconductor memory, a so-called EEPROM, in which a gate electrode is constituted by two conductive films formed via a capacitance insulating film.

Figure 5:
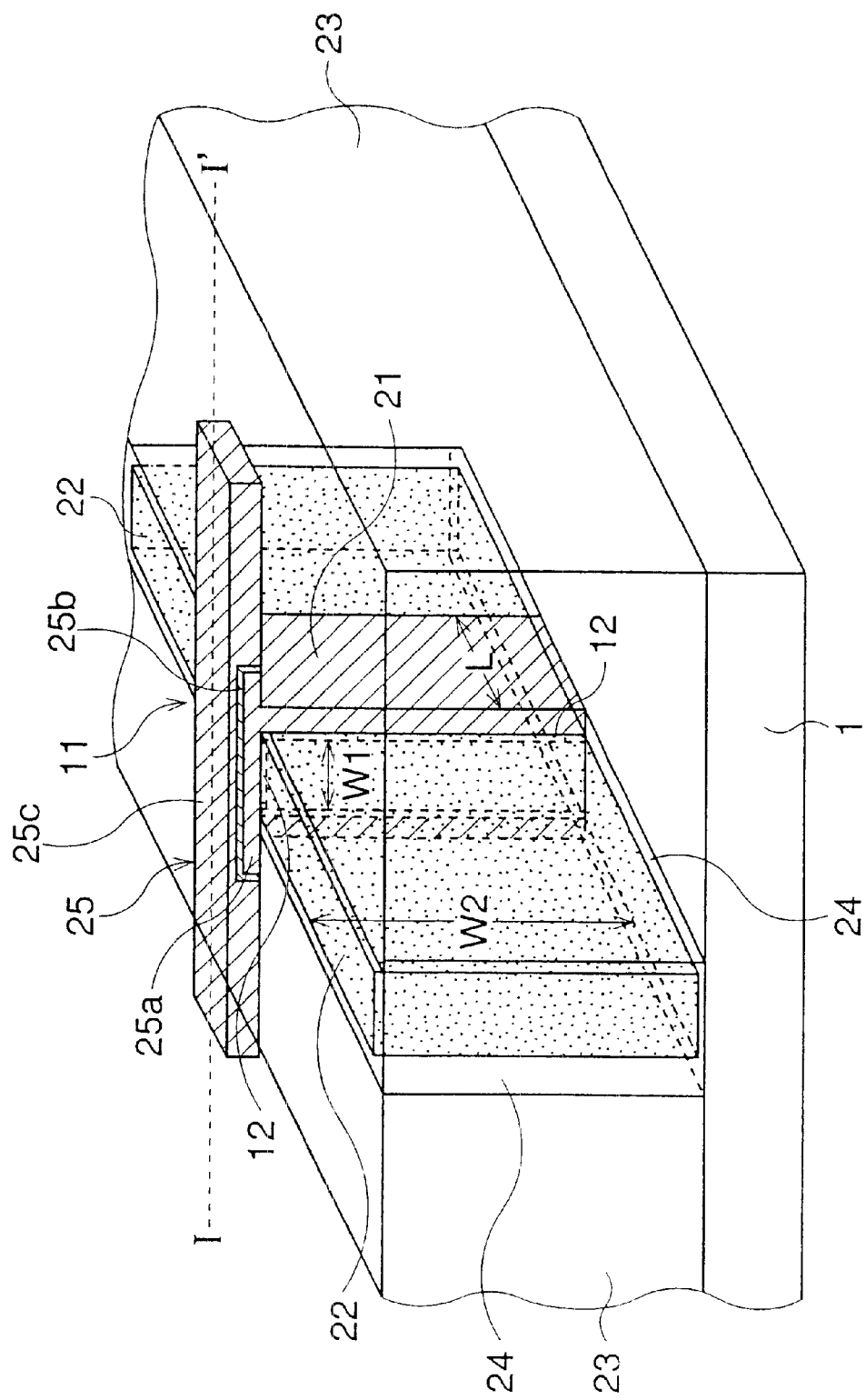
FIG. 5 is a schematic perspective view showing the main parts of an EEPROM according to the second modification of the first embodiment of the present invention.

That is, as shown in FIG. 5, this EEPROM has a structure in which a gate electrode 25 is constituted by a floating gate electrode 25a, a capacitance insulating film 25b covering the surface of this floating gate electrode 25a, and a control gate electrode 25c opposing the floating gate electrode 25a via the capacitance insulating film 25b in the structure of the MOS transistor of the first embodiment described above. In the EEPROM of the second modification, a memory cell is constituted by the gate electrode 25 and a pair of impurity diffusion layers 22, and this makes writes and reads of storage information feasible.

The floating gate electrode 25a is formed to cover central portions of the side surfaces of a pillar projection 11 via a gate oxide film 12 and divided into the form of an island on the pillar projection 11 via the gate oxide film 12. The gate oxide film 12 functions as a so-called tunnel insulating film.

The control gate electrode 25c opposes the floating gate electrode 25a via the capacitance insulating film 25b formed on the surface of the floating gate electrode 25a and extends in the form of a belt on an element isolation insulating film 23. The capacitance insulating film 25b is a so-called ONO film having a three-layered structure including a silicon oxide film, a silicon nitride film, and a silicon oxide film.

In the EEPROM of this second modification, as in the case of the first embodiment, the channel width W1 also defines the thickness of a depletion layer of a transistor formed by the second and third channels. This results in a behavior equivalent to that of a two-gate transistor structure in an SOI structure. If the channel width W1 is made very small, e.g., about 0.15 μm or less, the second and third channels are completely depleted. That is, in this MOS transistor it is unnecessary to form an element isolation insulating film in the silicon semiconductor substrate 1 because element isolation is performed by the element isolation insulating film 23. This readily achieves a very high integration degree. Additionally, the pillar projection 11 and the silicon semiconductor substrate 1 are integrally formed. Therefore, a memory element having very high drivability like that of an SOI structure is achieved although the active region is fixed to the substrate potential.

Figure 6A:
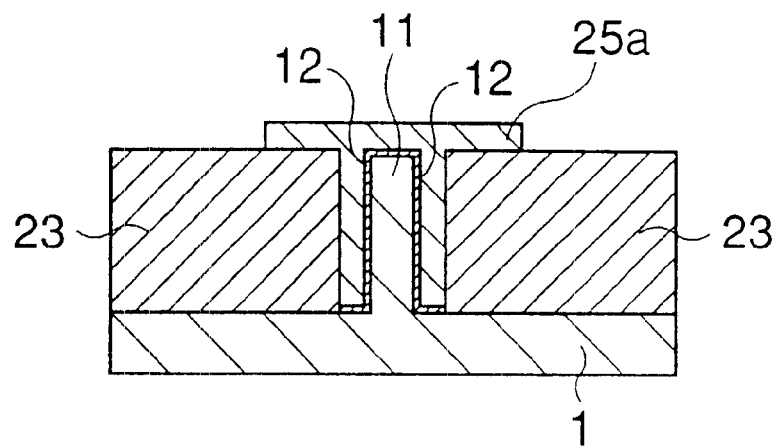
FIGS. 6A and 6B are schematic sectional views showing a method of fabricating the EEPROM according to the second modification of the first embodiment of the present invention in order of steps.

A method of fabricating the EEPROM of the second modification will be described below with reference to FIGS. 6A and 6B corresponding to a section taken along a broken line I–I' in FIG. 5.

First, the steps shown in FIGS. 2A to 3C in the first embodiment are performed. Thereafter, as shown in FIG. 3D, a phosphorus-doped or nondoped polycrystalline silicon film is formed by low-pressure CVD on an element isolation insulating film 23 so as to bury narrow gaps 6. Subsequently, as shown in FIG. 6A, photolithography and dry etching are sequentially performed for the polycrystalline silicon film on the element isolation insulating film 23 to divide the polycrystalline silicon film into an island on the element isolation insulating film 23, thereby forming a floating gate electrode 25a by patterning.

Figure 6B:
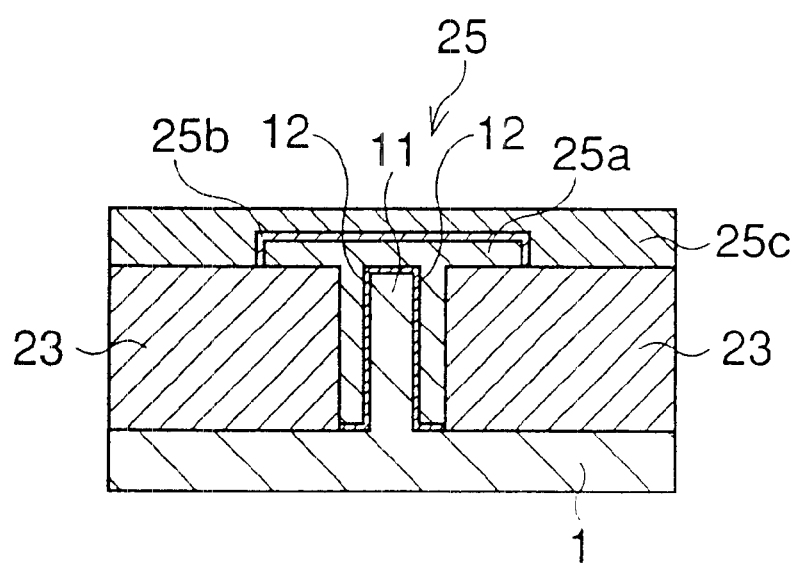

Next, as shown in FIG. 6B, a silicon oxide film, a silicon nitride film, and a silicon oxide film are sequentially formed to cover the floating gate electrode 25a by CVD and patterned to form a capacitance insulating film 25b as an ONO film. A phosphorus-doped or nondoped polycrystalline silicon film is then formed by low-pressure CVD on the element isolation insulating film 23 so as to cover the capacitance insulating film 25b. Subsequently, photolithography and dry etching are sequentially performed for the polycrystalline silicon film on the element isolation insulating film 23 to form a control gate electrode 25c, extending in the form of a belt on the element isolation insulating film 23, by patterning.

Finally, a pair of impurity diffusion layers 22 functioning as a source and a drain are formed, and various steps of forming interconnecting lines and insulating interlayers are preformed to complete the EEPROM of the second modification.

Note that if storage information is binary data, this EEPROM can also be constituted as a so-called multi-valued memory by setting a predetermined value of two bits or more as a storage state. That is, if the storage state is n bits ($2^n$ values, n is an integer of 2 or more), it is only necessary to set $2^n$ different threshold voltages. For example, if the storage state is two bits (four values), four different reference voltages (threshold voltages) are used in a one-to-one correspondence with storage states "00", "01", "10", and "11". In a read, one storage state of each memory cell of the EEPROM is specified from the four threshold voltages by a predetermined determining operation. If the storage state is three bits (eight values), eight different reference voltages (threshold voltages) are used in a one-to-one correspondence with storage states "000", "001", "010", "011", "100", "101", "110", and "111". In a read, one storage state of each memory cell of the EEPROM is specified from the eight threshold voltages by a predetermined determining operation. In addition to the various effects described earlier, this multi-valued EEPROM greatly increases the storage density of each memory cell. Therefore, the EEPROM can well meet demands for a higher integration degree and a finer structure. If storage information is not binary data but information constituted by 0, 1, and 2, it is also possible to use "0", "1", and "2", or "00", "01", "02", "10", "11", "12", "20", "21", and "22" as storage states. The storage state is expressed by three values in the former case and nine values in the latter case. This multi-valued structure is also applicable to a DRAM (to be described later) and other various semiconductor memories as well as to an EEPROM.

This embodiment describes with reference to the gate oxide film 12 and the capacitance insulating film 25b as shown in FIG. 5. The capacitance insulating film can be replaced with the ferroelectric film.

If a ferroelectric film is used, the floating gate electrode 25b, the control gate electrode 25c can be replaced with a film made of platinum, a titanium compound, a tungsten compound or a ruthenium compound. It may also be formed of a double layer structure in which a conductive film made of, for example, poly-silicon is provided under a platinum film. Any material having a ferroelectric characteristic can be used as a material of the above-mentioned ferroelectric film. For example, PZT (lead zirconate titanate), PLZT (lead lanthanum zirconate titanate), barium titanate, palladium titanate, barium strontium titanate and bismuth titanate can be used as the material of the ferroelectric film. A dielectric film made of, for example, tantalic oxides or $Ta_2O_5BSTO$, which has a high dielectric constant of more than 50, can be used instead of the ferroelectric film.

The floating gate electrode 25a may also be found of a multi layer structure. First, the first floating gate electrode is formed on the gate insulating film, and the first insulating film is formed on the first floating gate film, and the second floating gate electrode is formed on the first insulating film. Thereafter, the second insulating film is formed on the second floating gate electrode, and the control gate electrode 25c is formed on the second insulating film, to constitute the floating gate electrode of a double layer structure. This structure is available as a multi-valued nonvolatile memory.

Third Modification

The third modification will be described below. A semiconductor device of this third modification has substantially the same structure as the MOS transistor of the first embodiment. However, this semiconductor device is a semiconductor memory, a so-called DRAM, in which a memory capacitor is formed adjacent to a gate electrode.

Figure 7:
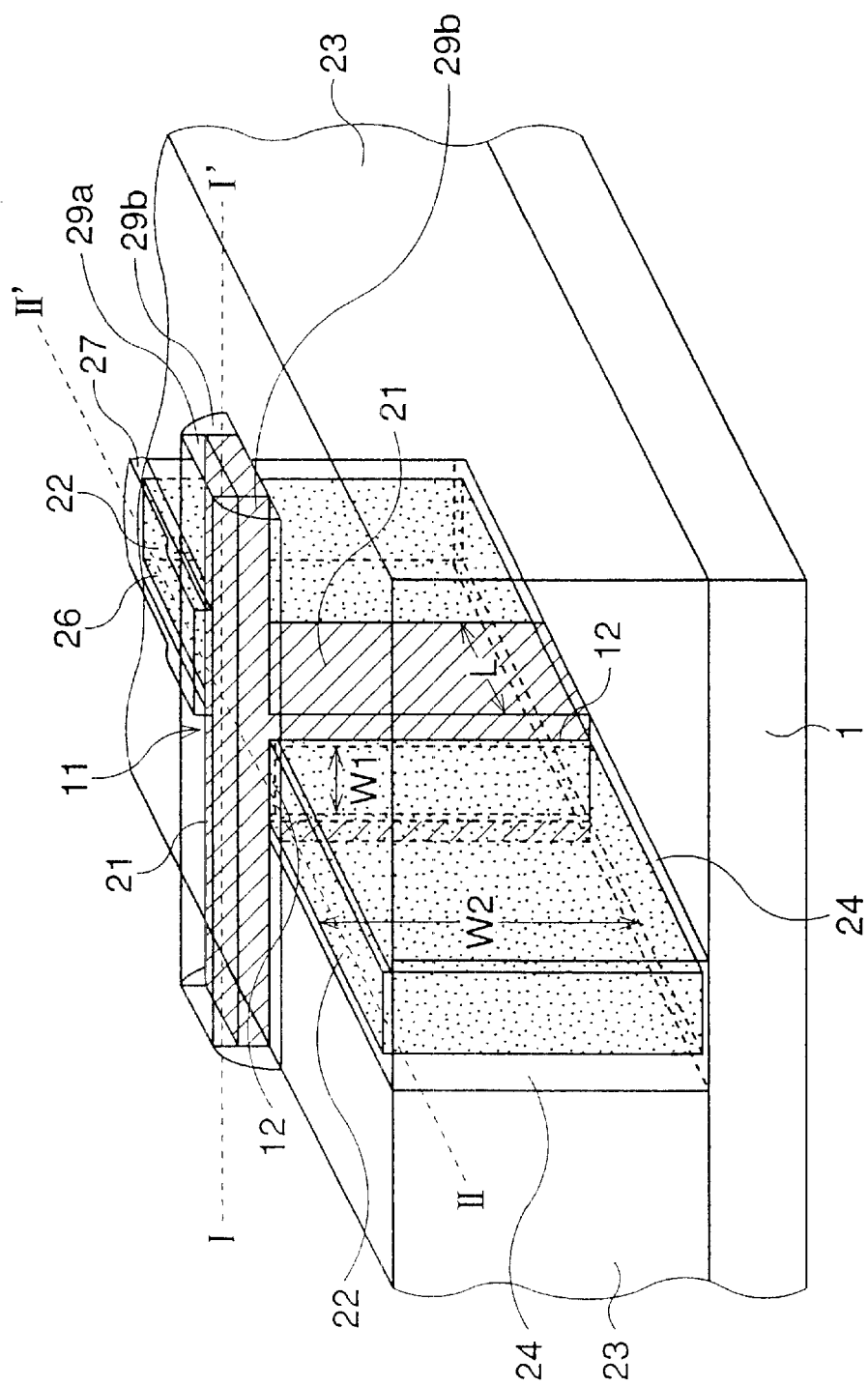
FIG. 7 is a schematic sectional view showing the main components of a DRAM according to the third modification of the first embodiment of the present invention.

That is, as shown in FIG. 7, this DRAM has a structure in which a capacitor electrode 27 opposing one of a pair of impurity diffusion layers 22 via a capacitance insulating film 26 is formed adjacent to a gate electrode 21 in addition to the structure of the MOS transistor of the first embodiment described above. In this structure, one impurity diffusion layer 22 and the capacitor electrode 27 capacitively couple with each other to function as a memory capacitor.

The capacitance insulating film 26 includes an inner wall surface of a narrow gap 6 formed between an element isolation insulating film 23 and one impurity diffusion layer 22. The capacitance insulating film 26 is formed from the element isolation insulating film 23 and extended over one impurity diffusion layer 22 to reach a side wall 29b, made of a silicon oxide film and covering the gate electrode 21 and a gate oxide film 12, and a cap insulating film 29a. This capacitance insulating film 26 is a so-called ONO film having a three-layered structure including a silicon oxide film, a silicon nitride film, and a silicon oxide film.

The capacitor electrode 27 is so patterned as to bury a trench 28 and cover the capacitance insulating film 26. The capacitor electrode 27 opposes the upper surface of one impurity diffusion layer 22 and also opposes the side surface of the same impurity diffusion layer 22 in the narrow gap 6 via the capacitance insulating film 26. That is, the capacitor electrode 27 capacitively couples with the upper surface and the side surface of one impurity diffusion layer 22 and functions as a memory capacitor. This memory capacitor and a MOS transistor together form a memory cell to make writes and reads of storage information possible.

In the DRAM of this third modification, as in the case of the first embodiment, the channel width W1 also defines the thickness of a depletion layer of a transistor formed by the second and third channels. This results in a behavior equivalent to that of a two-gate transistor structure in an SOI structure. If the channel width WI is made very small, e.g., about 0.15 μm or less, the second and third channels are completely depleted. That is, in this MOS transistor it is unnecessary to form an element isolation insulating film in the silicon semiconductor substrate 1 because element isolation is performed by the element isolation insulating film 23. This readily achieves a very high integration degree. Additionally, the pillar projection 11 and the silicon semiconductor substrate 1 are integrally formed. Therefore, a storage element having very high drivability like that of an SOI structure is achieved although the active region is fixed to the substrate potential.

Figure 8A:
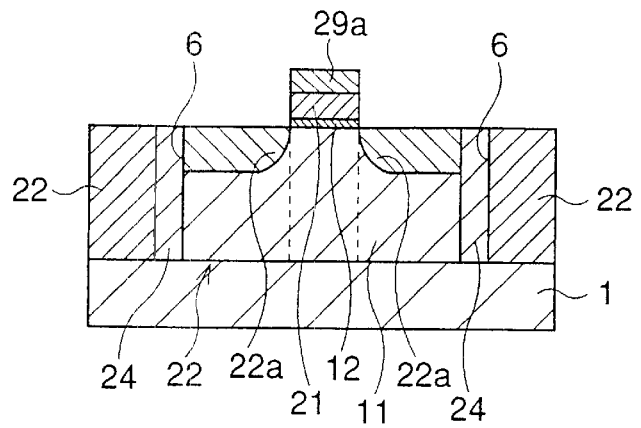
FIGS. 8A to 8C are schematic sectional views showing a method of fabricating the DRAM according to the third modification of the first embodiment of the present invention in order of steps.

A method of fabricating the EEPROM of the third modification will be described below with reference to FIGS. 8A to 8C corresponding to a section taken along a broken line II–II' in FIG. 7.

First, the steps shown in FIGS. 2A to 3C in the first embodiment are performed. Thereafter, as shown in FIG. 3D, a phosphorus-doped or nondoped polycrystalline film is formed by low-pressure CVD on an element isolation insulating film 23 so as to bury narrow gaps 6, and a silicon oxide film is deposited on the polycrystalline silicon film. Subsequently, as shown in FIG. 8A, photolithography and dry etching are sequentially performed for the polycrystalline silicon film and the silicon oxide film on the element isolation insulating film 23, thereby forming a gate electrode 21 and a cap insulating film 29a by patterning. The cap insulating film 29a is used as a mask to lightly ion-implant an n-type impurity such as phosphorus into a pillar projection 11, forming a lightly doped impurity diffusion layer 22a.

Figure 8B:
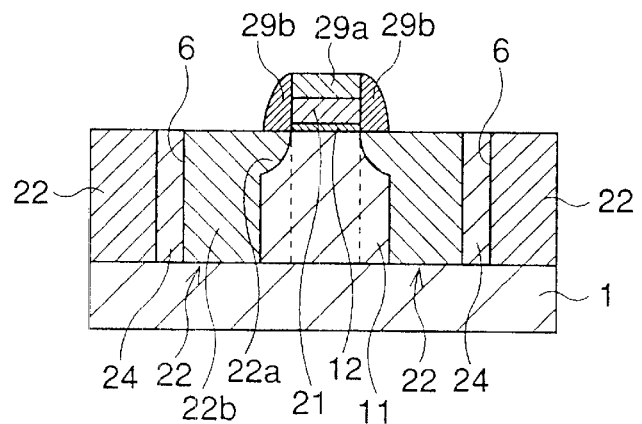
Figure 8C:
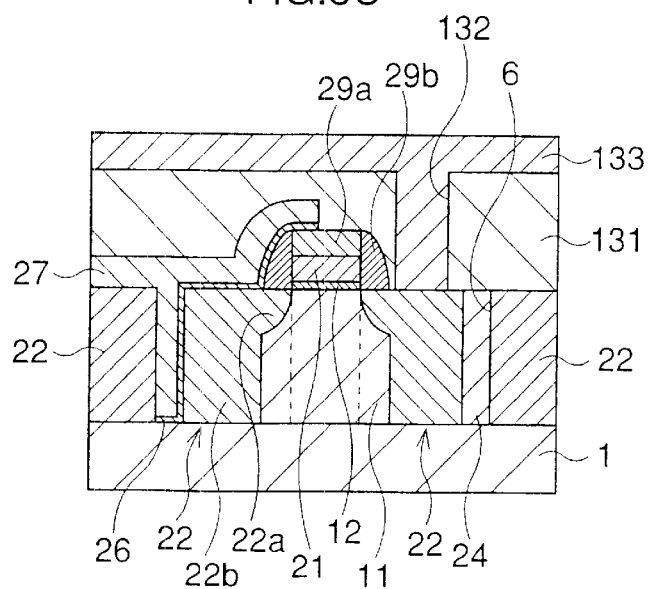

Subsequently, as shown in FIG. 8B, a silicon oxide film is deposited on the entire surface, and the entire surface of this silicon oxide film is anisotropically etched to leave the silicon oxide film behind only on the side surfaces of the gate electrode 21 and the cap insulating film 29a, thereby forming side walls 29b. Next, the cap insulating film 29a and the side walls 29b are used as masks to heavily ion-implant an n-type impurity such as phosphorus into the pillar projection 11, forming a heavily doped impurity diffusion layer 22b. Consequently, impurity diffusion layers 22 having a so-called LDD structure are formed.

After that, in one impurity diffusion layer 22, a PSG film 24 existing in the narrow gap 6 between the pillar projection 11 and the element isolation insulating film 23 is removed. Next, as shown in FIG. 8C, a silicon oxide film, a silicon nitride film, and a silicon oxide film are sequentially formed on the entire surface including the inner wall surfaces of the narrow gap 6 to form an ONO film. A polycrystalline film is formed on this ONO film, and the surface of the polycrystalline film is coated with a photoresist. This photoresist is processed by photolithography to form a photo mask 28. This photo mask 28 is used as a mask to etch the ONO film and the polycrystalline silicon film to divide them on the cap insulating film 29a. Consequently, a capacitance insulating film 26 made of the ONO film and a capacitor electrode 27 opposing the side surface and the upper surface of one impurity diffusion layer 22 via this capacitance insulating film 26 are formed by patterning.

Subsequently, an insulating interlayer 131 covering the entire surface is formed, a contact hole 132 for exposing the surface of the other impurity diffusion layer 22 is formed in the insulating interlayer 131, and an aluminum film is so formed as to bury the contact hole 132. This aluminum film is patterned to form a bit line 133 connected to the other impurity diffusion layer 22 and extending on the insulating interlayer 131.

Finally, various steps of forming interconnecting lines and insulating interlayers are performed to complete the DRAM of the third modification.

Figure 9:
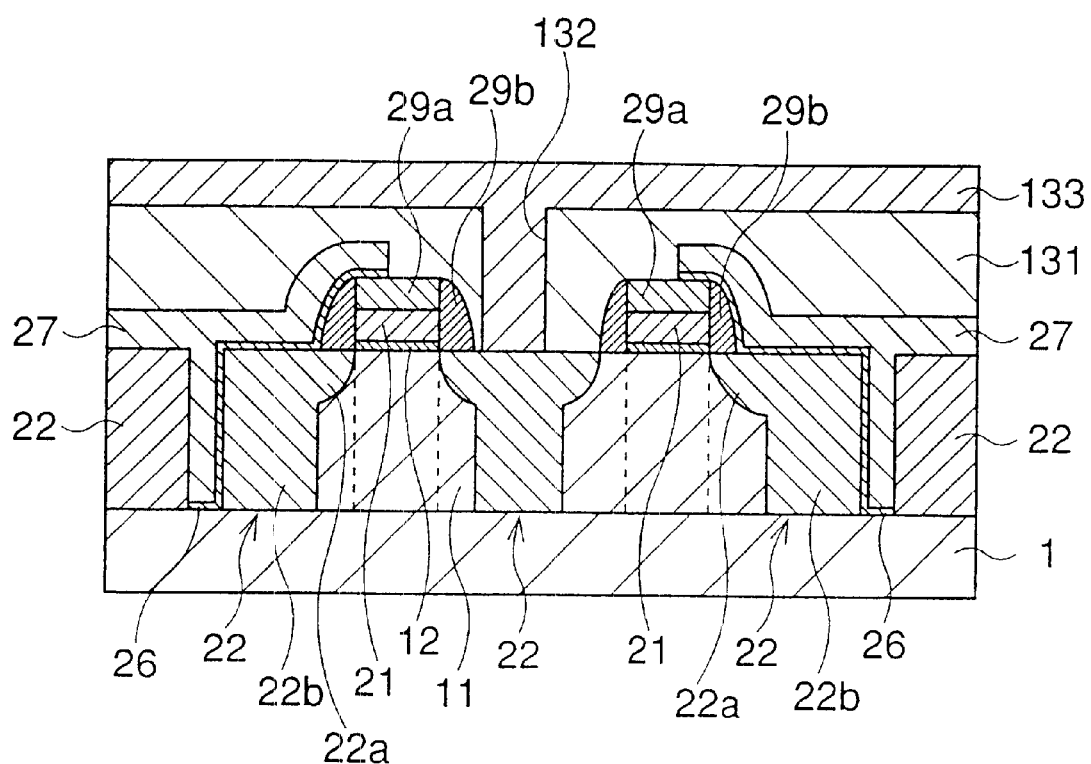
FIG. 9 is a schematic perspective view showing the major parts of another example of the DRAM according to the third modification of the first embodiment of the present invention.

Note that as shown in FIG. 9, for example, memory capacitors can also be formed by forming two gate electrodes 21 with a predetermined spacing and capacitively coupling each gate electrode 21 with one of a pair of impurity diffusion layers 22.

Second Embodiment

Figure 10:
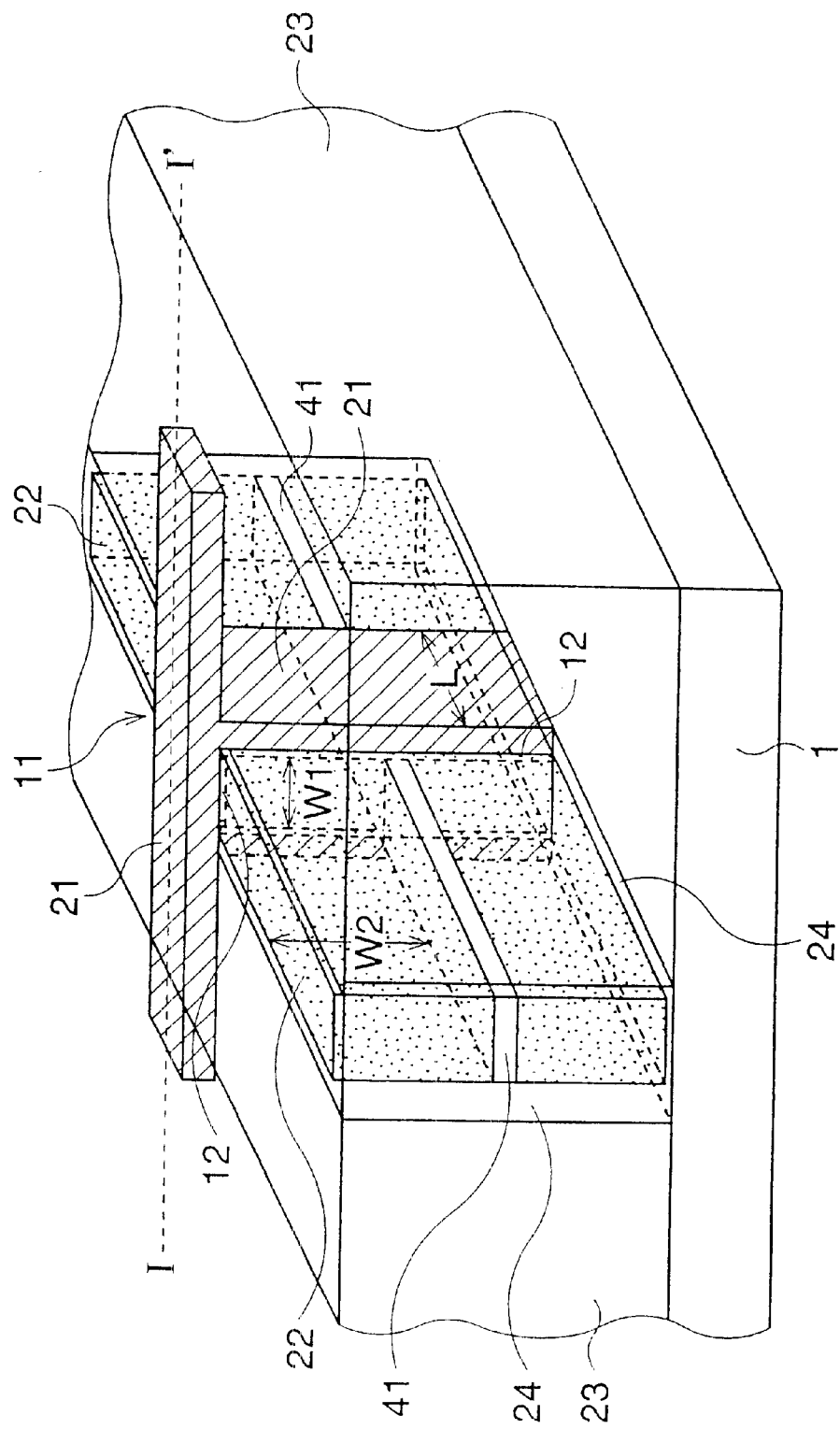
FIG. 10 is a schematic perspective view showing the major components of a MOS transistor according to the second embodiment of the present invention.
Figure 11A:
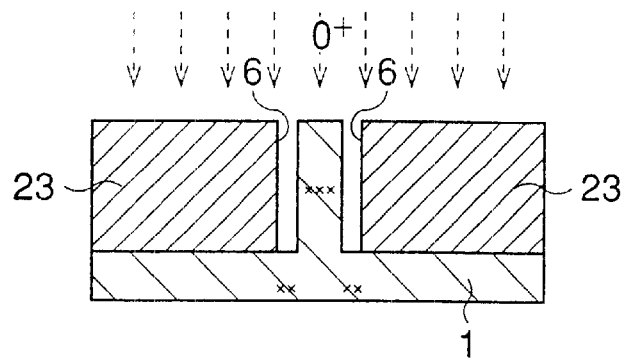
FIGS. 11A to 11C are schematic sectional views showing the major steps of a method of fabricating the MOS transistor according to the second embodiment of the present invention in order.
Figure 11B:
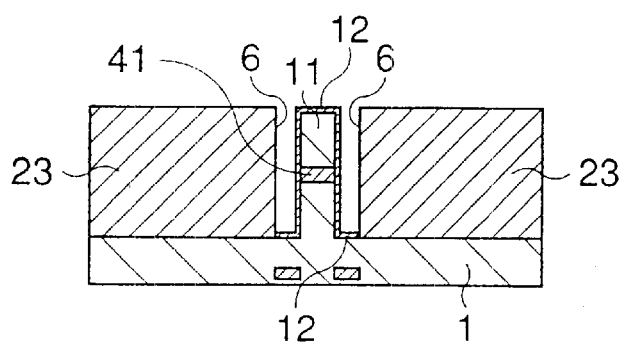
Figure 11C:
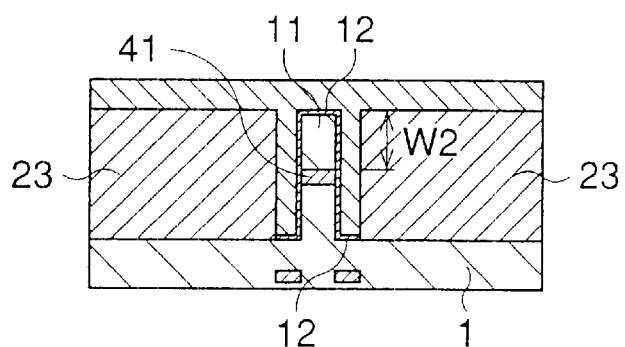

The second embodiment will be described below. A MOS transistor of this second embodiment has substantially the same structure as the first embodiment except that this transistor has an SOI structure and a channel width W2 of second and third channels takes an arbitrary value. FIG. 10 is a schematic perspective view showing the main parts of the MOS transistor of the second embodiment. FIGS. 11A to 11C are schematic sectional views showing the major steps of a method of fabricating this MOS transistor in order. Note that the same reference numerals as in the first embodiment denote the same parts in the second embodiment.

In the MOS transistor of this second embodiment, as in the MOS transistor of the first embodiment, a pillar projection 11 serving as a very thin active region is formed on the surface of a p-type silicon semiconductor substrate 1. A gate electrode 21 is so formed as to cover a central portion of the pillar projection 11. A pair of impurity diffusion layers 22 are formed on the pillar projection 11 on the two sides of the gate electrode 21. An element isolation insulating film 23 is formed to bury the side surfaces of the pillar projection 11.

The pillar projection 11 is formed into the shape of a pillar by processing the silicon semiconductor substrate 1. In the second embodiment, a buried oxide film 41 having a predetermined thickness is formed in a predetermined portion of this pillar projection 11. This buried oxide film 41 electrically isolates a portion above the buried oxide film 41 of the pillar projection 11 from its lower portion (including the silicon semiconductor substrate 1), thereby forming an SOI structure. That is, the portion of the pillar projection 11 above the buried oxide film 41 functions as an active region of the transistor.

The gate electrode 21 is made of a polycrystalline silicon film. The gate electrode 21 covers the pillar projection 11 via a gate oxide film 12 formed from the central portion of the pillar projection 11 to the silicon semiconductor substrate 1 near a lower portion of the pillar projection 11. That is, the gate electrode 21 is so patterned as to oppose the pillar projection 11 and the nearby silicon semiconductor substrate 1 via the gate oxide film 12.

A pair of impurity diffusion layers 22 are formed by ion-implanting an n-type impurity such as phosphorus (P) into the two sides of the gate electrode 21 of the pillar projection 11. The impurity diffusion layers 22 function as the source and the drain of this MOS transistor.

The element isolation insulating film 23 is made of a silicon oxide film and so formed as to bury the side surfaces of the pillar projection 11 via a PSG film 24. The element isolation insulating film 23 has a function of insulating the pillar projection 11 serving as an active region from the surroundings.

In the MOS transistor of the second embodiment, three channels are formed from the gate electrode 21 and the pillar projection 11 as will be described below. That is, a first channel is formed on the upper surface of the pillar projection 11 by defining the dimension in a direction substantially perpendicular to the longitudinal direction of the gate electrode 21 as a gate length L and the dimension in a direction substantially perpendicular to the longitudinal direction of the pillar projection 11 as a channel width W1. Second and third channels are so formed as to oppose each other on the two side surfaces of the pillar projection 11 by defining L described above as the gate length and the height of the pillar projection 11 from the silicon semiconductor substrate 1 as substantially a channel width W2.

The channel width W1 also defines the thickness of a depletion layer of a transistor formed by the second and third channels. If the channel width W1 is made very small, e.g., about 0.15 μm or less, the second and third channels are completely depleted. That is, in this MOS transistor it is unnecessary to form an element isolation insulating film in the silicon semiconductor substrate 1 because element isolation is performed by the element isolation insulating film 23. This readily achieves a very high integration degree. Additionally, this MOS transistor can be formed on the same semiconductor substrate as a common bulk MOS transistor, so very high drivability as an SOI structure is achieved.

Furthermore, the formation position of the buried oxide film 41 can be freely controlled as will be described later. Therefore, as in the case of the channel width W1 of the first channel, when the channel width W2 defined by the formation position (and the film thickness) of the buried oxide film 41 is controlled to about the de Broglie wavelength (e.g., about 0.10 μm or less) of an electron, a very fine, highly functional one-dimensional quantization device is realized. A method of fabricating the MOS transistor of the second embodiment will be described below with reference to FIGS. 2A to 2D, 3A and 3B, and FIG. 11 which is a sectional view taken along a broken line I–I' in FIG. 10.

First, as in the first embodiment, the steps shown in FIGS. 2A to 2D, 3A, and 3B are performed to form narrow gaps 6, between a pillar projection 11 and an element isolation insulating film 23, having the shape of a gate electrode 21 on the side surfaces of the pillar projection 11 of a silicon semiconductor substrate 1.

Next, as shown in FIG. 11A, a predetermined dose of oxygen is ion-implanted at a predetermined acceleration energy into the entire surface of the silicon semiconductor substrate 1. The oxygen ion implantation position can be freely adjusted by setting the dose and the acceleration energy. In this embodiment, oxygen ions are implanted into a predetermined position at a depth of about 0.1 μm or less in an active region by setting the dose to $1 \times 10^{18}$ to $2 \times 10^{18}$ ($1/cm^2$) and the acceleration energy to 190 to 200 (keV).

After that, as shown in FIG. 11B, the silicon semiconductor substrate 1 is annealed. This annealing is performed at a temperature of 1320° C. for 6 hrs to form a buried oxide film 41 having a predetermined thickness in a predetermined position at a depth of about 0.1 μm or less in the active region. This depth in the active region is the channel width W2 of the second and third channels.

Subsequently, the side surfaces of the pillar projection 11 and the bottom surfaces of the narrow gaps 6 (i.e., exposed portions of the surface of the silicon semiconductor substrate 1) are thermally oxidized to form a gate oxide film 12 about 5 to 10 nm thick.

As shown in FIG. 11C, a phosphorus-doped or nondoped polycrystalline silicon film is formed by low-pressure CVD on the element isolation insulating film 23 so as to bury the narrow gaps 6. Thereafter, the gate electrode 21 is formed by sequentially performing photolithography and dry etching for the polycrystalline silicon film on the element isolation insulating film 23.

Next, the gate electrode 21 is used as a mask to ion-implant an n-type impurity such as phosphorus into the pillar projection 11. Annealing is then performed to form a pair of impurity diffusion layers 22 functioning as a source and a drain.

Finally, various steps of forming interconnecting lines and insulating interlayers are performed to complete the MOS transistor of the second embodiment.

Several modifications of the semiconductor device according to the second embodiment will be described below. Note that the same reference numerals as in the MOS transistors of the first embodiment and the like denote the same parts in these modifications, and a detailed description thereof will be omitted.

First Modification

The first modification will be described below. A semiconductor device of this first modification has substantially the same structure as the MOS transistor of the second embodiment. However, this semiconductor device is a semiconductor memory, a so-called EEPROM, in which a gate electrode is constituted by two conductive films formed via a capacitance insulating film.

Figure 12:
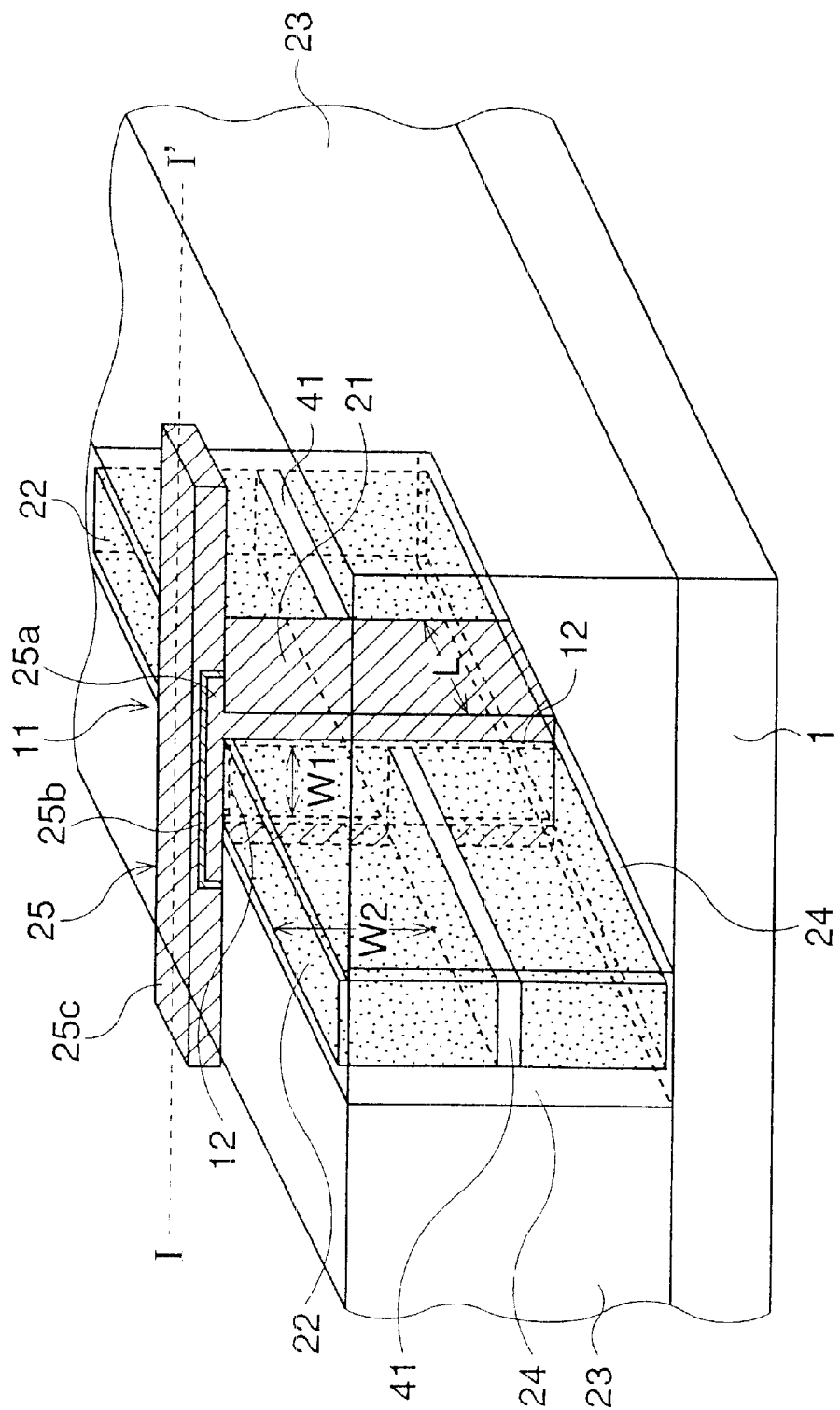
FIG. 12 is a schematic perspective view showing the main parts of an EEPROM according to the first modification of the second embodiment of the present invention.

That is, as shown in FIG. 12, this EEPROM has a structure in which a gate electrode 25 is constituted by a floating gate electrode 25a, a capacitance insulating film 25b covering the surface of this floating gate electrode 25a, and a control gate electrode 25c opposing the floating gate electrode 25a via the capacitance insulating film 25b in the structure of the MOS transistor of the second embodiment described above. In the EEPROM of the first modification, a memory cell is constituted by the gate electrode 25 and a pair of impurity diffusion layers 22, and this makes writes and reads of storage information feasible.

The floating gate electrode 25a is formed to cover central portions of the side surfaces of a pillar projection 11 via a gate oxide film 12 and divided into the form of an island on the pillar projection 11 via the gate oxide film 12. The gate oxide film 12 functions as a so-called tunnel insulating film.

The control gate electrode 25c opposes the floating gate electrode 25a via the capacitance insulating film 25b formed on the surface of the floating gate electrode 25a and extends in the form of a belt on an element isolation insulating film 23. The capacitance insulating film 25b is a so-called ONO film having a three-layered structure including a silicon oxide film, a silicon nitride film, and a silicon oxide film.

In the EEPROM of this first modification, the channel width W1 also defines the thickness of a depletion layer of a transistor formed by the second and third channels. If the channel width W1 is made very small, e.g., about 0.15 μm or less, the second and third channels are completely depleted. That is, in this MOS transistor it is unnecessary to form an element isolation insulating film in the silicon semiconductor substrate 1 because element isolation is performed by the element isolation insulating film 23. This readily achieves a very high integration degree. Additionally, this MOS transistor can be formed on the same semiconductor substrate as a common bulk MOS transistor, so very high drivability as an SOI structure is achieved.

Furthermore, the formation position of the buried oxide film 41 can be freely controlled as will be described later. Therefore, as in the case of the channel width W1 of the first channel, when the channel width W2 defined by the formation position (and the film thickness) of the buried oxide film 41 is controlled to about the de Broglie wavelength (e.g., about 0.10 μm or less) of an electron, a very fine, highly functional one-dimensional quantization device is realized.

Figure 13A:
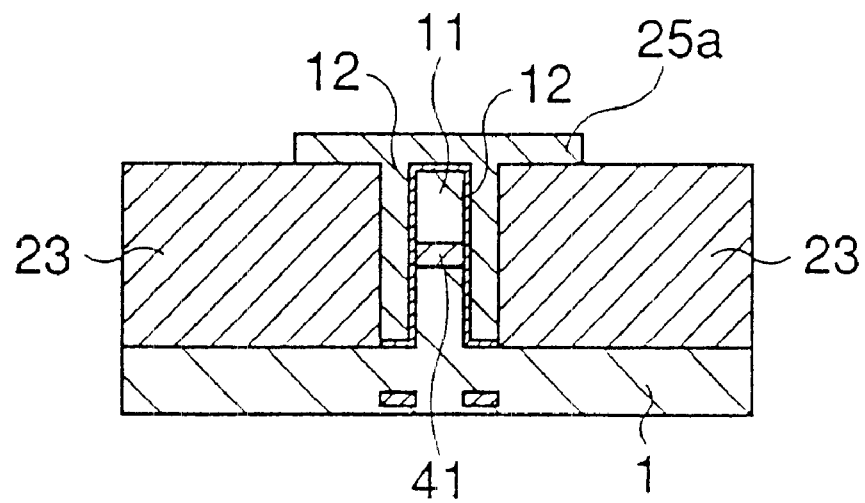
FIGS. 13A and 13B are schematic sectional views showing a method of fabricating the. EEPROM according to the first modification of the second embodiment of the present invention in order of steps.

A method of fabricating the EEPROM of the first modification will be described below with reference to FIGS. 13A and 13B corresponding to a section taken along a broken line I–I' in FIG. 12.

First, the steps shown in FIGS. 2A to 3B and the subsequent steps shown in FIGS. 11A and 11B in the second embodiment are performed. Thereafter, as shown in FIG. 11C, a phosphorus-doped or nondoped polycrystalline silicon film is formed by low-pressure CVD on an element isolation insulating film 23 so as to bury narrow gaps 6. Subsequently, as shown in FIG. 13A, photolithography and dry etching are sequentially performed for the polycrystalline silicon film on the element isolation insulating film 23 to divide the polycrystalline silicon film into an island on the element isolation insulating film 23, thereby forming a floating gate electrode 25a by patterning.

Figure 13B:
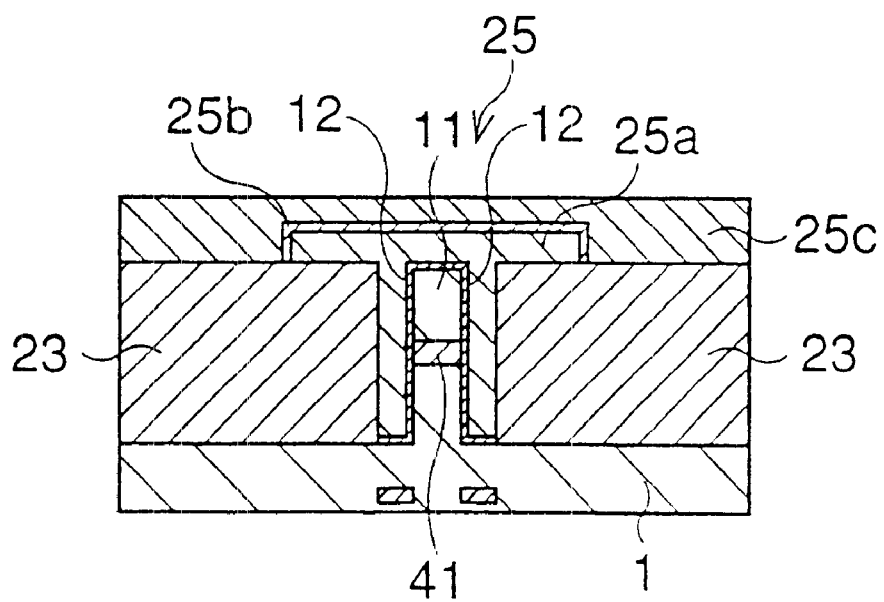

Next, as shown in FIG. 13B, a silicon oxide film, a silicon nitride film, and a silicon oxide film are sequentially formed to cover the floating gate electrode 25a by CVD and patterned to form a capacitance insulating film 25b as an ONO film. A phosphorus-doped or nondoped polycrystalline silicon film is then formed by low-pressure CVD on the element isolation insulating film 23 so as to cover the capacitance insulating film 25b. Subsequently, photolithography and dry etching are sequentially performed for the polycrystalline silicon film on the element isolation insulating film 23 to form a control gate electrode 25c, extending in the form of a belt on the element isolation insulating film 23, by patterning.

Finally, a pair of impurity diffusion layers 22 functioning as a source and a drain are formed, and various steps of forming interconnecting lines and insulating interlayers are preformed to complete the EEPROM of the first modification.

Note that this EEPROM can also be constituted as a so-called multi-valued memory by setting a predetermined value of two bits or more as a storage state. That is, if the storage state is n bits (n is an integer of 2 or more), it is only necessary to set $2^n$ different threshold voltages. For example, if the storage state is two bits, four different threshold voltages are used in a one-to-one correspondence with storage states "00", "01", "10", and "11". In a read, one storage state of each memory cell of the EEPROM is specified from the f our threshold voltages by a predetermined determining operation. In addition to the various effects described earlier, this multi-valued EEPROM greatly increases the storage density of each memory cell. Therefore, the EEPROM can w ell meet demands for a higher integration degree and a finer structure.

Second Modification

The second modification will be described below. A semiconductor device of this second modification has substantially the same structure as the MOS transistor of the first embodiment. However, this semiconductor device is a semiconductor memory, a so-called DRAM, in which a memory capacitor is formed-adjacent to a gate electrode.

Figure 14:
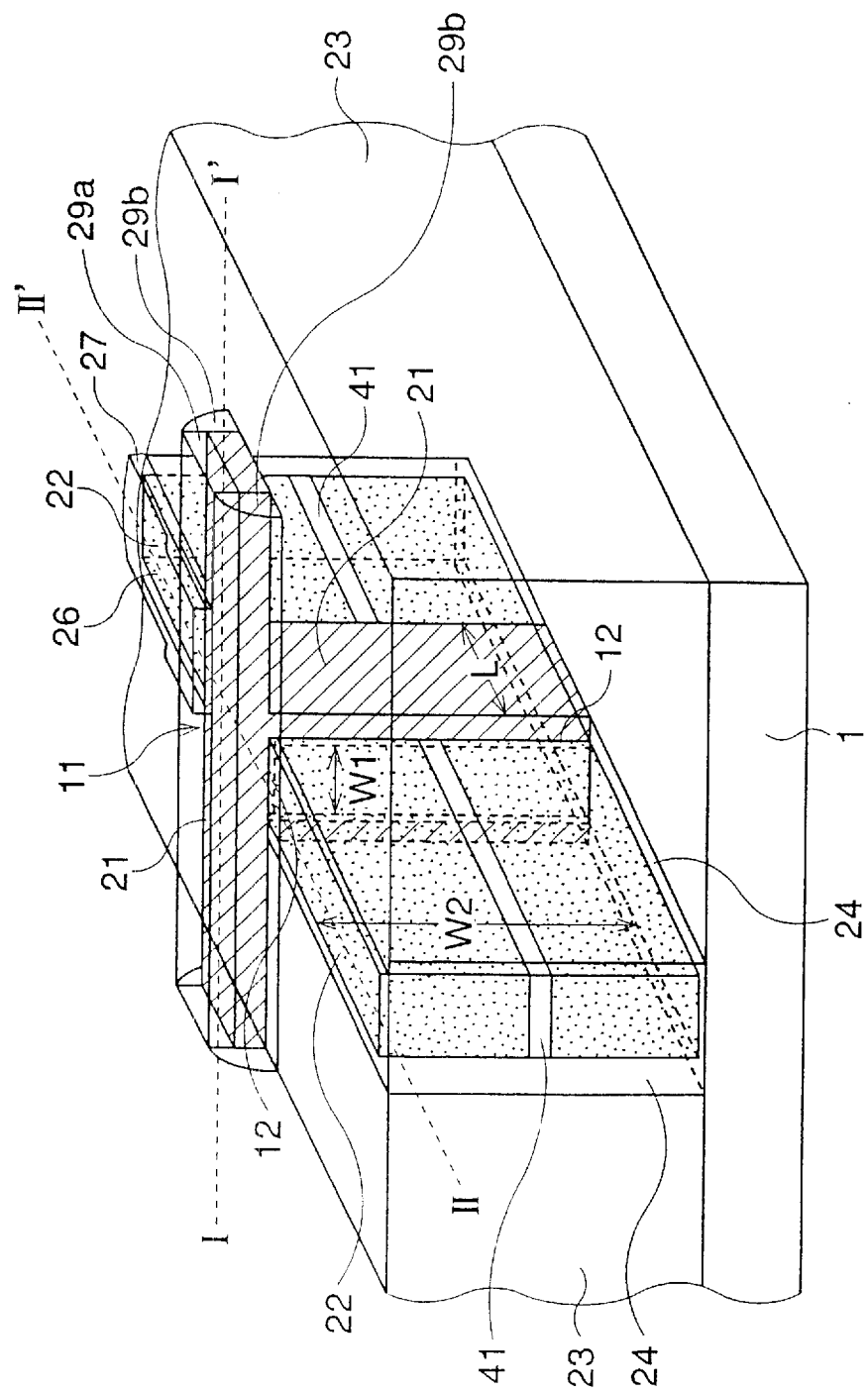
FIG. 14 is a schematic sectional view showing the main components of a DRAM according to the second modification of the second embodiment of the present invention.

That is, as shown in FIG. 14, this DRAM has a structure in which a capacitor electrode 27 opposing one of a pair of impurity diffusion layers 22 via a capacitance insulating film 26 is formed adjacent to a gate electrode 21 in addition to the structure of the MOS transistor of the second embodiment described above. In this structure, one impurity diffusion layer 22 and the capacitor electrode 27 capacitively couple with each other to function as a memory capacitor.

The capacitance insulating film 26 includes an inner wall surface of a narrow gap 6 formed between an element isolation insulating film 23 and one impurity diffusion layer 22. The capacitance insulating film 26 is formed from the element isolation insulating film 23 and extended over one impurity diffusion layer 22 to reach a side wall 29b, made of a silicon oxide film and covering the gate electrode 21 and a gate oxide film 12, and a cap insulating film 29a. This capacitance insulating film 26 is a so-called ONO film having a three-layered structure including a silicon oxide film, a silicon nitride film, and a silicon oxide film.

The capacitor electrode 27 is so patterned as to bury a trench 28 and cover the capacitance insulating film 26. The capacitor electrode 27 opposes the upper surface of one impurity diffusion layer 22 and also opposes the side surface of the same impurity diffusion layer 22 in the narrow gap 6 via the capacitance insulating film 26. That is, the capacitor electrode 27 capacitively couples with the upper surface and the side surface of one impurity diffusion layer 22 and functions as a memory capacitor. This memory capacitor and a MOS transistor together form a memory cell to make writes and reads of storage information possible.

In the DRAM of this second modification, as in the case of the second embodiment, the channel width W1 also defines the thickness of a depletion layer of a transistor formed by the second and third channels. If the channel width W1 is made very small, e.g., about 0.15 μm or less, the second and third channels are completely depleted. That is, in this MOS transistor it is unnecessary to form an element isolation insulating film in the silicon semiconductor substrate 1 because element isolation is performed by the element isolation insulating film 23. This readily achieves a very high integration degree. Additionally, this MOS transistor can be formed on the same semiconductor substrate as a common bulk MOS transistor, so very high drivability as an SOI structure is achieved.

Furthermore, the formation position of the buried oxide film 41 can be freely controlled as will be described later. Therefore, as in the case of the channel width W1 of the first channel, when the channel width W2 defined by the formation position (and the thickness) of the buried oxide film 41 is controlled to about the de Broglie wavelength (e.g., about 0.10 μm or less) of an electron, a very fine, highly functional one-dimensional quantization device is realized.

Figure 15A:
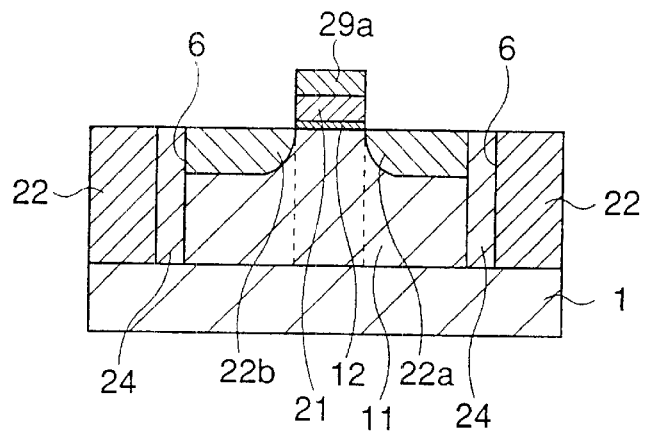
FIGS. 15A to 15C are schematic sectional views showing a method of fabricating the DRAM according to the second modification of the second embodiment of the present invention in order of steps.

A method of fabricating the DRAM of the second modification will be described below with reference to FIGS. 15A to 15C corresponding to a section taken along a broken line II–II' in FIG. 14.

First, the steps shown in FIGS. 2A to 3B and the subsequent steps shown in FIGS. 11A and 11B in the second embodiment are performed. Thereafter, as shown in FIG. 1C, a phosphorus-doped or nondoped polycrystalline film is formed by low-pressure CVD on an element isolation insulating film 23 so as to bury narrow gaps 6, and a silicon oxide film is deposited on the polycrystalline silicon film. Subsequently, as shown in FIG. 15A, photolithography and dry etching are sequentially performed for the polycrystalline silicon film and the silicon oxide film on the element isolation insulating film 23, thereby forming a gate electrode 21 and a cap insulating film 29a by patterning. The cap insulating film 29a is used as a mask to lightly ion-implant an n-type impurity such as phosphorus into a pillar projection 11, forming a lightly doped impurity diffusion layer 22a.

Figure 15B:
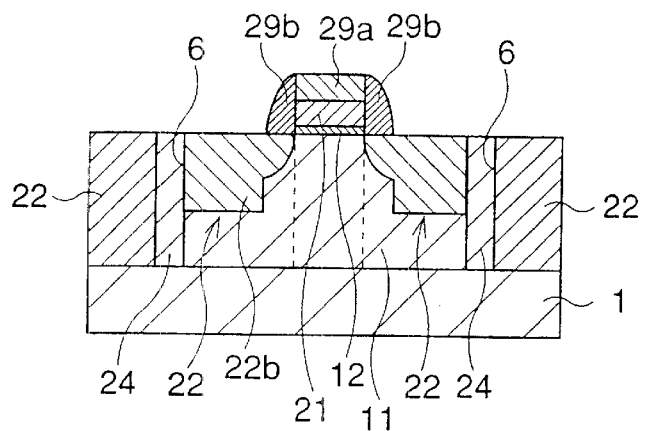
Figure 15C:
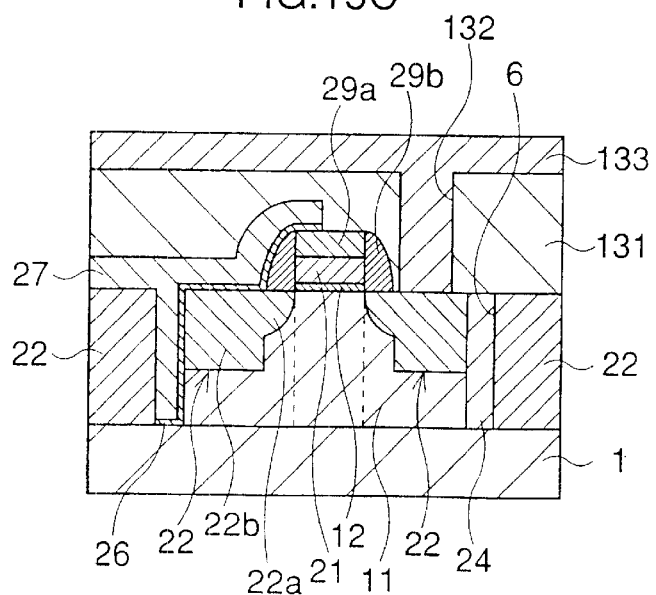

Subsequently, as shown in FIG. 15B, a silicon oxide film is deposited on the entire surface, and the entire surface of this silicon oxide film is anisotropically etched to leave the silicon oxide film behind only on the side surfaces of the gate electrode 21 and the cap insulating film 29a, thereby forming side walls 29b. Next, the cap insulating film 29a and the side walls 29b are used as masks to heavily ion-implant an n-type impurity such as phosphorus into the pillar projection 11, forming a heavily doped impurity diffusion layer 22b. Consequently, impurity diffusion layers 22 having a so-called LDD structure are formed.

Then, in one impurity diffusion layer 22, a PSG film 24 existing in the gap 6 between the pillar projection 11 and the element isolation insulating film 23 is removed. Next, as shown in FIG. 15C, a silicon oxide film, a silicon nitride film, and a silicon oxide film are sequentially formed on the entire surface including the inner wall surfaces of the gap 6 to form an ONO film. A polycrystalline film is formed on this ONO film, and the surface of the polycrystalline film is coated with a photoresist. This photoresist is processed by photolithography to form a photo mask 28. This photo mask 28 is used as a mask to etch the ONO film and the polycrystalline silicon film to divide them on the cap insulating film 29a. Consequently, a capacitance insulating film 26 made of the ONO film and a capacitor electrode 27 opposing the side surface and the upper surface of one impurity diffusion layer 22 via this capacitance insulating film 26 are formed by patterning.

Subsequently, an insulating interlayer 131 covering the entire surface is formed, a contact hole 132 for exposing the surface of the other impurity diffusion layer 22 is formed in the insulating interlayer 131, and an aluminum film is so formed as to bury the contact hole 132. This aluminum film is patterned to form a bit line 133 connected to the other impurity diffusion layer 22 and extending on the insulating interlayer 131.

Finally, various steps of forming interconnecting lines and insulating interlayers are performed to complete the DRAM of the second modification.

Note that this DRAM can also be constituted as a so-called multi-valued memory by setting a predetermined value of two bits or more as a storage state. That is, if the storage state is n bits (n is an integer of 2 or more), it is only necessary to set $2^n$ different threshold voltages. For example, if the storage state is two bits, four different threshold voltages are used in a one-to-one correspondence with storage states "00", "01", "10", and "11". In a read, one storage state of each memory cell of the DRAM is specified from the four threshold voltages by a predetermined determining operation. In addition to the various effects described earlier, this multi-valued EEPROM greatly increases the storage density of each memory cell. Therefore, the EEPROM can well meet demands for a higher integration degree and a finer structure.

Third Embodiment

Figure 16:
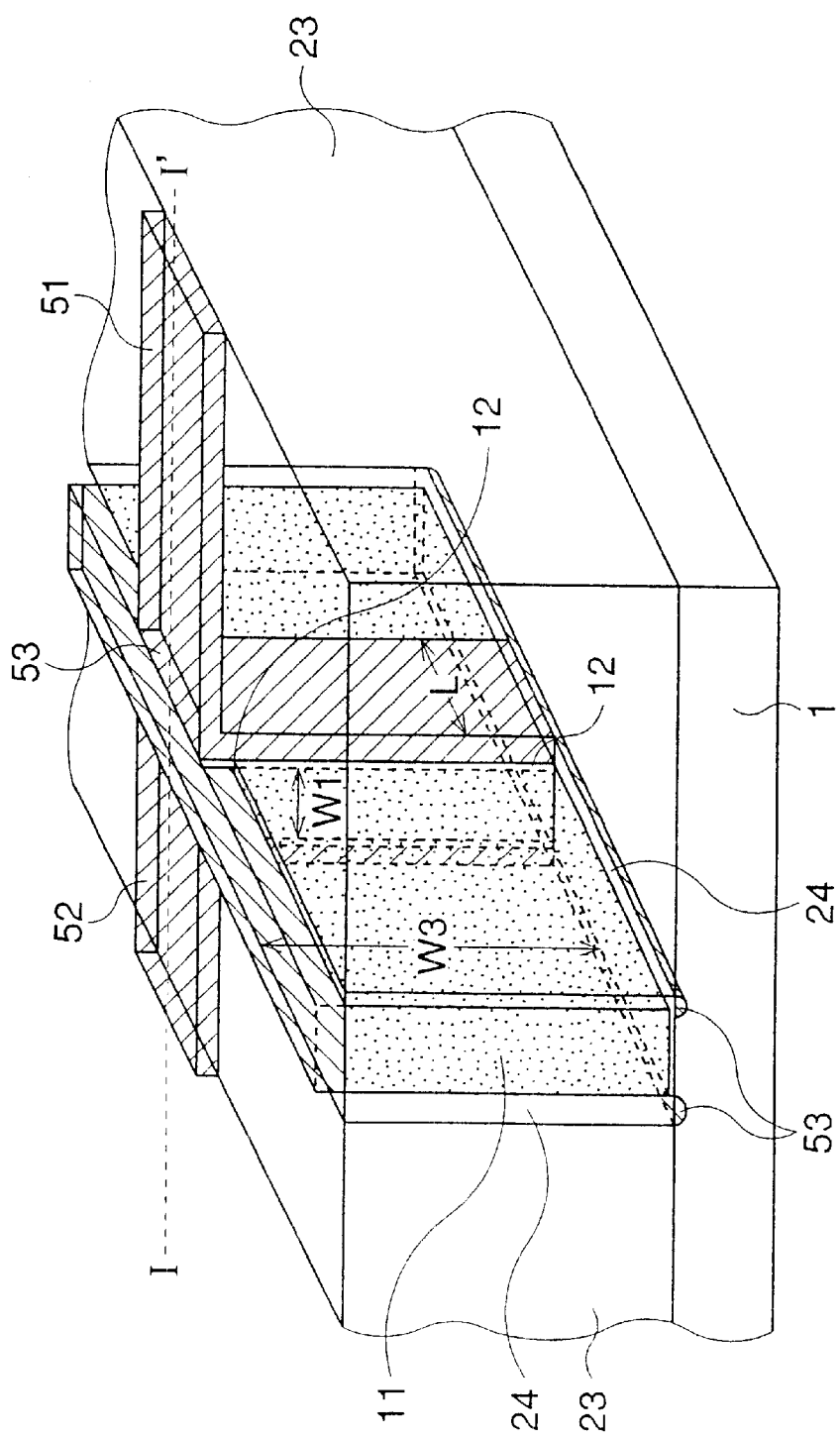
FIG. 16 is a schematic perspective view showing the major components of a MOS transistor according to the third embodiment of the present invention.
Figure 17A:
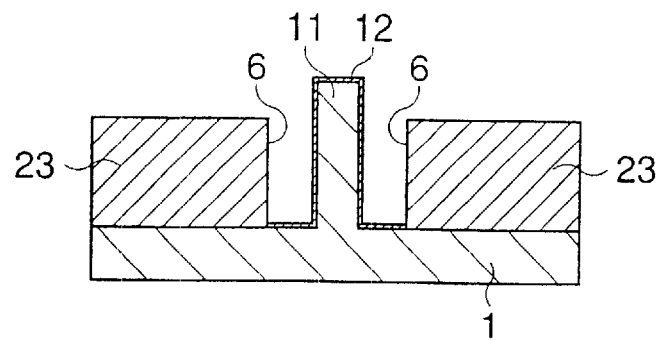
FIGS. 17A to 17C are schematic sectional views showing the major steps of a method of fabricating the MOS transistor according to the third embodiment of the present invention in order.
Figure 17B:
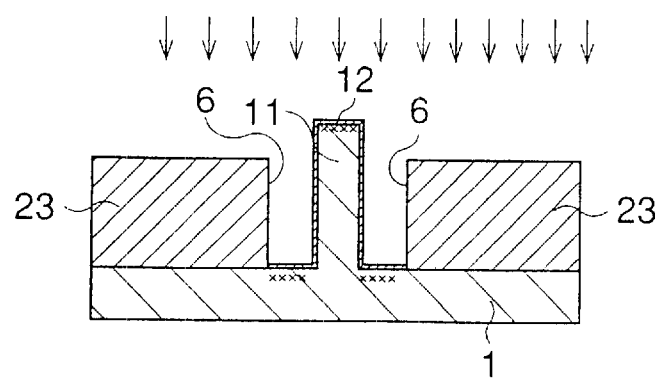
Figure 17C:
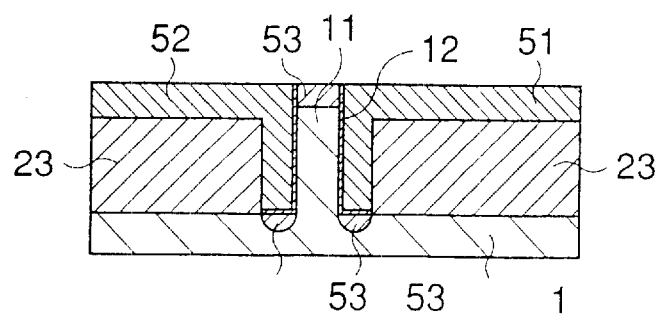

The third embodiment will be described below. A MOS transistor of this third embodiment has substantially the same structure as the first embodiment except that this transistor has a two-gate structure. FIG. 16 is a schematic perspective view showing the main parts of the MOS transistor of the third embodiment. FIGS. 17A to 17C are schematic sectional views showing the major steps of a method of fabricating this MOS transistor in order. Note that the same reference numerals as in the first embodiment denote the same parts in the third embodiment.

In the MOS transistor of this third embodiment, a pillar projection 11 serving as a very thin active region is formed on the surface of a p-type silicon semiconductor substrate 1. A pair of gate electrodes 51 and 52 are so formed as to cover two side surfaces in a central portion of the pillar projection 11. A pair of impurity diffusion layers 53 are formed on the pillar projection 11 and on the silicon semiconductor substrate 1 near the pillar projection 11. An element isolation insulating film 23 is formed to bury the side surfaces of the pillar projection 11.

The gate electrodes 51 and 52 are made of a polycrystalline silicon film. The gate electrodes 51 and 52 cover the pillar projection 11 via a gate oxide film 12 formed from the side surfaces in the central portion of the pillar projection 11 to the silicon semiconductor substrate 1 near a lower portion of the pillar projection 11. That is, the gate electrodes 51 and 52 are so patterned as to oppose the side surfaces of the pillar projection 11 and the nearby silicon semiconductor substrate via the gate oxide film 12.

The pair of impurity diffusion layers 53 are formed by ion-implanting an n-type impurity such as phosphorus (P) into the upper surface of the pillar projection 11 on the two sides of the gate electrodes 51 and 52 and the surface region of the silicon semiconductor substrate 1 near the pillar projection 11. The impurity diffusion layers 53 function as the source and the drain of this MOS transistor. The impurity diffusion layer 53 formed on the upper surface of the pillar projection 11 is shared by the gate electrodes 51 and 52.

The element isolation insulating film 23 is made of a silicon oxide film and so formed as to bury the side surfaces of the pillar projection 11 via a PSG film 24. The element isolation insulating film 23 has a function of insulating the pillar projection 11 serving as an active region from the surroundings.

In the MOS transistor of the third embodiment, two channels are formed from the gate electrodes 51 and 52 and the pillar projection 11 as will be described below. That is, first and second channels are so formed as to oppose each other on the two side surfaces of the pillar projection 11 by defining the dimension in a direction substantially perpendicular to the longitudinal direction of the gate electrodes 51 and 52 as a gate length L and the height from the silicon semiconductor substrate 1 to the lower surface of the impurity diffusion layer 53 formed on the pillar projection 11 as substantially a channel width W3.

A thickness W1 of the pillar projection 11 defines the thickness of a depletion layer of a transistor formed by the first and second channels. This results in a behavior equivalent to that of a two-gate transistor structure in an SOI structure. If the thickness W1 is made very small, e.g., about 0.15 μm or less, the first and second channels are completely depleted. That is, in this MOS transistor it is unnecessary to form an element isolation insulating film in the silicon semiconductor substrate 1 because element isolation is performed by the element isolation insulating film 23. This readily achieves a very high integration degree. Additionally, the pillar projection 11 and the silicon semiconductor substrate 1 are integrally formed. Therefore, very high drivability like that of an SOI structure is achieved although the active region is fixed to the substrate potential.

A method of fabricating the MOS transistor of the third embodiment will be described below with reference to FIGS. 2A to 2D, 3A, and 3B, and FIGS. 17A to 70C corresponding to a section taken along a broken line I–I' in FIG. 16.

First, as in the first embodiment, the steps shown in FIGS. 2A to 2D and the subsequent steps shown in FIGS. 3A and 3B are performed to form narrow gaps 6, between a pillar projection 11 and an element isolation insulating film 23, having the shape of gate electrodes 51 and 52 on the side surfaces of the pillar projection 11 of a silicon semiconductor substrate 1.

Next, as shown in FIG. 17A, photolithography and dry etching are sequentially performed to remove the upper surface of the element isolation insulating film 23 by a predetermined thickness.

Subsequently, the side surfaces of the pillar projection 11 and the bottom surfaces of the narrow gaps 6 (i.e., exposed portions of the surface of the silicon semiconductor substrate 1) are thermally oxidized to form a gate oxide film 12 about 5 to 10 nm thick.

Next, as shown in FIG. 17B, a predetermined dose of an n-type impurity such as arsenic (As) is ion-implanted at a predetermined acceleration energy into the entire surface of the silicon semiconductor substrate 1. In this embodiment, in order that the impurity be doped into the upper surface region of the pillar projection 11 and the surface region of the silicon semiconductor substrate 1 near the pillar projection 11, the ion implantation is performed by setting the dose to $5\times10^{15}$ to $1\times10^{16}$ (1/cm$^2$) and the acceleration energy to 50 to 70 (keV). Subsequently, the silicon semiconductor substrate 1 is annealed to form impurity diffusion layers 53 in the upper surface region of the pillar projection 11 and the surface region of the silicon semiconductor substrate 1 near the pillar projection 11.

After that, as shown in FIG. 17C, a phosphorus-doped or nondoped polycrystalline silicon film is formed by low-pressure CVD on the element isolation insulating film 23 so as to bury the narrow gaps 6 and cover the pillar projection 11. Subsequently, the polycrystalline silicon film on the element isolation insulating film 23 is polished by, e.g., CMP by using the pillar projection 11 as a stopper, thereby separating the polycrystalline silicon film by the pillar projection 11. Thereafter, photolithography and dry etching are sequentially performed to form the gate electrodes 51 and 52.

Finally, various steps of forming interconnecting lines and insulating interlayers are perform ed t o complete the MOS transistor of the third embodiment.

Note that in the third embodiment, two impurity diffusion layers 53 can also be formed in the upper surface region and the lower surface region of the pillar projection 11 and shared by the gate electrodes 51 and 52.

Fourth Embodiment

Figure 18:
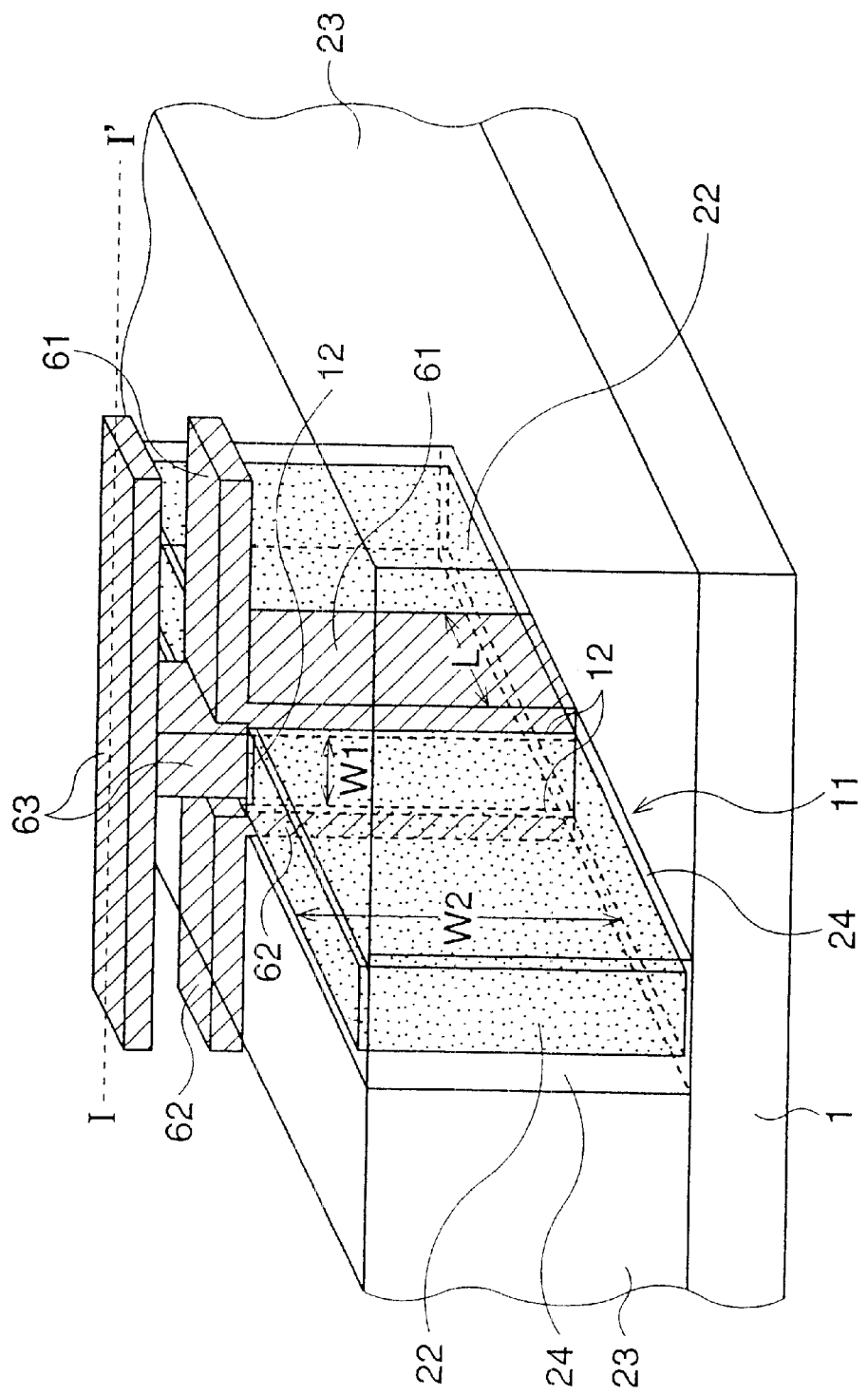
FIG. 18 is a schematic perspective view showing the major components of a MOS transistor according to the fourth embodiment of the present invention.

The fourth embodiment will be described below. A MOS transistor of this fourth embodiment has substantially the same structure as the first embodiment except that three transistors having a common source and a common drain are connected in parallel. FIG. 18 is a schematic perspective view showing the main parts of the MOS transistor of the fourth embodiment. FIGS. 19A to 19D are schematic sectional views showing the major steps of a method of fabricating this MOS transistor in order. Note that the same reference numerals as in the first embodiment denote the same parts in the fourth embodiment.

In the MOS transistor of this fourth embodiment, a pillar projection 11 serving as a very thin active region is formed on the surface of a p-type silicon semiconductor substrate 1. A pair of gate electrodes 61 and 62 oppose each other to cover central portions of the two side surfaces of the pillar projection 11. A pair of impurity diffusion layers 22 are formed on the pillar projection 11 on the two sides of the gate electrodes 61 and 62. A gate electrode 63 is connected to the upper surface of the pillar projection 11 via a gate oxide film 12. An element isolation insulating film 23 is formed to bury the side surfaces of the pillar projection 11.

The gate electrodes 61 and 62 are made of a polycrystalline silicon film. The gate electrodes 61 and 62 are formed via the gate oxide film 12 formed from the central portion of the pillar projection 11 to the silicon semiconductor substrate 1 near a lower portion of the pillar projection 11. These gate electrodes 61 and 62 are electrically isolated from each other and oppose each other to extend in the form of a belt on the element isolation insulating film 23.

The gate electrode 63 is connected to the gate oxide film 12 on the upper surface of the pillar projection 11. The gate electrode 63 is so arranged on the gate electrodes 61 and 62 as to extend nearly parallel to the gate electrodes 61 and 62 via an insulating interlayer 73.

The pair of impurity diffusion layers 22 are formed by ion-implanting an n-type impurity such as phosphorus (P) into the pillar projection 11 on the two sides of the gate electrodes 61 and 62. The impurity diffusion layers 22 function as the source and the drain of this MOS transistor.

The element isolation insulating film 23 is made of a silicon oxide film and so formed as to bury the side surfaces of the pillar projection 11 via a PSG film 24. The element isolation insulating film 23 has a function of insulating the pillar projection 11 serving as an active region from the surroundings.

The MOS transistor of the fourth embodiment has first, second, and third transistors sharing the pair of impurity diffusion layers 22 and connected in parallel with each other. The first transistor is constituted by the gate electrode 61 formed on the side surface of the pillar projection 11 via the gate oxide film 12 and the impurity diffusion layer 22. The second transistor is constituted by the gate electrode 62 formed on the side surface of the pillar projection 11 via the gate oxide film 12 and the impurity diffusion layer 22. The third transistor is constituted by the gate electrode 63 formed on the upper surface of the pillar projection 11 via the gate oxide film 12 and the impurity diffusion layer 22.

In the first and second transistors, first and second channels are so formed as to oppose each other on the two side surfaces of the pillar projection 11 by defining the gate length of the gate electrodes 61 and 62 as L and the height of the pillar projection 11 as a channel width W2. In the third transistor, a third channel is formed on the upper surface of the pillar projection 11 by defining the gate length of the gate electrode 63 as L and the dimension in a direction substantially perpendicular to the longitudinal direction of the pillar projection 11 as a channel width W1.

Figure 20:
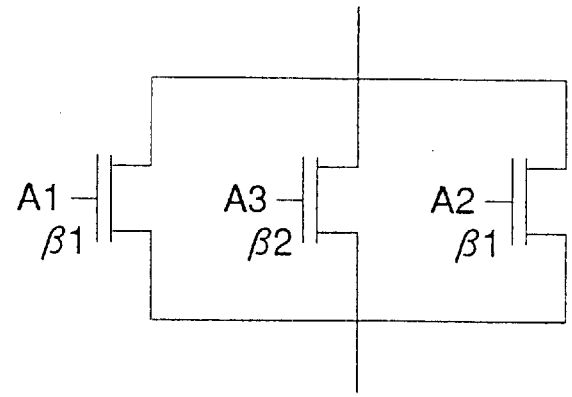
FIG. 20 is an equivalent circuit diagram showing the circuit configuration of first to third transistors as the main components of the MOS transistor according to the fourth embodiment of the present invention.

FIG. 20 shows an equivalent circuit diagram of first to third transistors $A_1$ to $A_3$ connected in parallel with each other. Letting $C_{ox}$ be the dielectric constant of the gate oxide film 12, L be the gate length, W be the channel width, $V_g$ be the input voltage to each gate, and $V_{th}$ be the threshold voltage, a conductance $\beta$ of the transistors $A_1$ to $A_3$ is defined by $$\beta = \mu C_{ox}(W/L)(V_g - V_{th})$$

The first and second transistors $A_1$ and $A_2$ have the same conductance, $\beta_1$, and the conductance of the third transistor $A_3$ is $\beta_2$ different from $\beta_1$.

Figure 21:
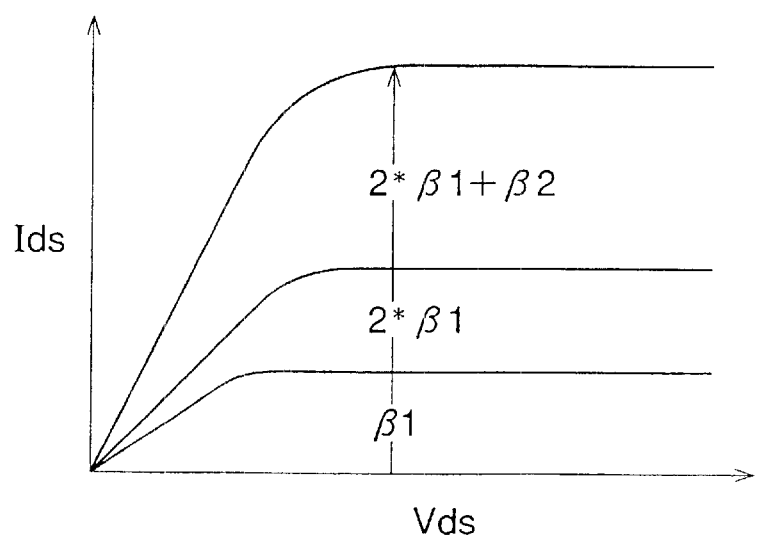
FIG. 21 is a graph showing the static characteristics of the MOS transistor according to the fourth embodiment of the present invention.

FIG. 21 shows the static characteristics of this MOS transistor. In accordance with the gate inputs to the individual transistors, the conductance is $\beta_1$ when only the first transistor $A_1$ is turned on, $2\beta_1$ when only the first and second transistors $A_1$ and $A_2$ are turned on, and $2\beta_1 + \beta_2$ when all of the first to third transistors $A_1$ to $A_3$ are turned on. That is, when a case in which all of the first to third transistors $A_1$ to $A_3$ are turned off is also taken into consideration, four different characteristics can be realized.

Figure 22:
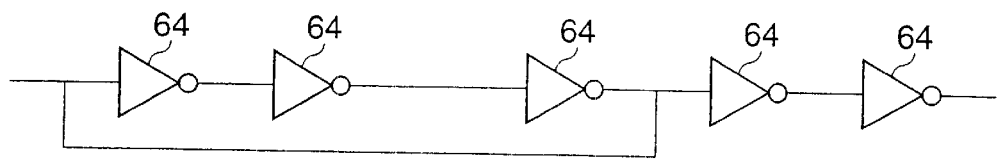
FIG. 22 is a circuit diagram showing a frequency divider obtained by applying the MOS transistor according to the fourth embodiment of the present invention to an inverter.
Figure 23:
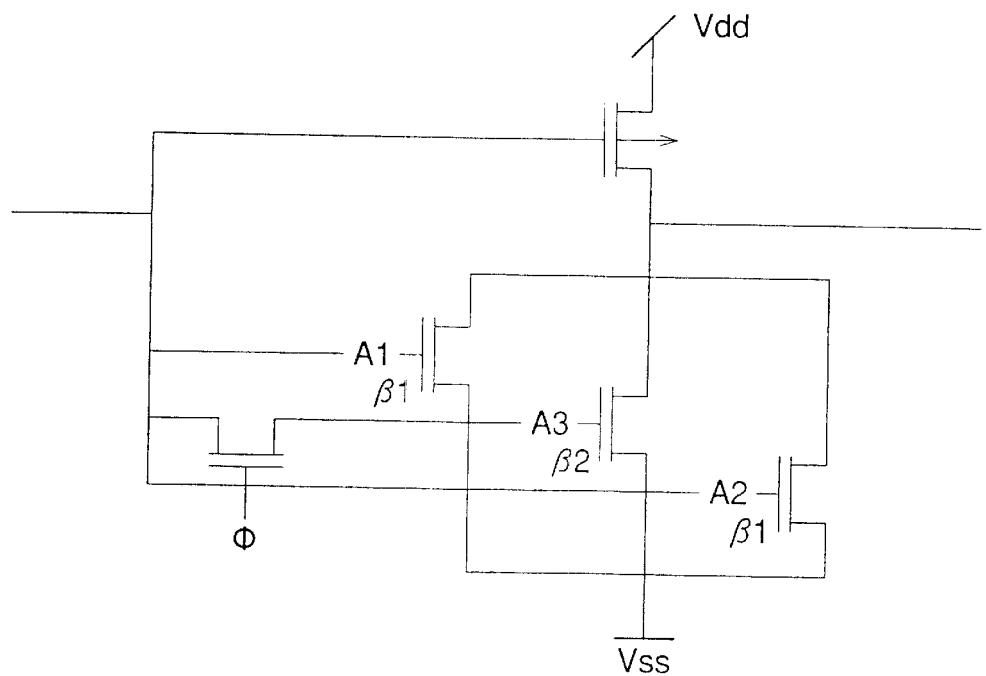
FIG. 23 is an equivalent circuit diagram showing the circuit configuration of each inverter shown in FIG. 22.

FIG. 22 shows an example of a frequency divider constituted by applying the MOS transistor of the fourth embodiment to an inverter. Each inverter 64 has a circuit configuration as shown in FIG. 23. Referring to FIG. 23, the gate input to the third transistor $A_3$ is switched by using an external signal $\phi$, thereby allowing the first to third transistors $A_1$ to $A_3$ to have two different driving states. Consequently, the frequency of the divider can be controlled.

In the MOS transistor of the fourth embodiment as described above, it is unnecessary to form an element isolation insulating film in the silicon semiconductor substrate 1 because element isolation is performed by the element isolation insulating film 23. This realizes a high integration degree. Additionally, a plurality of (e.g., four) different conductances can be achieved with very high drivability like that of an SOI structure.

A method of fabricating the MOS transistor of the fourth embodiment will be described below with reference to FIGS. 2A to 2D and 3A to 3C, and FIGS. 19A to 19D corresponding to a section taken along a broken line I–I' in FIG. 18.

First, as in the first embodiment, the steps shown in FIGS. 2A to 2D and 3A to 3C are performed to form narrow gaps 6, between a pillar projection 11 and an element isolation insulating film 23, having the shape of gate electrodes 61 and 62 on the side surfaces of the pillar projection 11 of a silicon semiconductor substrate 1. The side surfaces of the pillar projection 11 and the bottom surfaces of the gaps 6 are thermally oxidized to form a gate oxide film 12.

Figure 19A:
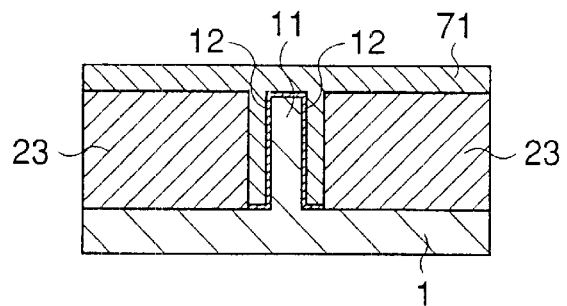
FIGS. 19A to 19D are schematic sectional views showing the major steps of a method of fabricating the MOS transistor according to the fourth embodiment of the present invention in order.

Next, as shown in FIG. 19A, a phosphorus-doped or nondoped polycrystalline silicon film 71 is formed by low-pressure CVD on the element isolation insulating film 23 so as to bury the narrow gaps 6. Subsequently, photolithography and dry etching are sequentially performed to process this polycrystalline silicon film 71 into a predetermined belt form on the element isolation insulating film 23.

The belt-like polycrystalline silicon film 71 is used as a mask to ion-implant an n-type impurity such as phosphorus into the pillar projection 11. Annealing is then performed to form a pair of impurity diffusion layers 22 serving as a source and a drain.

Figure 19B:
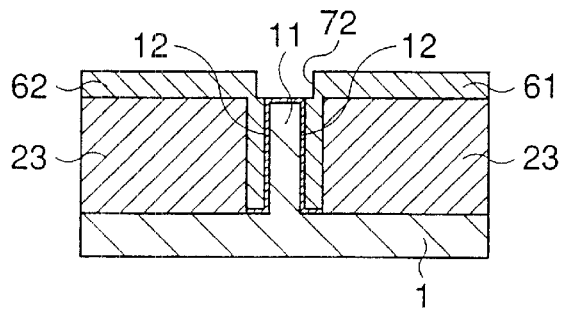

Next, as shown in FIG. 19B, photolithography and dry etching are sequentially performed for the polycrystalline silicon film 71 to form a trench 72 which exposes a portion of the gate oxide film 12 formed on the upper surface of the pillar projection 11 and divides the polycrystalline silicon film 71 on the pillar projection 11 via the gate oxide film 12. Consequently, the gate electrodes 61 and 62 opposed to each other are formed from central portions of the side surfaces of the pillar projection 11 via the gate oxide film 12 to the silicon semiconductor substrate 1 near a lower portion of the pillar projection 11.

Figure 19C:
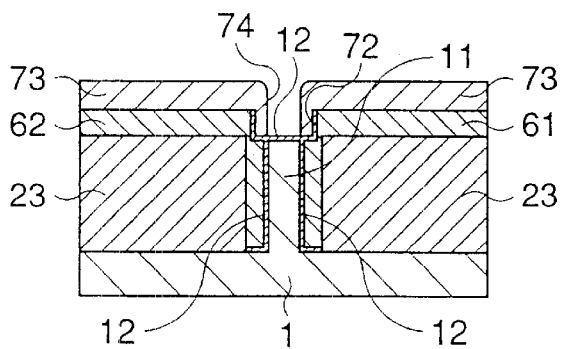

Then, as shown in FIG. 19C, the inner walls of the trench 72 are thermally oxidized. If the gate oxide film 12 has been removed by the patterning performed when the trench 72 is formed as described above, a gate oxide film 12 is again formed on the upper surface of the pillar projection 11 by this thermal oxidation.

Subsequently, an insulating interlayer 73 made of a silicon oxide film is formed by low-pressure CVD on the entire surface so as to bury the trench 72. Photolithography and dry etching are sequentially performed for a portion of this insulating interlayer 73 corresponding to the trench 72 to form a trench 74 which exposes a portion of the gate oxide film 12 formed on the upper surface of the pillar projection 11.

Figure 19D:
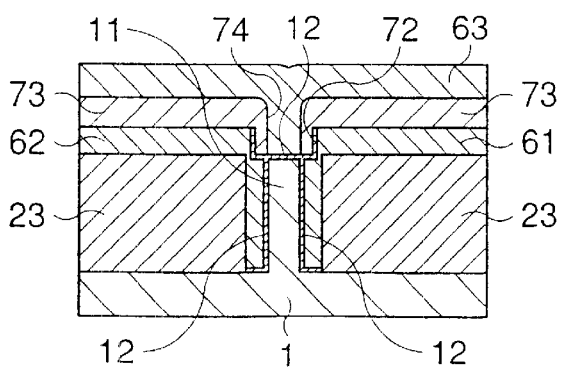

Next, as shown in FIG. 19D, a polycrystalline silicon film is formed by low-pressure CVD on the entire surface so as to bury the trench 74. Subsequently, photolithography and dry etching are sequentially performed to process this polycrystalline silicon film into the form of a belt substantially parallel to the gate electrodes 61 and 62 on the insulating interlayer 73, thereby forming a gate electrode 63.

Finally, various steps of forming interconnecting lines and insulating interlayers are performed to complete the MOS transistor of the fourth embodiment.

Several modifications of the MOS transistor according to the fourth embodiment will be described below. Note that the same reference numerals as in the MOS transistors of the first embodiment and the like denote the same parts in these modifications, and a detailed description thereof will be omitted.

First Modification

The first modification will be described below. A semiconductor device of this first modification has substantially the same structure as the MOS transistor of the fourth embodiment, but a method of fabricating the semiconductor device is partially different from that of the fourth embodiment. FIGS. 24A to 24D are schematic sectional views showing the several major steps of the method of fabricating the MOS transistor of this modification.

The method is the same as the fourth embodiment until FIG. 19A, i.e., a polycrystalline silicon film 71 is formed on an element isolation insulating film 23 so as to bury narrow gaps 6.

Figure 24A:
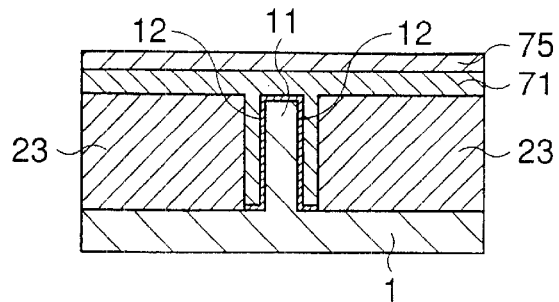
FIGS. 24A to 24D are schematic sectional views showing the several major steps of a method. of fabricating a MOS transistor according to the first modification of the fourth embodiment of the present invention.

Next, as shown in FIG. 24A, a silicon oxide film 75 is formed on the polycrystalline silicon film 71 by, e.g., low-pressure CVD. Photolithography and dry etching are sequentially performed to process the silicon oxide film 75 and the polycrystalline silicon film 71 into a predetermined belt form on the element isolation insulating film 23.

Subsequently. the belt-like silicon oxide film 75 is used as a mask to ion-implant an n-type impurity such as phosphorus into the pillar projection 11. Annealing is then performed to form a pair of impurity diffusion layers 22 functioning as a source and a drain.

Figure 24B:
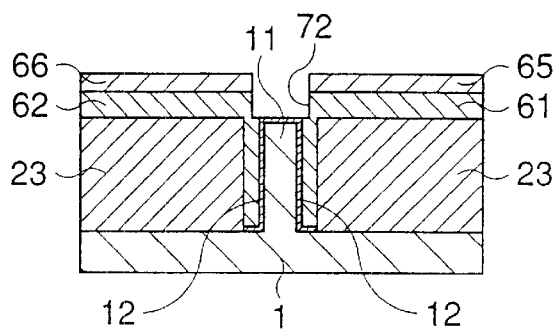

Next, as shown in FIG. 24B, photolithography and dry etching are sequentially performed for the silicon oxide film 75 and the polycrystalline silicon film 71 to form a trench 72 which exposes a portion of a gate oxide film 12 formed on the upper surface of a pillar projection 11 and divides the polycrystalline silicon film 71 on the pillar projection 11 via the gate oxide film 12. Consequently, gate electrodes 61 and 62 opposed to each other are formed from central portions of the side surfaces of the pillar projection 11 via the gate oxide film 12 to the silicon semiconductor substrate 1 near a lower portion of the pillar projection 11. Also, cap insulating films 65 and 66 of these gate electrodes are formed.

Figure 24C:
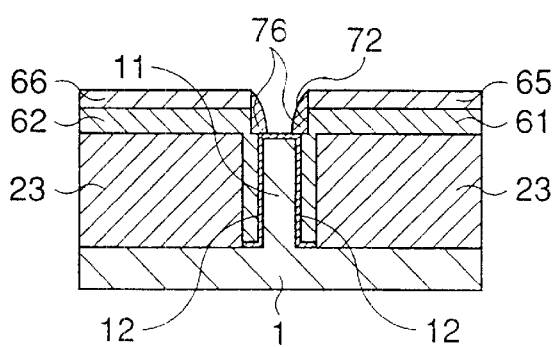

After that, as shown in FIG. 24C, the inner walls of the trench 72 are thermally oxidized. If the gate oxide film 12 has been removed by the patterning performed when the trench 72 is formed as described above, a gate oxide film 12 is again formed on the upper surface of the pillar projection 11 by this thermal oxidation.

Subsequently, an insulating film, in this modification a silicon nitride film, is formed on the entire surface including the interior of the trench 72. The entire surface of this silicon nitride film is dry-etched to form side walls 76 covering the gate electrodes 61 and 62 including the side walls in the trench 72 and exposed side surfaces of the cap insulating films 65 and 66. In this structure, the gate electrodes 61 and 62 are completely covered with the cap insulating films 65 and 66 and the side walls 76.

Figure 24D:
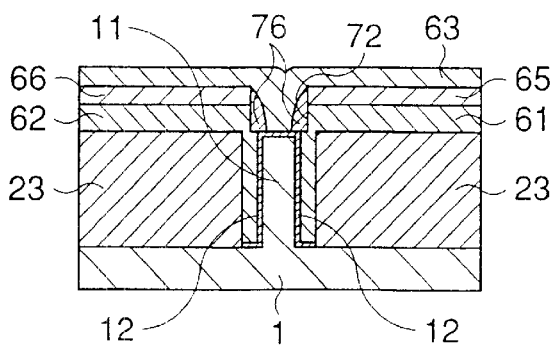

Next, as shown in FIG. 24D, a polycrystalline silicon film is formed by low-pressure CVD on the entire surface so as to bury the trench 72 via the side walls 76. Subsequently, photolithography and dry etching are sequentially performed to process this polycrystalline silicon film into the form of a belt substantially parallel to the gate electrodes 61 and 62 on the insulating interlayer 73, thereby forming a gate electrode 63.

Finally, various steps of forming interconnecting lines and insulating interlayers are performed to complete the MOS transistor of the first modification of the fourth embodiment.

This first modification has the various effects achieved by the fourth embodiment described above. In addition, the side walls 76 allow the gate electrode 63 to be accurately formed in a desired position while the gate electrode 63 is reliably insulated from the gate electrodes 61 and 62 easily by self-alignment.

Second Modification

The second modification will be described below. A semiconductor device of this second modification has substantially the same structure as the MOS transistor of the fourth embodiment. However, this semiconductor device is a semiconductor memory, a so-called EEPROM, in which a gate electrode is constituted by two conductive films formed via a capacitance insulating film.

Figure 25:
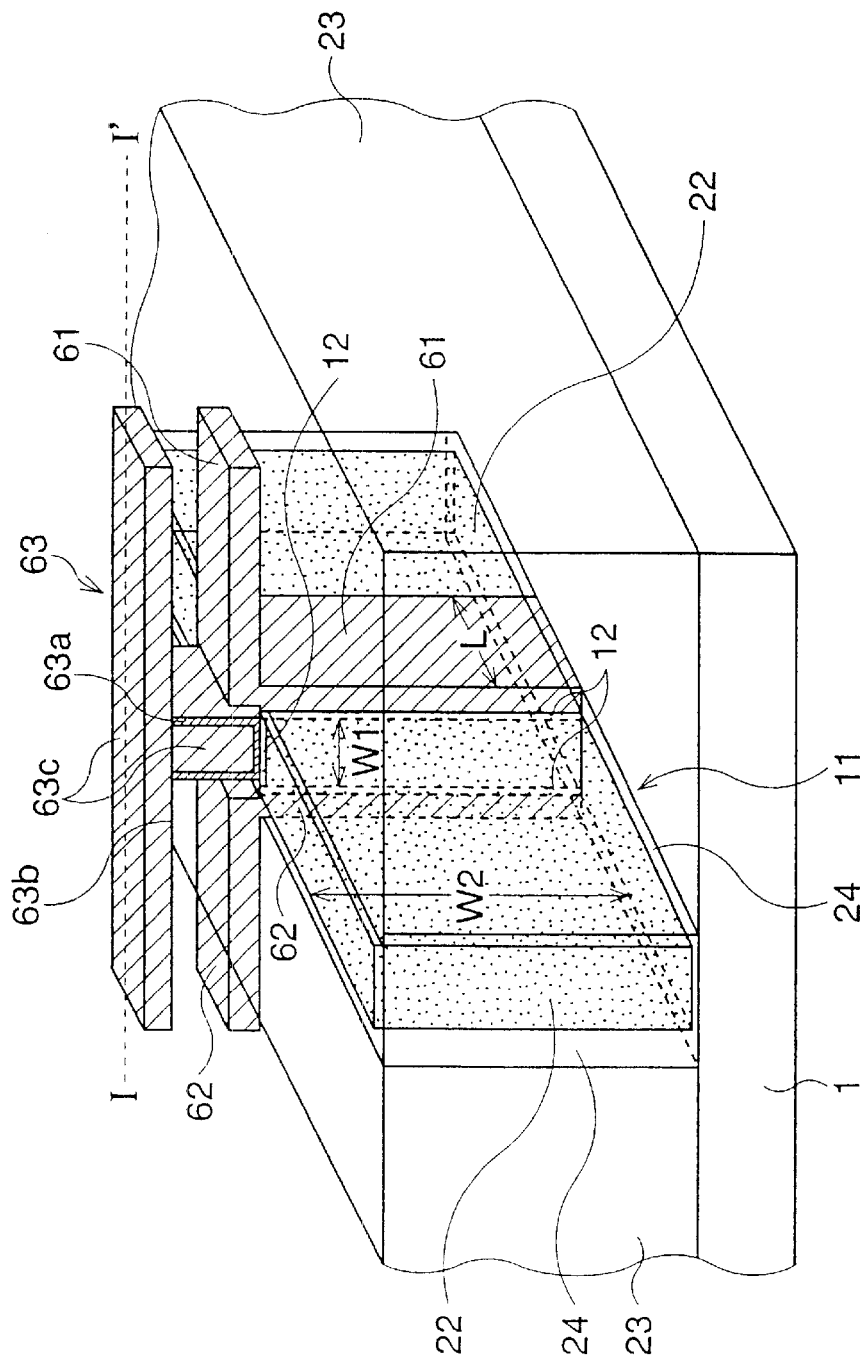
FIG. 25 is a schematic perspective view showing the main parts of an EEPROM according to the second modification of the fourth embodiment of the present invention.

That is, as shown in FIG. 25, this EEPROM has a structure in which a gate electrode 63 is constituted by a floating gate electrode 63a, a capacitance insulating film 63b covering the surface of this floating gate electrode 63a, and a control gate electrode 63c opposing the floating gate electrode 63a via the capacitance insulating film 63b in the structure of the MOS transistor of the fourth embodiment described above. In the EEPROM of the second modification, a memory cell is constituted by the gate electrode 63 and a pair of impurity diffusion layers 22, and this makes writes and reads of storage information feasible.

The floating gate electrode 63a is so formed as to cover only inner wall surfaces of a trench 74 which exposes a portion of a gate oxide film 12 on the upper surface of a pillar projection 11. On the bottom surface of the trench 74, the floating gate electrode 63a opposes the upper surface of the pillar projection 11 via the gate oxide film 12. The gate oxide film 12 functions as a so-called tunnel insulating film.

On the inner wall surfaces of the trench 74, the control gate electrode 63c opposes the floating gate electrode 63a via the capacitance insulating film 63b formed on the surface of the floating gate electrode 63a. The control gate electrode 63c extends in the form of a belt so as to be nearly parallel to gate electrodes 61 and 62 on an element isolation insulating film 23. The capacitance insulating film 63b is a so-called ONO film having a three-layered structure including a silicon oxide film, a silicon nitride film, and a silicon oxide film.

In the EEPROM of this second modification, as in the MOS transistor of the fourth embodiment, it is unnecessary to form an element isolation insulating film in the silicon semiconductor substrate 1 because element isolation is performed by the element isolation insulating film 23. This realizes a high integration degree. Additionally, a plurality of (e.g., four) different conductances can be achieved with very high drivability like that of an SOI structure. Consequently, a large storage capacity can be realized with a small occupied area.

Figure 26A:
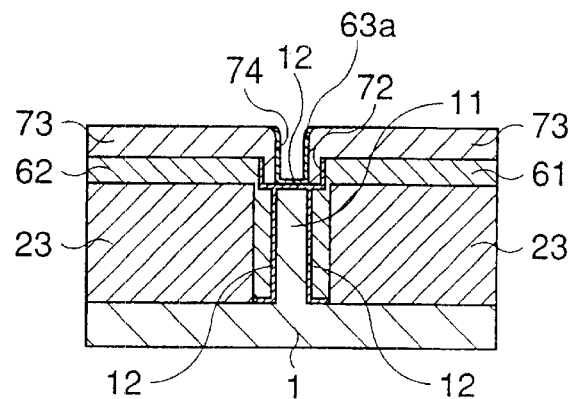
FIGS. 26A to 26C are schematic sectional views showing a method of fabricating the EEPROM according to the second modification of the fourth embodiment of the present invention in order of steps.

A method of fabricating the EEPROM of the second modification will be described below with reference to FIGS. 26A to 26C corresponding to a section taken along a broken line I–I' in FIG. 25.

First, the steps shown in FIGS. 2A to 3B and the subsequent steps shown in FIGS. 19A to 19C in the fourth embodiment are performed. Thereafter, as shown in FIG. 26A, a phosphorus-doped or nondoped polycrystalline silicon film is formed by low-pressure CVD on an insulating interlayer 73 so as to cover the inner wall surfaces of a trench 74 and have a predetermined thickness smaller than the half width of the trench 74. Subsequently, the polycrystalline silicon film on the insulating interlayer 73 is removed by chemical-mechanical polishing (CMP). Consequently, the polycrystalline silicon film so remains as to cover only the inner wall surfaces of the trench 74, forming an island floating gate electrode 63a.

Figure 26B:
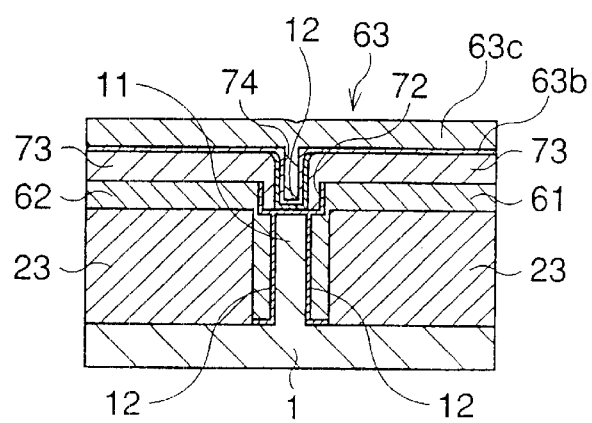
Figure 26C:
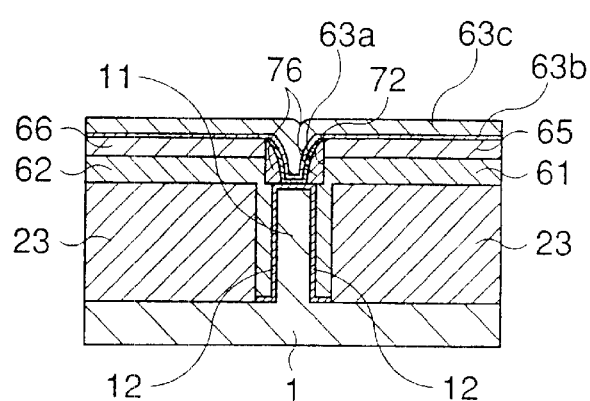

Next, as shown in FIG. 26B, a silicon oxide film, a silicon nitride film, and a silicon oxide film are sequentially formed to cover the floating gate electrode 63a by CVD and patterned to form a capacitance insulating film 63b as an ONO film. A phosphorus-doped or nondoped polycrystalline silicon film is then formed by low-pressure CVD on the entire surface so as to bury the trench 74 and oppose the floating gate electrode 63a via the capacitance insulating film 63b in the trench 74. Subsequently, photolithography and dry etching are sequentially performed for the polycrystalline silicon film on the insulating interlayer 73 to form a control gate electrode 63c, extending in the form of a belt on the insulating interlayer 73, by patterning.

Finally, a pair of impurity diffusion layers 22 functioning as a source and a drain are formed, and various steps of forming interconnecting lines and insulating interlayers are preformed to complete the EEPROM of the second modification.

Note that this EEPROM can also be constituted as a so-called multi-valued memory by setting a predetermined value of two bits or more as a storage state. That is, if the storage state is n bits (n is an integer of 2 or more), it is only necessary to set $2^n$ different threshold voltages. For example, if the storage state is two bits, four different threshold voltages are used in a one-to-one correspondence with storage states "00", "01", "10", and "11". In a read, one storage state of each memory cell of the EEPROM is specified from the four threshold voltages by a predetermined determining operation. In addition to the various effects described earlier, this multi-valued EEPROM greatly increases the storage density of each memory cell. Therefore, the EEPROM can well meet demands for a higher integration degree and a finer structure.

Note that the technique of this second modification is also applicable to the fabrication method of the first modification. FIG. 26C shows the state corresponding to FIG. 24D in this case.

Third Modification

The third modification will be described below. A semiconductor device of this third modification has substantially the same structure as the MOS transistor of the fourth embodiment. However, this semiconductor device is a semiconductor memory, a so-called DRAM, in which a memory capacitor is formed adjacent to a gate electrode.

Figure 27:
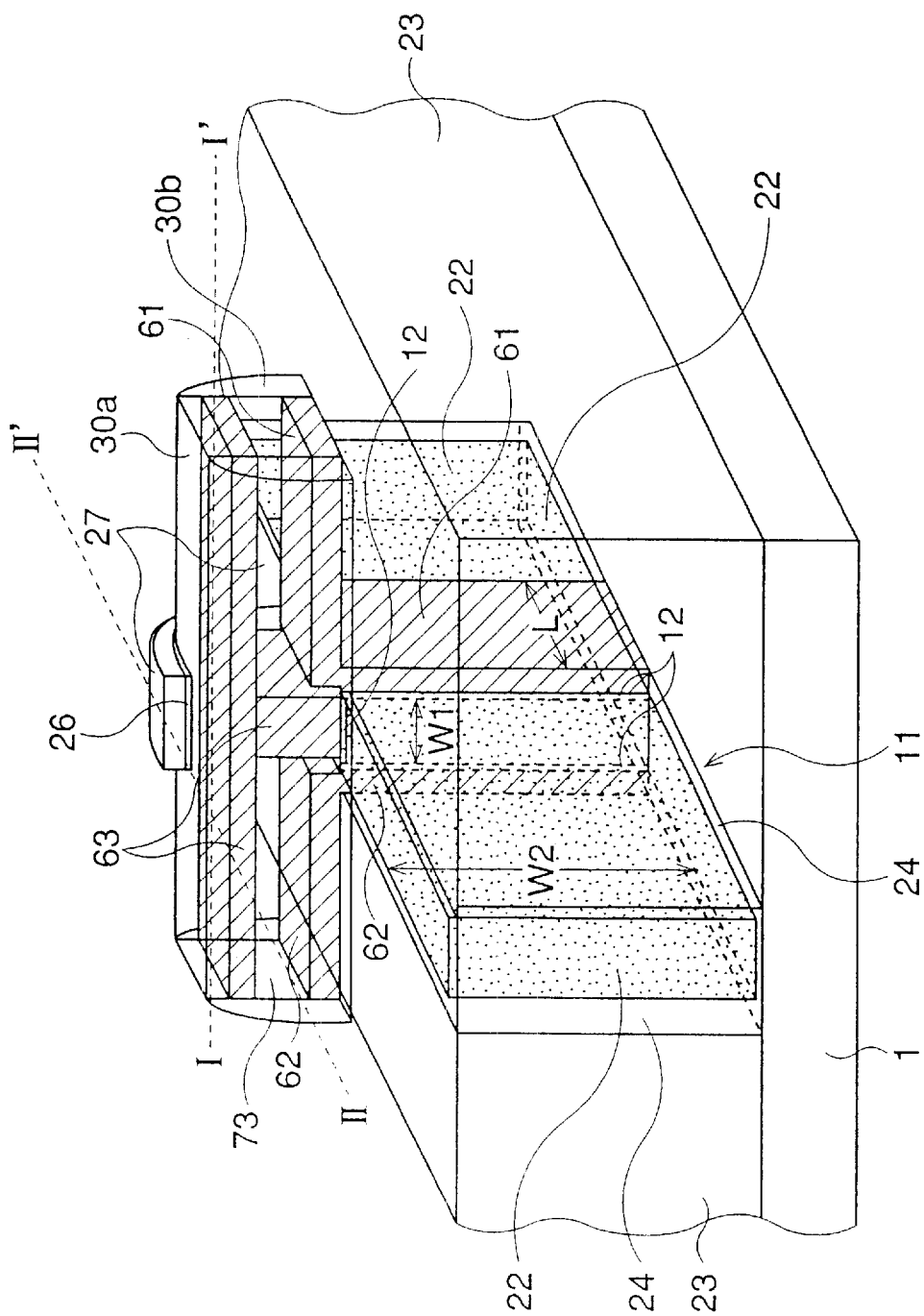
FIG. 27 is a schematic sectional view showing the main components of a DRAM according to the third modification of the fourth embodiment of the present invention.

That is, as shown in FIG. 27, this DRAM has a structure in which a capacitor electrode 27 opposing one of a pair of impurity diffusion layers 22 via a capacitance insulating film 26 is formed adjacent to gate electrodes 61 to 63 in addition to the structure of the MOS transistor of the fourth embodiment described above. In this structure, one impurity diffusion layer 22 and the capacitor electrode 27 capacitively couple with each other to function as a memory capacitor.

The capacitance insulating film 26 includes an inner wall surface of a narrow gap 6 formed between an element isolation insulating film 23 and one impurity diffusion layer 22. The capacitance insulating film 26 is formed from the element isolation insulating film 23 and extended over one impurity diffusion layer 22 to reach a side wall 30b, made of a silicon oxide film and covering the gate electrodes 61 to 63 and a gate oxide film 12, and a cap insulating film 30a. This capacitance insulating film 26 is a so-called ONO film having a three-layered structure including a silicon oxide film, a silicon nitride film, and a silicon oxide film.

The capacitor electrode 27 is so patterned as to bury a trench 28 and cover the capacitance insulating film 26. The capacitor electrode 27 opposes the upper surface of one impurity diffusion layer 22 and also opposes the side surface of the same impurity diffusion layer 22 in the narrow gap 6 via the capacitance insulating film 26. That is, the capacitor electrode 27 capacitively couples with the upper surface and the side surface of one impurity diffusion layer 22 and functions as a memory capacitor. This memory capacitor and a MOS transistor together form a memory cell to make writes and reads of storage information possible.

In the DRAM of this third modification, as in the case of the fourth embodiment, it is unnecessary to form an element isolation insulating film in the silicon semiconductor substrate 1 because element isolation is performed by the element isolation insulating film 23. This realizes a high integration degree. Additionally, a plurality of (e.g., four) different conductances can be achieved with very high drivability like that of an SOI structure. Consequently, a large storage capacity can be realized with a small occupied area.

Figure 28A:
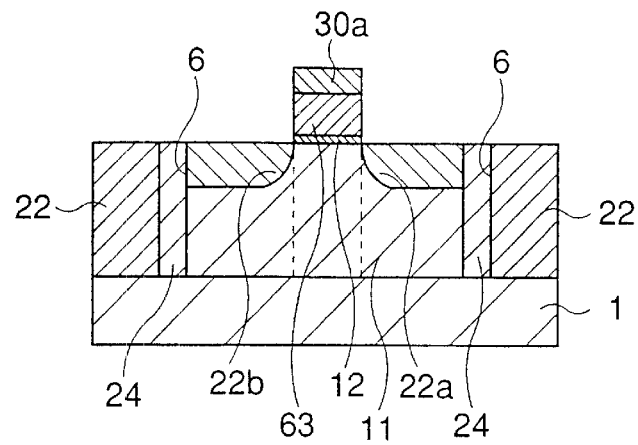
FIGS. 28A to 28C are schematic sectional views showing a method of fabricating the DRAM according to the third modification of the fourth embodiment of the present invention in order of steps.

A method of fabricating the DRAM of the third modification will be described below with reference to FIGS. 28A to 28C corresponding to a section taken along a broken line II–II' in FIG. 27.

First, the steps shown in FIGS. 2A to 3B and the subsequent steps shown in FIGS. 19A to 19C in the fourth embodiment are performed. Thereafter, as shown in FIG. 19D, a phosphorus-doped or nondoped polycrystalline film is formed by low-pressure CVD on an insulating interlayer 73 so as to bury narrow gaps 6 and a trench 74, and a silicon oxide film is deposited on the polycrystalline silicon film. Subsequently, as shown in FIG. 28A, photolithography and dry etching are sequentially performed for the polycrystalline silicon film and the silicon oxide film on the insulating interlayer 73, thereby forming a gate electrode 63 and a cap insulating film 30a by patterning. The cap insulating film 30a is used as a mask to lightly ion-implant an n-type impurity such as phosphorus into a pillar projection 11, forming a lightly doped impurity diffusion layer 22a.

Figure 28B:
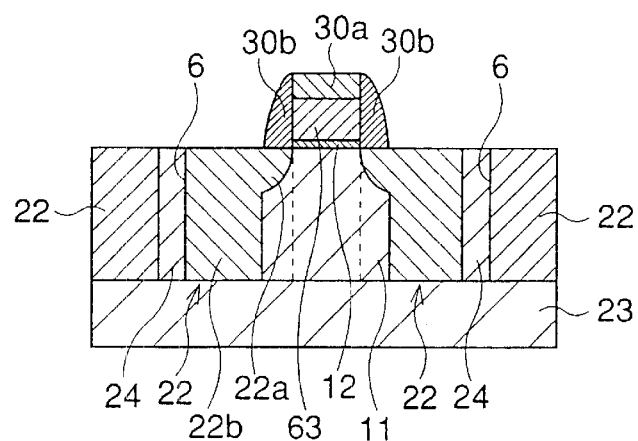
Figure 28C:
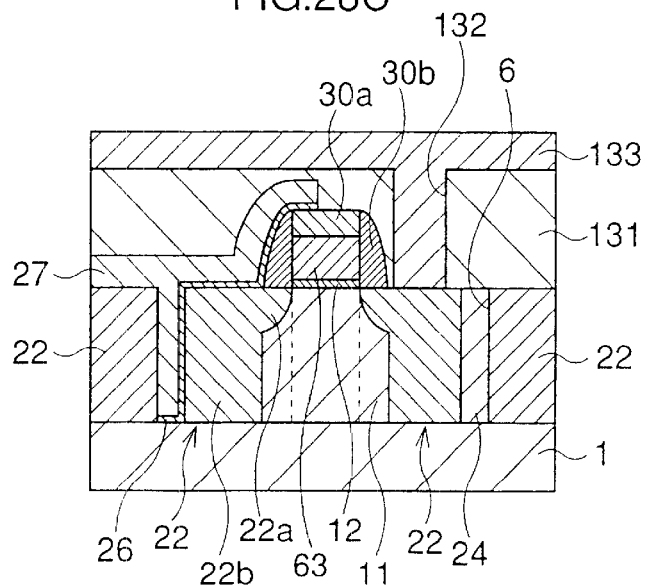

Subsequently, as shown in FIG. 28B, a silicon oxide film is deposited on the entire surface, and the entire surface of this silicon oxide film is anisotropically etched to leave the silicon oxide film behind only on the side surfaces of the gate electrodes 61 to 63 and the cap insulating film 30a, thereby forming side walls 30b. Next, the cap insulating film 30a and the side walls 30b are used as masks to heavily ion-implant an n-type impurity such as phosphorus into the pillar projection 11, forming a heavily doped impurity diffusion layer 22b. Consequently, impurity diffusion layers 22 having a so-called LDD structure are formed.

After that, in one impurity diffusion layer 22, a PSG film 24 existing in the narrow gap 6 between the pillar projection 11 and an element isolation insulating film 23 is removed. Next, as shown in FIG. 28C, a silicon oxide film, a silicon nitride film, and a silicon oxide film are sequentially formed on the entire surface including the inner wall surfaces of the narrow gap 6 to form an ONO film. A polycrystalline film is formed on this ONO film, and the surface of the polycrystalline film is coated with a photoresist. This photoresist is processed by photolithography to form a photo mask 28. This photo mask 28 is used as a mask to etch the ONO film and the polycrystalline silicon film to divide them on the cap insulating film 30a. Consequently, a capacitance insulating film 26 made of the ONO film and a capacitor electrode 27 opposing the side surface and the upper surface of one impurity diffusion layer 22 via this capacitance insulating film 26 are formed by patterning.

Next, an insulating interlayer 131 covering the entire surface is formed, a contact hole 132 for exposing the surface of the other impurity diffusion layer 22 is formed in the insulating interlayer 131, and an aluminum film is so formed as to bury the contact hole 132. This aluminum film is patterned to form a bit line 133 connected to the other impurity diffusion layer 22 and extending on the insulating interlayer 131.

Finally, various steps of forming interconnecting lines and insulating interlayers are performed to complete the DRAM of the third modification.

Fifth Embodiment

Figure 29:
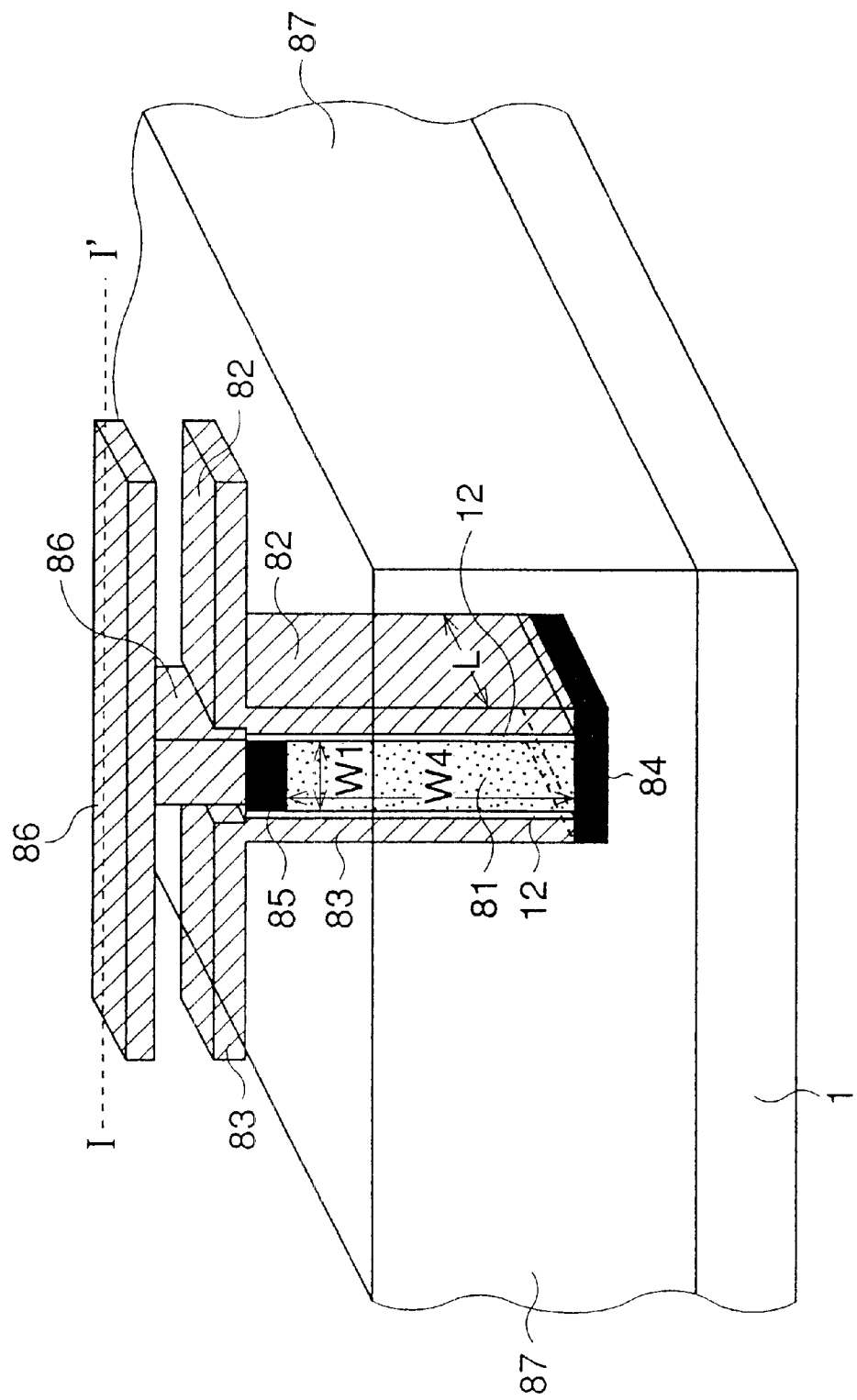
FIG. 29 is a schematic perspective view showing the major components of a MOS transistor according to the fifth embodiment of the present invention.

The fifth embodiment will be described below. A MOS transistor of this fifth embodiment has substantially the same structure as the first embodiment except that this transistor has a two-gate structure. FIG. 29 is a schematic perspective view showing the main parts of the MOS transistor of the fifth embodiment. FIGS. 30A to 30C and FIGS. 31A to 31B are schematic sectional views showing the major steps of a method of fabricating this MOS transistor in order. Note that the same reference numerals as in the first embodiment denote the same parts in the fifth embodiment.

In the MOS transistor of this fifth embodiment, a pillar projection 81 serving as a very thin active region is formed on the surface of a p-type silicon semiconductor substrate 1. A pair of gate electrodes 82 and 83 are so formed as to cover the two side surfaces of the pillar projection 81. A source 84 as one impurity diffusion layer is formed in the silicon semiconductor substrate 1 below the pillar projection 81. A drain 85 as the other impurity diffusion layer is formed on the pillar projection 81, and an interconnecting film 86 is connected to this drain 85. An element isolation insulating film 87 is formed to bury the side surfaces of the pillar projection 81.

Unlike in the first embodiment, the pillar projection 81 is so formed that the dimension in the longitudinal direction is substantially equal to a gate length L.

The gate electrodes 82 and 83 are made of a polycrystalline silicon film. The gate electrodes 82 and 83 cover the pillar projection 81 via a gate oxide film 12 formed from the side surfaces of the pillar projection 81 to the silicon semiconductor substrate 1 near a lower portion of the pillar projection 81. That is, the gate electrodes 82 and 83 are so patterned as to oppose the silicon semiconductor substrate 1 near the side surfaces of the pillar projection 81 via the gate oxide film 12.

The source 84 as one impurity diffusion layer is formed by ion-implanting an n-type impurity such as phosphorus (P) into the surface region of the silicon semiconductor substrate 1 below the pillar projection 81. The drain 85 as the other impurity diffusion layer is formed by ion-implanting an n-type impurity such as phosphorus (P) into the upper surface of the pillar projection 81. The source 84 and the drain 85 are shared by the gate electrodes 82 and 83.

The interconnecting film 86 is electrically connected to the upper surface of the pillar projection 81, i.e., the surface of the drain 85. This interconnecting film 86 extends in the form of a belt on the gate electrodes 82 and 83 via an insulating interlayer 93 so as to be nearly parallel to the gate electrodes 82 and 83. The interconnecting film 86 functions as a so-called bit line.

The element isolation insulating film 87 is made of a silicon oxide film and so formed as to cover and bury the pillar projection 81. The element isolation insulating film 87 has a function of insulating the pillar projection 81 serving as an active region from the surroundings.

In the MOS transistor of the fifth embodiment, two channels are formed from the gate electrodes 82 and 83 and the pillar projection 81 as will be described below. That is, first and second channels are so formed as to oppose each other on the two side surfaces of the pillar projection 81 by defining the dimension in a direction substantially perpendicular to the longitudinal direction of the gate electrodes 82 and 83 as the gate length L and the height from the silicon semiconductor substrate 1 to the lower surface of the drain 85 as a channel width W4.

A thickness W1 of the pillar projection 81 defines the thickness of a depletion layer of a transistor formed by the first and second channels. This results in a behavior equivalent to that of a two-gate transistor structure in an SOI structure. If the thickness W1 is made very small, e.g., about 0.15 µm or less, the first and second channels are completely depleted. That is, in this MOS transistor it is unnecessary to form an element isolation insulating film in the silicon semiconductor substrate 1 because element isolation is performed by the element isolation insulating film 87. This readily achieves a very high integration degree. Additionally, the pillar projection 81 and the silicon semiconductor substrate 1 are integrally formed. Therefore, very high drivability like that of an SOI structure is achieved although the active region is fixed to the substrate potential.

A method of fabricating the MOS transistor of the fifth embodiment will be described below with reference to FIGS. 2A to 2D and 3A to 3C, and FIGS. 30A to 30C, 31A, and 31B corresponding to a section taken along a broken line I–I' in FIG. 29.

First, as in the first embodiment, the steps shown in FIGS. 2A to 2D and the subsequent steps shown in 3A to 3C are performed to form narrow gaps 6, between a pillar projection 81 and an element isolation insulating film 87, having the shape of gate electrodes 82 and 83 on the side surfaces of the pillar projection 81 of a silicon semiconductor substrate 1. The side surfaces of the pillar projection 81 and the bottom surfaces of the narrow gaps 6 are thermally oxidized to form a gate oxide film 12. This process differs from that of the first embodiment in that the width in the longitudinal direction of the pillar projection 81 roughly equals the gate length L of the gate electrodes 82 and 83.

Figure 30A:
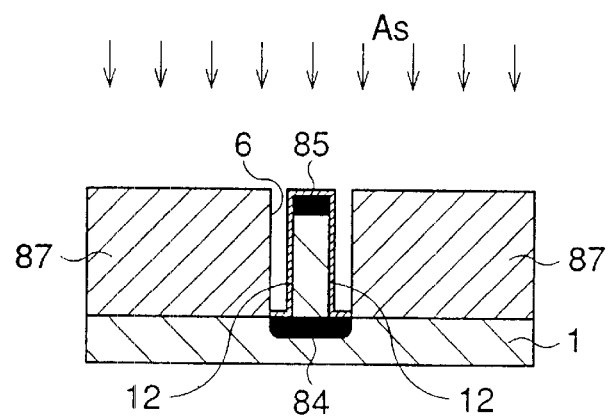
FIGS. 30A to 30C are schematic sectional views showing the major steps of a method of fabricating the MOS transistor according to the fifth embodiment of the present invention in order.

Next, as shown in FIG. 30A, a predetermined dose of an n-type impurity such as arsenic (As) is ion-implanted at a predetermined acceleration energy into the entire surface of the silicon semiconductor substrate 1. In this embodiment, in order that the impurity be doped into the upper surface region of the pillar projection 81 and the surface region of the silicon semiconductor substrate 1 near the pillar projection 81, the ion implantation is performed by setting the dose to $5 \times 10^{15}$ to $1 \times 10^{16}$ (1/cm$^2$) and the acceleration energy to 50 to 70 (keV). Subsequently, the silicon semiconductor substrate 1 is annealed to form a drain 85 as one impurity diffusion layer in the upper surface region of the pillar projection 81 and a source 84 as the other impurity diffusion layer in the surface region of the silicon semiconductor substrate 1 below the pillar projection 81.

Figure 30B:
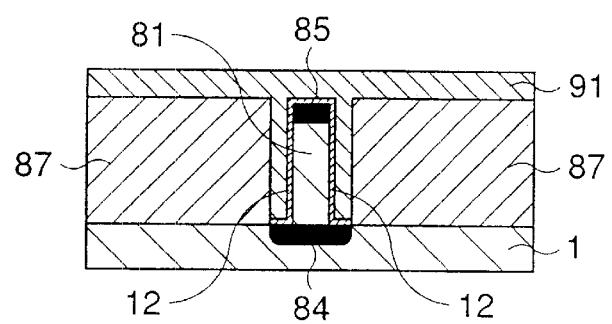

Next, as shown in FIG. 30B, a phosphorus-doped or nondoped polycrystalline silicon film 91 is formed by low-pressure CVD on the element isolation insulating film 87 so as to bury the narrow gaps 6.

Figure 30C:
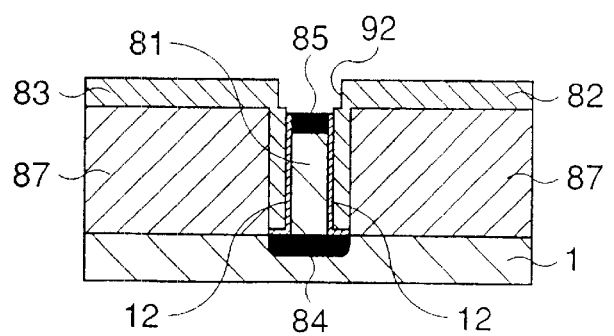

As shown in FIG. 30C, photolithography and dry etching are sequentially performed to process the polycrystalline silicon film 91 into a predetermined belt form on the element isolation insulating film 87 and form a trench 92 which exposes a portion of the gate oxide film 12 formed on the upper surface of the pillar projection 11 and divides the polycrystalline silicon film 91 on the pillar projection 81 via the gate oxide film 12. Consequently, the gate electrodes 82 and 83 opposed to each other are formed from central portions of the side surfaces of the pillar projection 81 via the gate oxide film 12 to the silicon semiconductor substrate 1 near a lower portion of the pillar projection 81.

Subsequently, the structure is washed using HF for about 7 to 10 min to completely remove the gate oxide film 12 present on the bottom surface of the trench 92, thereby exposing a portion of the upper surface of the pillar projection 81, i.e., a portion of the surface of the drain 85.

Figure 31A:
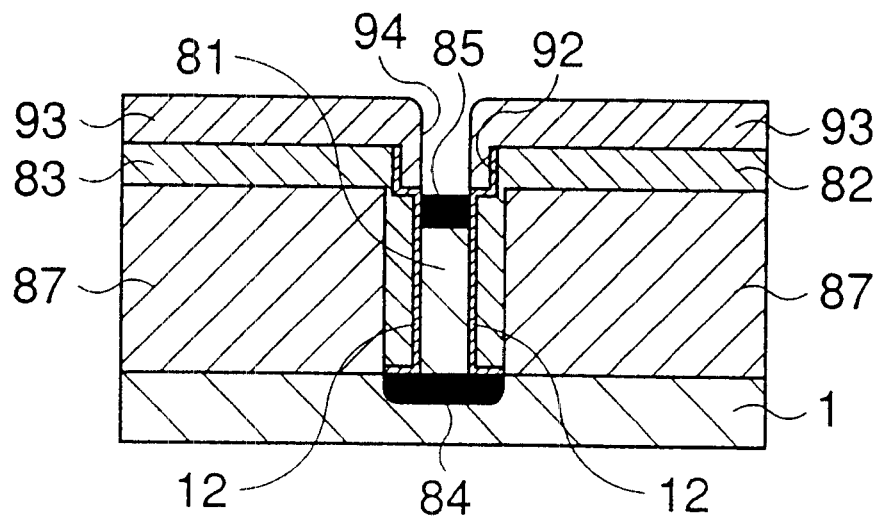
FIGS. 31A and 31B are schematic sectional views showing the major steps of the method of fabricating the MOS transistor according to the fifth embodiment of the present invention in order following the step shown in FIG. 30C.

Next, as shown in FIG. 31A, an insulating interlayer 93 made of a silicon oxide film is formed by low-pressure CVD on the entire surface so as to bury the trench 92. Photolithography and dry etching are sequentially performed for a portion of this insulating interlayer 93 corresponding to the trench 92 to form a trench 94 which exposes a portion of the surface of the drain 85.

Figure 31B:
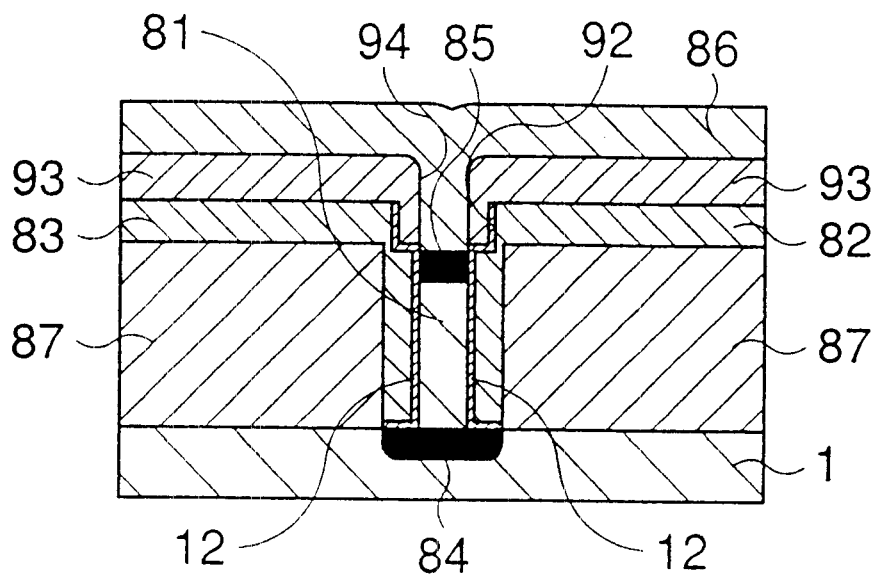

After that, as shown in FIG. 31B, a polycrystalline silicon film is formed by low-pressure CVD on the entire surface so as to bury the trench 94. Subsequently, photolithography and dry etching are sequentially performed to process this polycrystalline silicon film into the form of a belt nearly parallel to the gate electrodes 82 and 83 on the insulating interlayer 93, thereby forming an interconnecting film 86 electrically connected to the drain 85 of the pillar projection 81 via the trench 94.

Finally, various steps of forming interconnecting lines and insulating interlayers are performed to complete the MOS transistor of the fifth embodiment.

Modification

A modification of the MOS transistor according to the fifth embodiment will be described below. A semiconductor device of this first modification has substantially the same structure as the MOS transistor of the fifth embodiment, but a method of fabricating the semiconductor device is partially different from that of the fifth embodiment. FIGS. 32A to 32D are schematic sectional views showing the several major steps of the method of fabricating the MOS transistor of this modification. Note that the same reference numerals as in the MOS transistor of the first embodiment denote the same parts in this modification, and a detailed description thereof will be omitted.

The method is the same as the fifth embodiment until FIG. 30B, i.e., a polycrystalline silicon film 91 is formed on an element isolation insulating film 87 so as to bury narrow gaps 6.

Figure 32A:
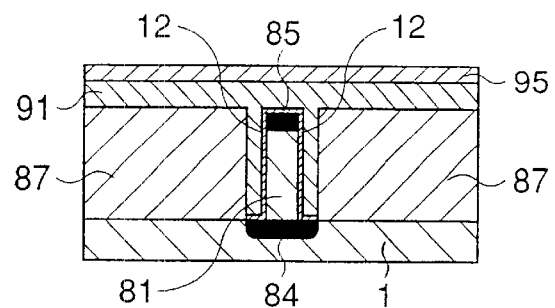
FIGS. 32A to 32D are schematic sectional views showing the several major steps of a method of fabricating a MOS transistor according to a modification of the fifth embodiment of the present invention.

Next, as shown in FIG. 32A, a silicon oxide film 95 is formed on the polycrystalline silicon film 91 by, e.g., low-pressure CVD.

Figure 32B:
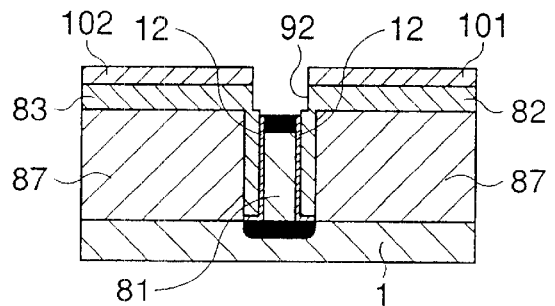

As shown in FIG. 32B, photolithography and dry etching are sequentially performed to process the silicon oxide film 95 and the polycrystalline silicon film 91 into a predetermined belt form on an element isolation insulating film 87 and form a trench 92 which exposes a portion of a gate oxide film 12 formed on the upper surface of a pillar projection 81 and divides the polycrystalline silicon film 91 on the pillar projection 81 via the gate oxide film 12. Consequently, gate electrodes 82 and 83 opposed to each other are formed from central portions of the side surfaces of the pillar projection 81 via the gate oxide film 12 to a silicon semiconductor substrate 1 near a lower portion of the pillar projection 81. Also, cap insulating films 101 and 102 of these gate electrodes are formed.

Subsequently, the structure is washed using HF for about 7 to 10 min to completely remove the gate oxide film 12 present on the bottom surface of the trench 92, thereby exposing a portion of the upper surface of the pillar projection 81, i.e., a portion of the surface of a drain 85.

Figure 32C:
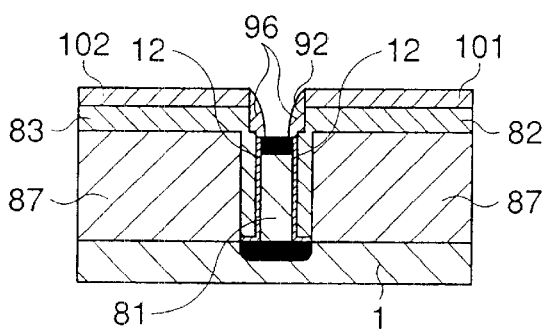

Then, as shown in FIG. 32C, an insulating film, in this modification a silicon nitride film, is formed on the entire surface including the interior of the trench 92 by low-pressure CVD. The entire surface of this silicon nitride film is anisotropically dry-etched to form side walls 96 covering the gate electrodes 82 and 83 including the side walls in a trench 72 and exposed side surfaces of the cap insulating films 101 and 102. In this structure, the polycrystalline silicon film 91 is completely covered with the cap insulating films 101 and 102 and the side walls 96.

Figure 32D:
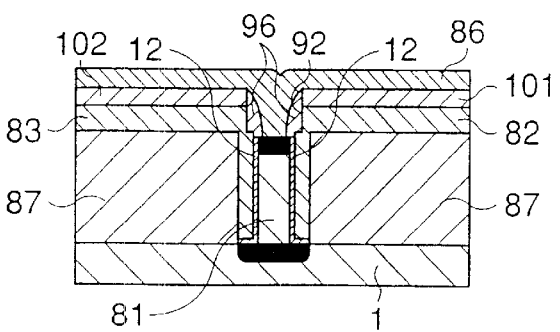

Next, as shown in FIG. 32D, a polycrystalline silicon film is formed by low-pressure CVD on the entire surface so as to bury the trench 92 via the side walls 96. Subsequently, photolithography and dry etching are sequentially performed to process this polycrystalline silicon film into the form of a belt substantially parallel to the gate electrodes 82 and 83 on the cap insulating films 101 and 102, thereby forming an interconnecting film 86 electrically connected to the drain 85 of the pillar projection 81 via the trench 94.

Finally, various steps of forming interconnecting lines and insulating interlayers are performed to complete the MOS transistor of the modification of the fifth embodiment.

This modification has the various effects achieved by the fifth embodiment described above. In addition, the side walls 96 allow the interconnecting film 86 to be accurately formed in a desired position while the interconnecting film 86 is reliably insulated from the gate electrodes 82 and 83 easily by self-alignment.

Sixth Embodiment

Figure 33:
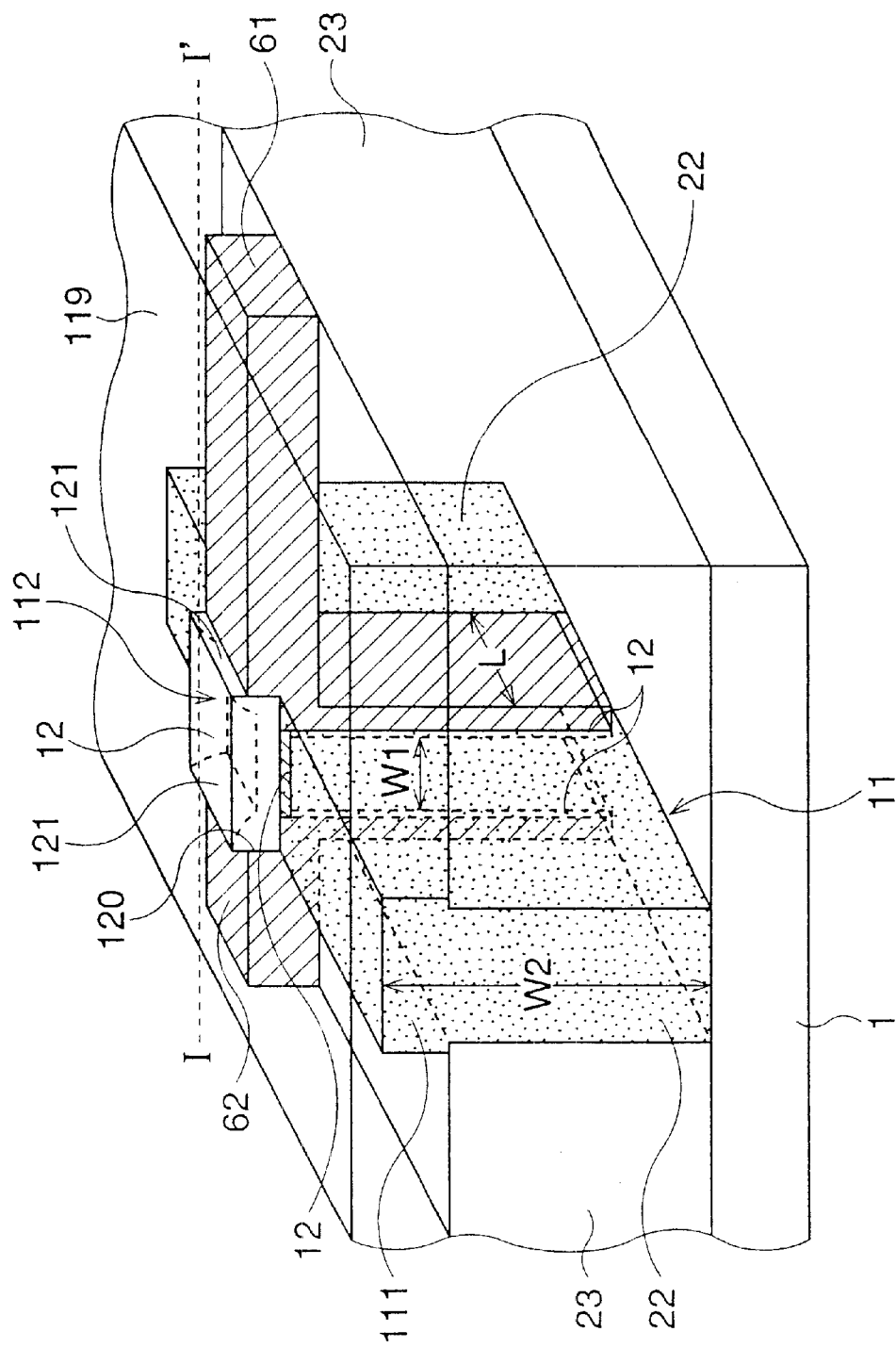
FIG. 33 is a schematic perspective view showing the major components of a MOS transistor according to the sixth embodiment of the present invention.

The sixth embodiment of the present invention will be described below. A MOS transistor of this sixth embodiment has substantially the same structure as the fourth embodiment except that the fabrication method, the shape of a pillar projection, and the shape of a gate electrode formed on the upper surface of the pillar projection are slightly different. FIG. 33 is a schematic perspective view showing the main parts of the MOS transistor of the sixth embodiment. FIGS. 34A to 34C, 35A to 35C, 36A, 36B, 37A, and 37B are schematic sectional views showing the major steps of a method of fabricating this MOS transistor in order. FIGS. 38A to 38D are schematic plan views showing predetermined steps to be described later. Note that the same reference numerals as in the fourth embodiment denote the same parts in the sixth embodiment.

In the MOS transistor of this sixth embodiment, a pillar projection 111 serving as a very thin active region is formed on the surface of a p-type silicon semiconductor substrate 1. A pair of gate electrodes 61 and 62 are opposed to each other to cover central portions of the two side surfaces of the pillar projection 111. A pair of impurity diffusion layers 22 are formed on the pillar projection 111 on the two sides of the gate electrodes 61 and 62. A gate electrode 112 is connected to the upper surface of the pillar projection 111 via a gate oxide film 12. An element isolation insulating film 23 is formed to bury the side surfaces of the pillar projection 111.

The pillar projection 111 has a narrow central portion about 0.1 $\mu$m wide and is formed by changing a polycrystalline silicon film, patterned into the shape of the pillar projection 111, into a single crystal by a heat treatment.

The gate electrodes 61 and 62 are made of a polycrystalline silicon film. The gate electrodes 61 and 62 are formed via the gate oxide film 12 formed from the narrow central portion of the pillar projection 111 to the silicon semiconductor substrate 1 near a lower portion of the pillar projection 111. These gate electrodes 61 and 62 are electrically isolated from each other and opposed to each other to extend in the form of a belt on the element isolation insulating film 23.

The gate electrode 112 is so formed as to bury a trench 120, which exposes the gate oxide film on the upper surface of the pillar projection 111, via side walls 121, and opposes the pillar projection 111 via the gate insulating film 12. This gate electrode 112 can also be arranged on the gate electrodes 61 and 62 via an insulating interlayer 73 so as to make an angle of about 45° with the extending direction of the gate electrodes 61 and 62.

The pair of impurity diffusion layers 22 are formed by ion-implanting an n-type impurity such as phosphorus (P) into the pillar projection 111 on the two sides of the gate electrodes 61 and 62. The impurity diffusion layers 22 function as the source and the drain of this MOS transistor.

The element isolation insulating film 23 is made of a silicon oxide film and so formed as to bury the side surfaces of the pillar projection 111. The element isolation insulating film 23 has a function of insulating the pillar projection 111 serving as an active region from the surroundings.

The MOS transistor of the sixth embodiment has first, second, and third transistors sharing the pair of impurity diffusion layers 22 and connected in parallel with each other. The first transistor is constituted by the gate electrode 61 formed on the side surface of the pillar projection 111 via the gate oxide film 12 and the impurity diffusion layer 22. The second transistor is constituted by the gate electrode 62 formed on the side surface of the pillar projection 111 via the gate oxide film 12 and the impurity diffusion layer 22. The third transistor is constituted by the gate electrode 112 formed on the upper surface of the pillar projection 111 via the gate oxide film 12 and the impurity diffusion layer 22.

In the first and second transistors, first and second channels are so formed as to oppose each other on the two side surfaces of the pillar projection 111 by defining the gate length of the gate electrodes 61 and 62 as L and the height of the pillar projection 111 as a channel width W2. In the third transistor, a third channel is formed on the upper surface of the pillar projection 111 by defining the gate length of the gate electrode 112 as L and the dimension in a direction substantially perpendicular to the longitudinal direction of the pillar projection 111 as a channel width W1.

In the MOS transistor of the sixth embodiment, as in the case of the fourth embodiment, it is unnecessary to form an element isolation insulating film in the silicon semiconductor substrate 1 because element isolation is performed by the element isolation insulating film 23. This realizes a high integration degree. Additionally, a plurality of (e.g., four) different conductances can be achieved with very high drivability like that of an SOI structure.

A method of fabricating the MOS transistor of the sixth embodiment will be described below with reference to FIGS. 34A to 34C, 35A to 35C, 36A, 36B, 37A, and 37B corresponding to a section shown in FIG. 33, and FIGS. 38A to 38D which are schematic plan views showing predetermined steps.

Figure 34A:
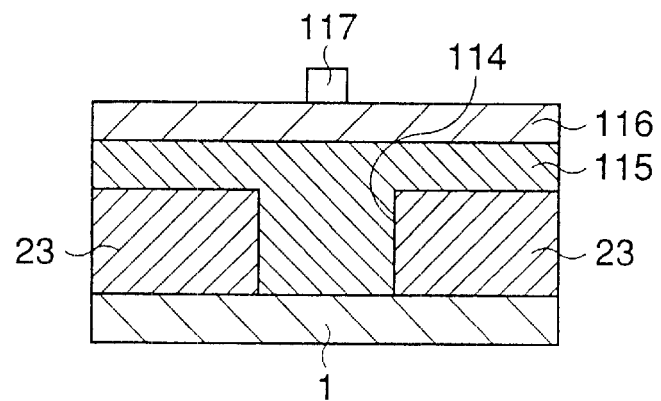
FIGS. 34A to 34C are schematic sectional views showing a method of fabricating the MOS transistor according to the sixth embodiment of the present invention in order of steps.

First, as shown in FIG. 34A, a silicon oxide film is formed on a p-type silicon semiconductor substrate 1 by, e.g., low-pressure CVD.

Subsequently, this silicon oxide film is patterned to form a trench 114 which exposes a portion of the surface of the silicon semiconductor substrate 1, and form an element isolation insulating film 23.

A polycrystalline silicon film 115 is formed by, e.g., low-pressure CVD on the element isolation insulating film 23 so as to bury the trench 114. The surface of this polycrystalline silicon film 115 is planarized by, e.g., chemical-mechanical polishing (CMP).

A silicon oxide film 116 is formed on the polycrystalline silicon film 115 by, e.g., low-pressure CVD.

Figure 38A:
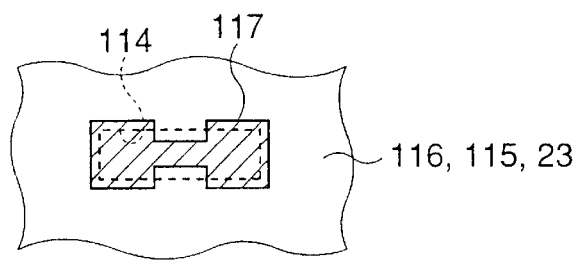
FIGS. 38A to 38D are schematic plan views showing the major steps of the method of fabricating the MOS transistor according to the sixth embodiment of the present invention in order.

Subsequently, the silicon oxide film 116 is coated with a photoresist, and the photoresist is processed to form a photo mask 117 by photolithography. As shown in FIG. 38A, this photo mask 117 has a substantially H shape so that its central portion is narrower than the trench 114 and the other portion is slightly wider than the trench 114 so as to ensure a margin of alignment between the trench 114 and the photo mask 117.

Figure 34B:
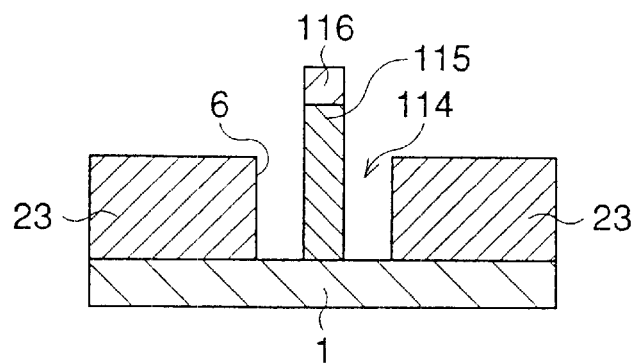
Figure 38B:
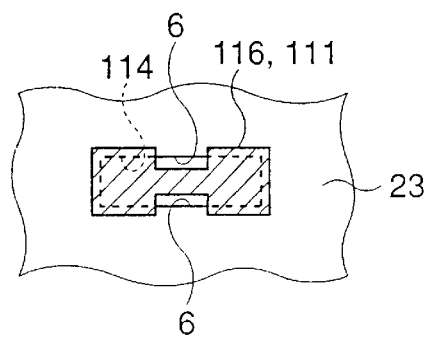

Next, as shown in FIGS. 34B and 38B, the photo mask 117 is used as an etching mask to dry-etch the silicon oxide film 116 and the polycrystalline silicon film 115. Consequently, on the silicon semiconductor substrate 1 in the trench 114, the polycrystalline silicon film 115 is so processed that its central portion is narrower than the trench 114 to form narrow gaps 6 between this portion and the side walls of the trench 114 and the other portion is slightly wider than the trench 114 to fill the trench 114. The silicon oxide film 116 is also processed to have the same H shape as the polycrystalline silicon film 115 as shown in FIG. 38B.

After the photo mask 117 is removed by ashing, the silicon semiconductor substrate 1 is heat-treated at a temperature of about 1000° C. to 1100° C. Consequently, the silicon semiconductor substrate 1 serves as a seed to change the polycrystalline silicon film 115 into single crystal, thereby forming a pillar projection 111.

Figure 34C:
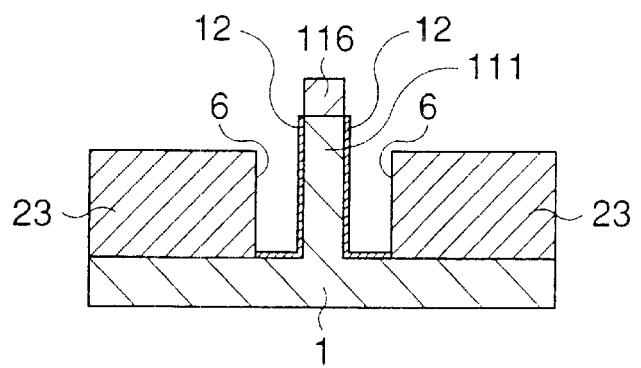

Next, as shown in FIG. 34C, thermal oxidation is performed in a predetermined oxygen ambient to form a gate insulating film 12 on the side surfaces of the pillar projection 111 and the surface of the silicon semiconductor substrate 1 exposed in the narrow gaps 6.

Figure 35A:
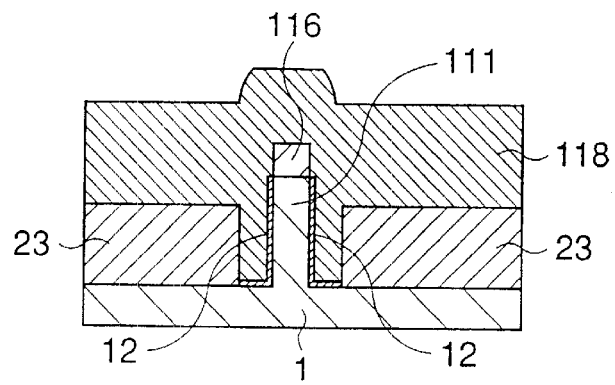
FIGS. 35A to 35C are schematic sectional views showing the method of fabricating the MOS transistor according to the sixth embodiment of the present invention in order of steps following the step shown in FIG. 34C.

As shown in FIG. 35A, a polycrystalline silicon film 118 is formed on the entire surface including the interiors of the narrow gaps 6 by, e.g., low-pressure CVD.

Figure 38C:
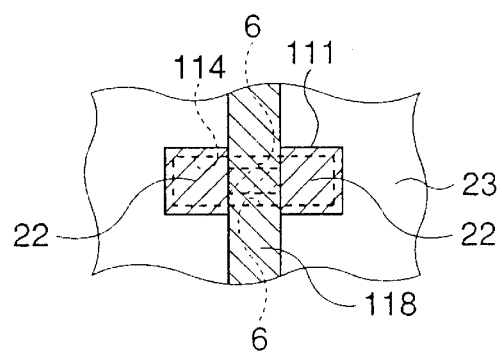

Subsequently, as shown in FIG. 38C, photolithography and dry etching are sequentially performed to process the polycrystalline silicon film 118 into the form of a belt extending in a direction approximately perpendicular to the longitudinal direction of the trench 114 including the narrow central portion of the pillar projection 111. Also, the silicon oxide film 116 existing on the two sides of the polycrystalline silicon film 118 is removed to expose the upper surface of the pillar projection 111.

The belt-like polycrystalline silicon film 118 and the underlying silicon oxide film 116 are used as masks to ion-implant an n-type impurity such as phosphorus into the pillar projection 111. Annealing is then performed to form a pair of impurity diffusion layers 22 serving as a source and a drain.

Figure 35B:
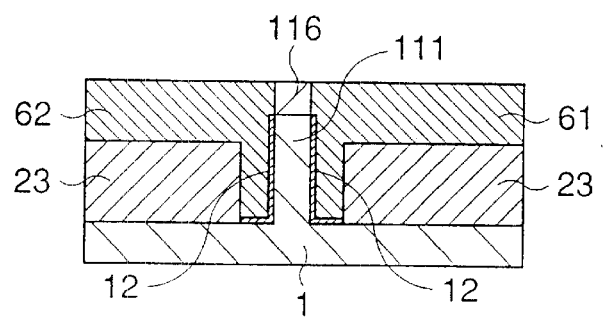
Figure 38D:
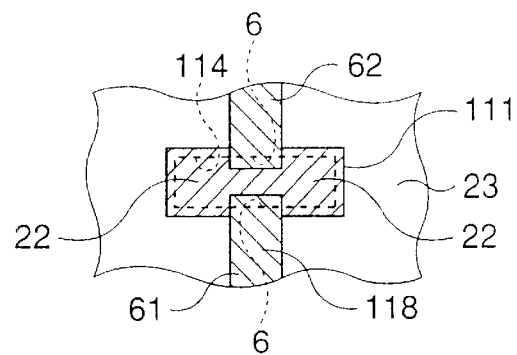

Next, as shown in FIGS. 35B and 38D, the silicon oxide film 116 is used as a stopper to polish the polycrystalline silicon film 118 by, e.g., chemical-mechanical polishing (CMP), dividing the polycrystalline silicon film 118 by the silicon oxide film 116 to form gate electrodes 61 and 62.

Figure 35C:
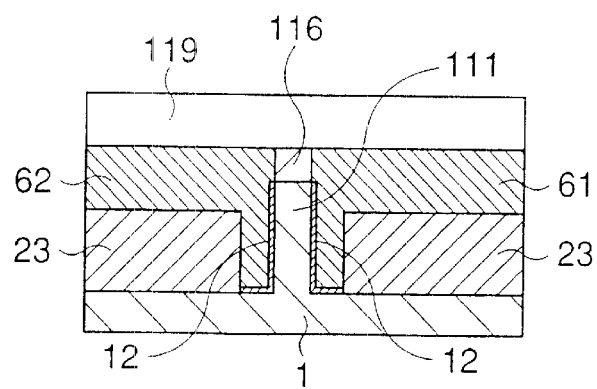

As shown in FIG. 35C, a silicon oxide film 119 is formed on the entire surface so as to bury the silicon oxide film 116, the gate electrodes 61 and 62, and the pillar projection 111. The surface of this silicon oxide film 119 is planarized by, e.g., chemical-mechanical polishing (CMP).

Figure 36A:
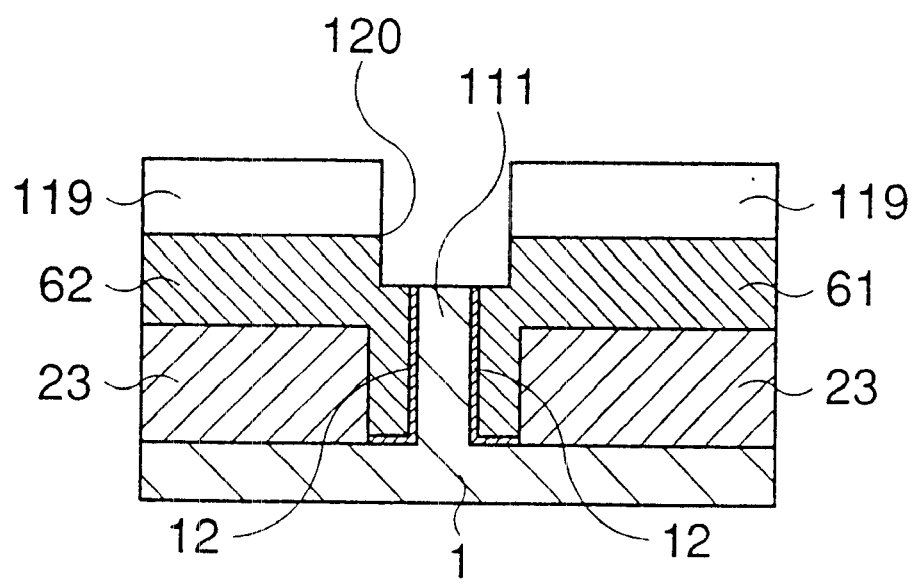
FIGS. 36A and 36B are schematic sectional views showing the method of fabricating the MOS transistor according to the sixth embodiment of the present invention in order of steps following the step shown in FIG. 35C.

Next, as shown in FIG. 36A, the upper surface in the central portion of the pillar projection 111 is used as a stopper to pattern portions of the silicon oxide film 119, the silicon oxide film 116, and the gate electrodes 61 and 62, thereby forming a trench 120.

Figure 36B:
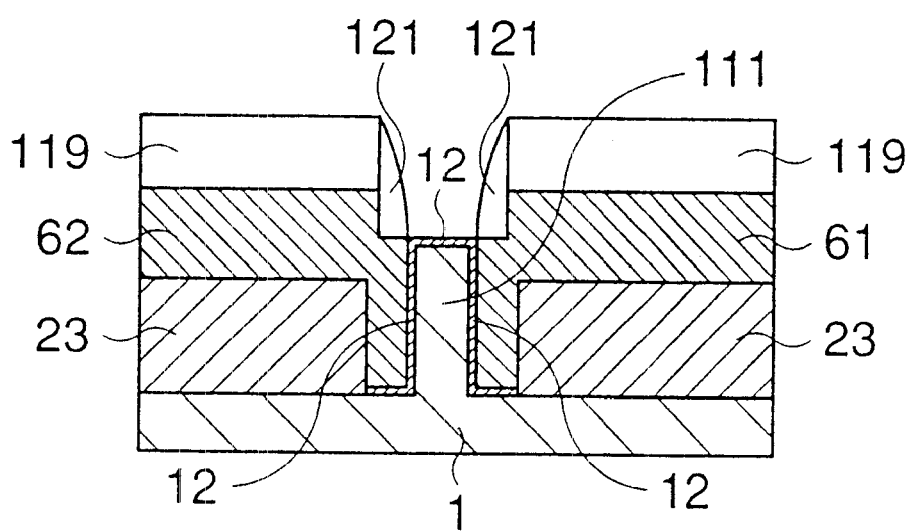

As shown in FIG. 36B, a silicon nitride film is formed on the entire surface including the trench 120, and the entire surface of this silicon nitride film is anisotropically dry-etched to form side walls 121 on the side surfaces of the gate electrodes 61 and 62 and the silicon oxide film 119 in the trench 120. Consequently, the gate electrodes 61 and 62 are completely covered with the silicon oxide film 119 and the side walls 121.

Subsequently, the inner walls of the trench 120 are thermally oxidized. If the gate oxide film 12 has been removed by the patterning performed when the trench 120 is formed as described above, a gate oxide film 12 is again formed on the upper surface of the pillar projection 111 by this thermal oxidation.

Figure 37A:
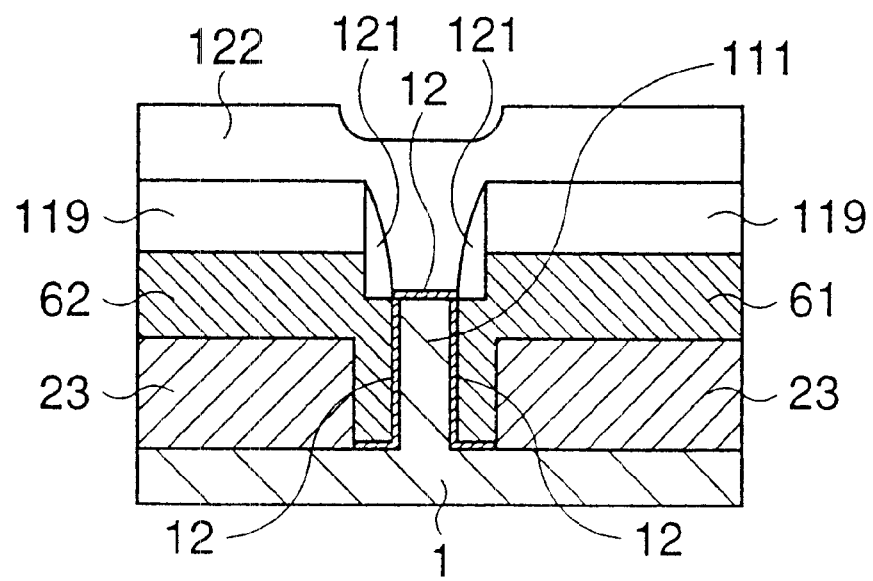
FIGS. 37A and 37B are schematic sectional views showing the method of fabricating the MOS transistor according to the sixth embodiment of the present invention in order of steps following the step shown in FIG. 36B.

Next, as shown in FIG. 37A, a polycrystalline silicon film 122 is formed on the entire surface including the interior of the trench 120 by, e.g., low-pressure CVD.

Figure 37B:
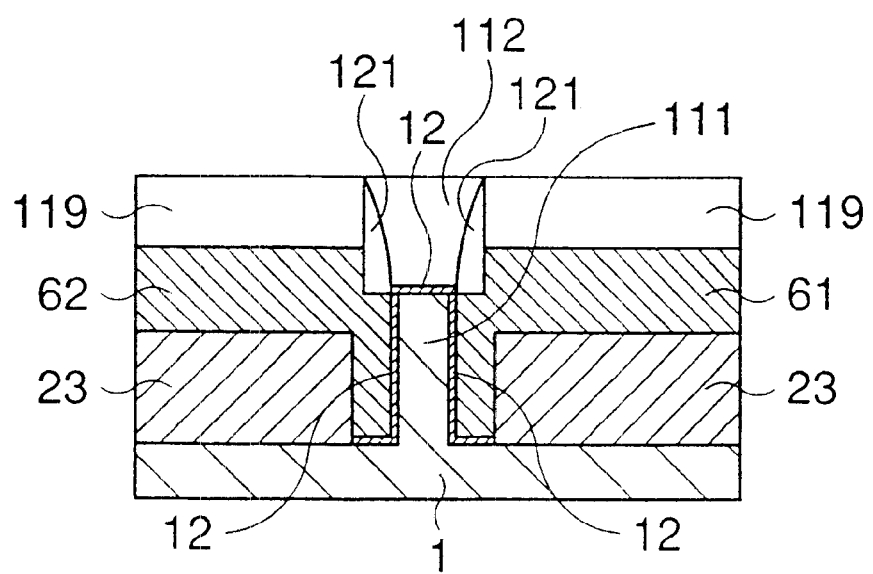

As shown in FIG. 37B, the silicon oxide film 119 is used as a stopper to polish the polycrystalline silicon film 122 by, e.g., chemical-mechanical polishing (CMP), forming a gate electrode 112 which fills the trench 120. Although not shown, it is also possible by patterning the polycrystalline silicon film 122 to form a belt-like gate electrode 112 which fills the trench 120 via the gate insulating film 12 and makes an angle of about 45° with the extending direction of the gate electrodes 61 and 62.

Finally, various steps of forming interconnecting lines and insulating interlayers are performed to complete the MOS transistor of the sixth embodiment.

In the fabrication method of this sixth embodiment, the pillar projection 111 made of single-crystal silicon can be easily formed from the polycrystalline silicon film 115 without processing the silicon semiconductor substrate 1. In addition, the side walls 76 allow the gate electrode 63 to be accurately formed in a desired position while the gate electrode 63 is reliably insulated from the gate electrodes 61 and 62 easily by self-alignment.

Several modifications of the MOS transistor according to the sixth embodiment will be described below. Note that the same reference numerals as in the MOS transistors of the fourth embodiment and the like denote the same parts in these modifications, and a detailed description thereof will be omitted.

First Modification

Figure 39A:
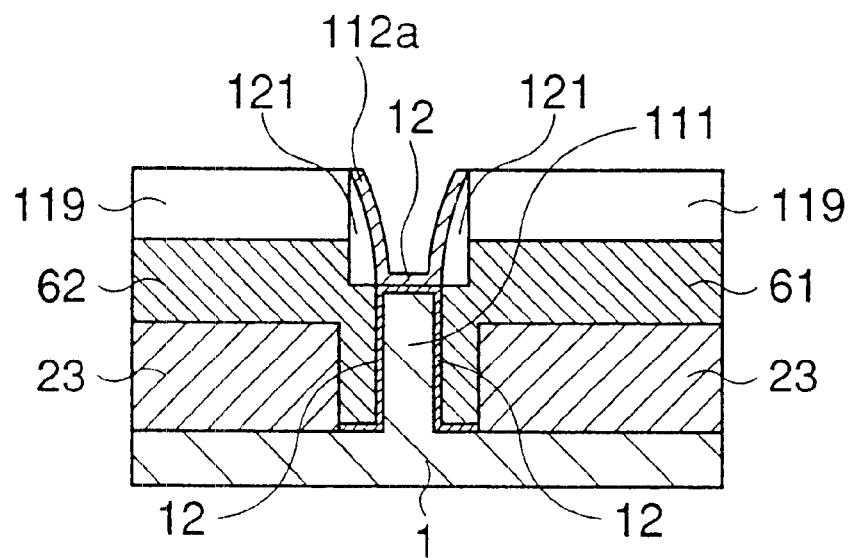
FIGS. 39A and 39B are schematic sectional views showing the main parts of an EEPROM according to a modification of the sixth embodiment of the present invention.
Figure 39B:
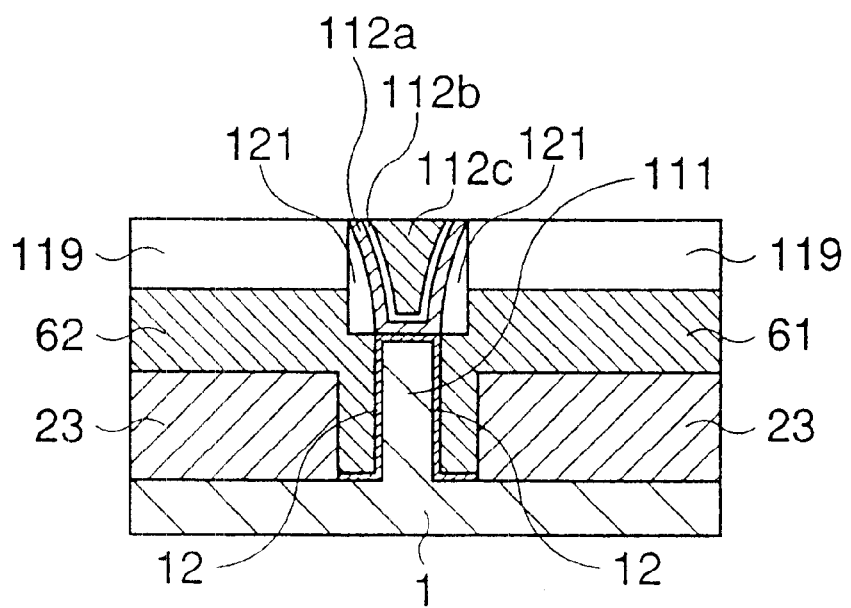

The first modification will be described below. A semiconductor device of this first modification has substantially the same structure as the MOS transistor of the sixth embodiment. However, this semiconductor device is a semiconductor memory, a so-called EEPROM, in which a gate electrode is constituted by two conductive films formed via a capacitance insulating film. In this modification, the structure and the fabrication method of the EEPROM will be described. FIGS. 39A and 39B are schematic sectional views, taken along a broken line I–I' in FIG. 33 of the sixth embodiment, showing the major steps of the fabrication method of this MOS transistor in order.

First, the steps shown in FIGS. 34A to 34C and 35A to 35C and the subsequent steps shown in FIGS. 36A and 36B in the sixth embodiment are performed. Thereafter, as shown in FIG. 39A, a phosphorus-doped or nondoped polycrystalline silicon film is formed by low-pressure CVD on an insulating interlayer 119 so as to cover the bottom surface of a trench 120 and the side surfaces of side walls 121 and have a predetermined thickness smaller than the half width of the bottom surface of the trench 120. Subsequently, the polycrystalline silicon film on the insulating interlayer 119 is removed by chemical-mechanical polishing (CMP). Consequently, the polycrystalline silicon film so remains as to cover only the bottom surface of the trench 120 and the side surfaces of the sidewalls 121, forming an island floating gate electrode 112a.

Next, as shown in FIG. 39B, a silicon oxide film, a silicon nitride film, and a silicon oxide film are sequentially formed by CVD to cover the floating gate electrode 112a in the trench 120 and patterned to form a capacitance insulating film 112b as an ONO film. A phosphorus-doped or nondoped polycrystalline silicon film is then formed by low-pressure CVD on the entire surface so as to bury the trench 120 and oppose the floating gate electrode 112a on the bottom surface of the trench 120 via the capacitance insulating film 112b. Subsequently, the polycrystalline silicon film on the insulating interlayer 119 is removed by chemical-mechanical polishing (CMP) to form a control gate electrode 112c which fills the trench 120 and opposes the floating gate electrode 112a in the trench 120 via the capacitance insulating film 112b.

Finally, a pair of impurity diffusion layers 22 functioning as a source and a drain are formed, and various steps of forming interconnecting lines and insulating interlayers are preformed to complete the EEPROM of this modification.

That is, in this EEPROM as shown in FIG. 39B, the gate electrode 112 is constituted by the floating gate electrode 112a, the capacitance insulating film 112b covering the surface of this floating gate electrode 112a, and the control gate electrode 112c opposing the floating gate electrode 112a via the capacitance insulating film 112b in the structure of the MOS transistor of the sixth embodiment described above. In the EEPROM of the first modification, a memory cell is constituted by the gate electrode 112 and the pair of impurity diffusion layers 22, and this makes writes and reads of storage information feasible.

The floating gate electrode 112a is so formed as to cover only the wall surfaces of the side walls 121 in the trench 120 which exposes a portion of the gate oxide film 12 on the upper surface of the pillar projection 111. On the bottom surface of the trench 120, the floating gate electrode 112a opposes the upper surface of the pillar projection 111 via the gate oxide film 12. The gate oxide film 12 functions as a so-called tunnel insulating film.

The control gate electrode 112c fills the trench 120 via the capacitance insulating film 112b formed on the surface of the floating gate electrode 112a and opposes the floating gate electrode 112a on the bottom surface of the trench 120 and the wall surfaces of the side walls 121. The capacitance insulating film 112b is a so-called ONO film having a three-layered structure including a silicon oxide film, a silicon nitride film, and a silicon oxide film.

In the EEPROM of this modification, as in the MOS transistor of the sixth embodiment, it is unnecessary to form an element isolation insulating film in the silicon semiconductor substrate 1 because element isolation is performed by the element isolation insulating film 23. This realizes a high integration degree. Additionally, a plurality of (e.g., four) different conductances can be achieved with very high drivability like that of an SOI structure. Consequently, a large storage capacity can be realized with a small occupied area.

Note that this EEPROM can also be constituted as a so-called multi-valued memory by setting a predetermined value of two bits or more as a storage state. That is, if the storage state is n bits (n is an integer of 2 or more), it is only necessary to set $2^n$ different threshold voltages. For example, if the storage state is two bits, four different threshold voltages are used in a one-to-one correspondence with storage states "00", "01", "10", and "11". In a read, one storage state of each memory cell of the EEPROM is specified from the four threshold voltages by a predetermined determining operation. In addition to the various effects described earlier, this multi-valued EEPROM greatly increases the storage density of each memory cell. Therefore, the EEPROM can well meet demands for a higher integration degree and a finer structure.

Note also that in the sixth embodiment, a DRAM can be constituted by forming a memory capacitor adjacent to the gate electrodes 61, 62, and 112 as in the third modification of the fourth embodiment.

Seventh Embodiment

Figure 40:
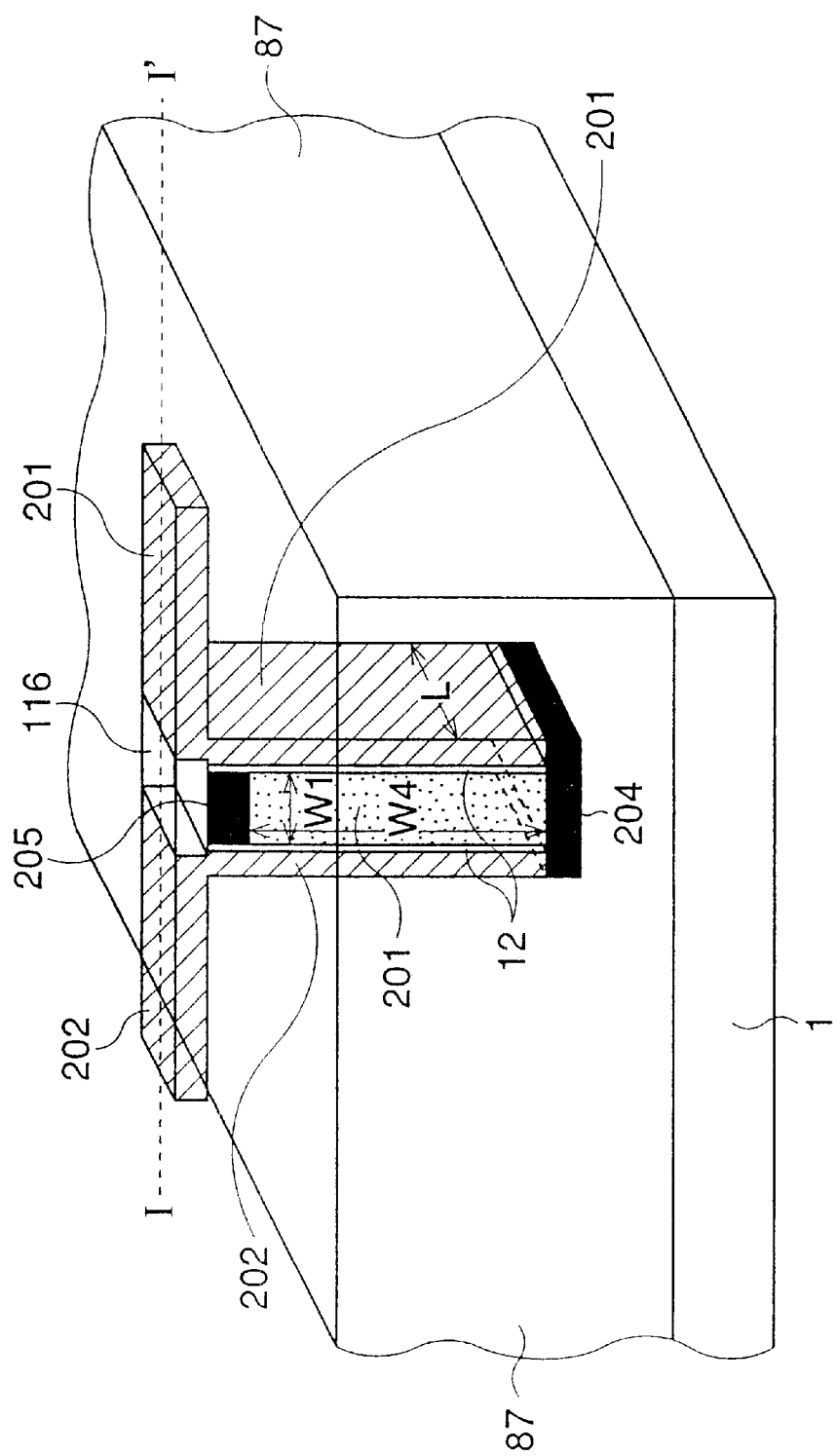
FIG. 40 is a schematic perspective view showing the major components of a MOS transistor according to the seventh embodiment of the present invention.

The seventh embodiment will be described below. A MOS transistor of this seventh embodiment has substantially the same structures as the third and fifth embodiments, but its fabrication method is slightly different. FIG. 40 is a schematic perspective view showing the main parts of the MOS transistor of the seventh embodiment. FIGS. 41A to 41C, 42A to 42C, and 43 are schematic sectional views showing the major steps of the method of fabricating this MOS transistor in order. Note that the same reference numerals as in the third and fifth embodiments denote the same parts in the seventh embodiment.

In the MOS transistor of this seventh embodiment, a pillar projection 201 serving as a very thin active region is formed on the surface of a p-type silicon semiconductor substrate 1. A pair of gate electrodes 202 and 203 are so formed as to cover the two side surfaces in a central portion of the pillar projection 201. A source 204 as one impurity diffusion layer is formed in the silicon semiconductor substrate 1 below the pillar projection 201. A drain 205 as the other impurity diffusion layer is formed on the pillar projection 201. An element isolation insulating film 87 is formed to bury the side surfaces of the pillar projection 201.

The gate electrodes 202 and 203 are made of a polycrystalline silicon film. The gate electrodes 202 and 203 cover the pillar projection 201 via a gate oxide film 12 formed from the side surfaces in the central portion of the pillar projection 201 to the silicon semiconductor substrate 1 near a lower portion of the pillar projection 201. That is, the gate electrodes 202 and 203 are so patterned as to oppose the side surfaces of the pillar projection 201 and the nearby silicon semiconductor substrate 1 via the gate oxide film 12.

The pillar projection 201 is so processed that the dimension in the longitudinal direction is substantially equal to a gate length L. This pillar projection 201 is formed by changing a polycrystalline silicon film, patterned into the shape of the pillar projection 201, into a single crystal by a heat treatment.

The source 204 as one impurity diffusion layer is formed by ion-implanting an n-type impurity such as phosphorus (P) into the surface region of the silicon semiconductor substrate 1 below the pillar projection 201. The drain 205 as the other impurity diffusion layer is formed by ion-implanting an n-type impurity such as phosphorus (P) into the upper surface of the pillar projection 201. The source 204 and the drain 205 are shared by the gate electrodes 201 and 202.

The element isolation insulating film 87 is made of a silicon oxide film and so formed as to cover and bury the pillar projection 201. The element isolation insulating film 87 has a function of insulating the pillar projection 201 serving as an active region from the surroundings.

In the MOS transistor of the seventh embodiment, two channels are formed from the gate electrodes 202 and 203 and the pillar projection 201 as will be described below. That is, first and second channels are so formed as to oppose each other on the two side surfaces of the pillar projection 201 by defining the dimension in a direction substantially perpendicular to the longitudinal direction of the gate electrodes 202 and 203 as the gate length L and the height from the silicon semiconductor substrate 1 to the lower surface of the drain 205 as a channel width W4.

A thickness W1 of the pillar projection 201 defines the thickness of a depletion layer of a transistor formed by the first and second channels. This results in a behavior equivalent to that of a two-gate transistor structure in an SOI structure. If the thickness W1 is made very small, e.g., about 0.15 µm or less, the first and second channels are completely depleted. That is, in this MOS transistor it is unnecessary to form an element isolation insulating film in the silicon semiconductor substrate 1 because element isolation is performed by the element isolation insulating film 87. This readily achieves a very high integration degree. Additionally, the pillar projection 201 and the silicon semiconductor substrate 1 are integrally formed. Therefore, very high drivability like that of an SOI structure is achieved although the active region is fixed to the substrate potential.

A method of fabricating the MOS transistor of the seventh embodiment will be described below with reference to FIGS. 41A to 43 corresponding to a section taken along a broken line I–I' in FIG. 40.

Figure 41A:
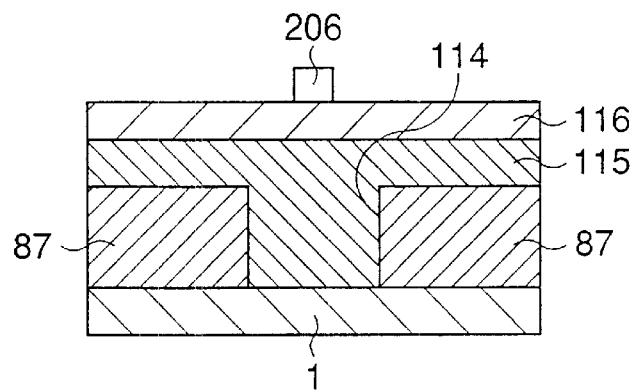
FIGS. 41A to 41C are schematic sectional views showing a method of fabricating the MOS transistor according to the seventh embodiment of the present invention in order of steps.

First, as shown in FIG. 41A, a silicon oxide film is formed on a p-type silicon semiconductor substrate 1 by, e.g., low-pressure CVD.

Subsequently, this silicon oxide film is patterned to form a trench 114 which exposes a portion of the surface of the silicon semiconductor substrate 1, and form an element isolation insulating film 87.

A polycrystalline silicon film 115 is formed by, e.g., low-pressure CVD on the element isolation insulating film 87 so as to bury the trench 114. The surface of this polycrystalline silicon film 115 is planarized by, e.g., chemical-mechanical polishing (CMP).

A silicon oxide film 116 is formed on the polycrystalline silicon film 115 by, e.g., low-pressure CVD.

Subsequently, the silicon oxide film 116 is coated with a photoresist, and the photoresist is processed to form a photo mask 206 by photolithography. This photo mask 206 is so processed that the dimension in the longitudinal direction is substantially equal to the gate length L.

Figure 41B:
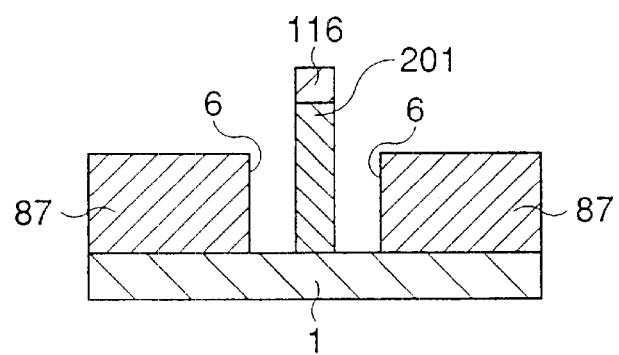

Next, as shown in FIG. 41B, the photo mask 206 is used as an etching mask to dry-etch the silicon oxide film 116 and the polycrystalline silicon film 115. Consequently, on the silicon semiconductor substrate 1 in the trench 114, the silicon oxide film 116 and the polycrystalline silicon film 115 are so processed that these films are narrower than the trench 114 and narrow gaps 6 are formed between these films and the side walls of the trench 114.

After the photo mask 206 is removed by ashing, the silicon semiconductor substrate 1 is heat-treated at a temperature of about 1000° C. to 1100° C. Consequently, the silicon semiconductor substrate 1 serves as a seed to change the polycrystalline silicon film 115 into a single crystal, thereby forming a pillar projection 201.

Figure 41C:
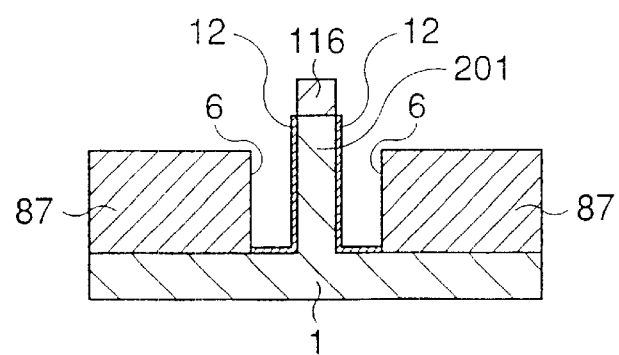

Subsequently, as shown in FIG. 41C, thermal oxidation is performed in a predetermined oxygen ambient to form a gate insulating film 12 on the side surfaces of the pillar projection 201 and the surface of the silicon semiconductor substrate 1 exposed in the narrow gaps 6.

Figure 42A:
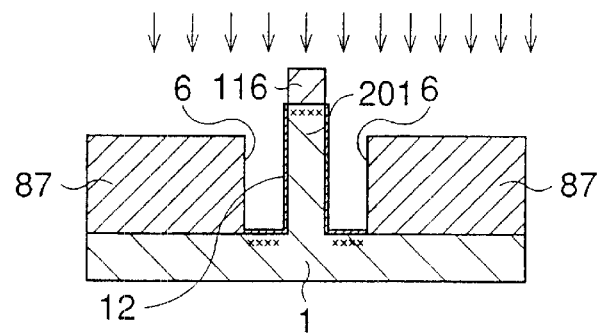
FIGS. 42A to 42C are schematic sectional views showing the method of fabricating the MOS transistor according to the seventh embodiment of the present invention in order of steps following the step shown in FIG. 41C.

After that, as shown in FIG. 42A, the element isolation insulating film 87 is used as a mask to perform first ion-implantation of an n-type impurity. More specifically, an n-type impurity such as phosphorus (P) is ion-implanted under the conditions by which the n-type impurity passes through the silicon oxide film 116 and is doped into the upper surface region of the pillar projection 201 immediately below the silicon oxide film 116. This n-type impurity is doped into the upper surface region and the surface region of the silicon semiconductor substrate 1 at a predetermined depth from the bottom surfaces of the narrow gaps 6.

Figure 42B:
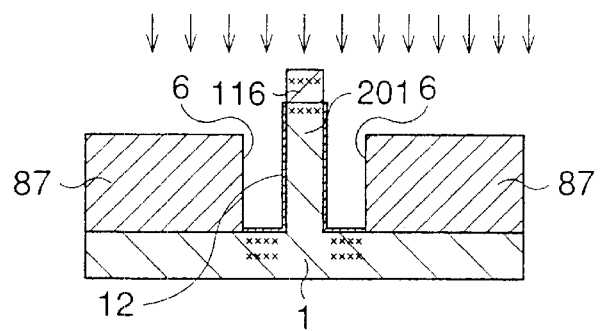

Next, as shown in FIG. 42B, the element isolation insulating film 87 is used as a mask to perform second ion-implantation of an n-type impurity. More specifically, as in the first ion implantation, an n-type impurity such as phosphorus is ion-implanted under the predetermined conditions by which the n-type impurity does not passes through the silicon oxide film 116. As a consequence, the n-type impurity stops in the silicon oxide film 116 without being doped into the upper surface region and is doped into the surface region of the silicon semiconductor substrate 1 at a predetermined depth, smaller than that in the first ion implantation, from the bottom surfaces of the narrow gaps 6.

Subsequently, the silicon semiconductor substrate is heat-treated at a predetermined temperature to form a source 204 as one diffusion layer in the surface region of the silicon semiconductor substrate 1 below the bottom surfaces of the narrow gaps 6 and a drain 205 as the other diffusion layer in the upper surface region of the pillar projection 201.

Figure 42C:
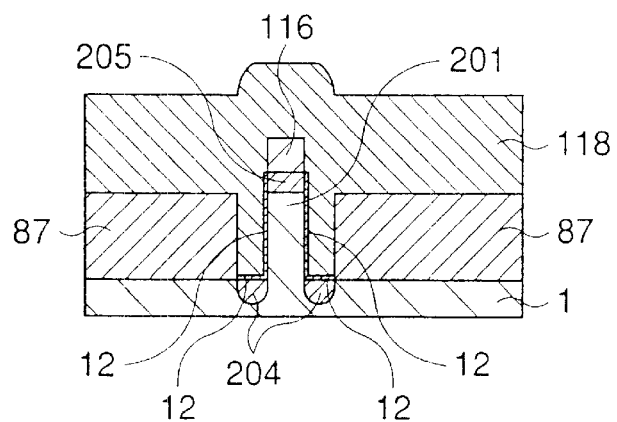

Next, as shown in FIG. 42C, a polycrystalline silicon film 118 is formed on the entire surface including the interiors of the narrow gaps 6 by, e.g., low-pressure CVD.

Subsequently, photolithography and dry etching are sequentially performed to process the polycrystalline silicon film 118 into the form of a belt extending in a direction nearly perpendicular to the longitudinal direction of the pillar projection 201.

Figure 43:
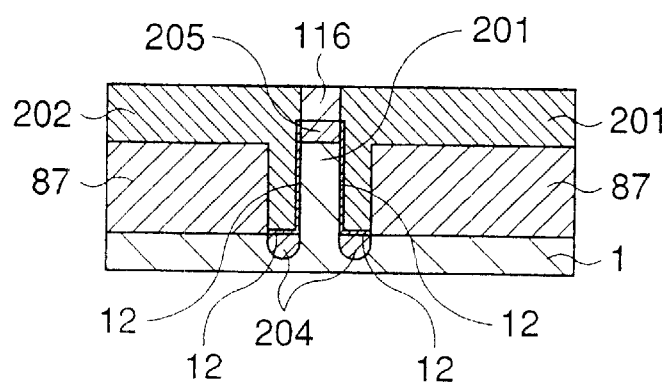
FIG. 43 is a schematic sectional view showing the method of fabricating the MOS transistor according to the seventh embodiment of the present invention following the step shown in FIG. 42C.

Next, as shown in FIG. 43, the silicon oxide film 116 is used as a stopper to polish the polycrystalline silicon film 118 by, e.g., chemical-mechanical polishing (CMP), dividing the polycrystalline silicon film 118 by the silicon oxide film 116 to form gate electrodes 202 and 203.

Finally, various steps of forming interconnecting lines and insulating interlayers are performed to complete the MOS transistor of the seventh embodiment.

In the fabrication method of this seventh embodiment, the pillar projection 201 made of single-crystal silicon can be easily formed from the polycrystalline silicon film 115 without processing the silicon semiconductor substrate 1.

Figure 44:
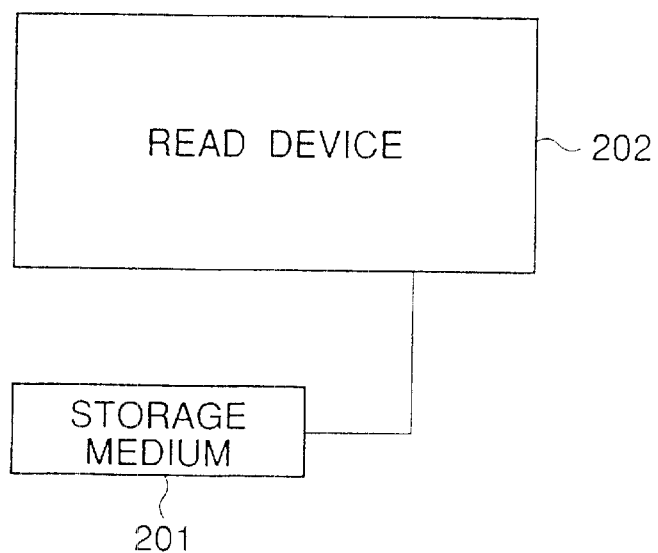
FIG. 44 is a block diagram showing a regenerative memory and a storage medium used to perform read and write operations to an EEPROM.

Note that the present invention includes program codes for operating various devices to realize functions of methods of writing and reading the EEPROMs explained in the first, second, fourth, and sixth embodiments and their several modifications, and also includes a means for supplying the program codes to a computer, e.g., a storage medium storing the program codes. As shown in FIG. 44, an example of this storage medium is a storage medium 201 for realizing individual steps of the write and read methods.

In this configuration, a read device 202 reads out program codes stored in the storage medium 201 and operates the EEPROM. Examples of the storage medium for storing the program codes are a floppy disk, a hard disk, an optical disk, a magneto-optical disk, a CD-ROM, a magnetic tape, a nonvolatile memory, and a ROM.

Furthermore, besides the aforesaid functions according to the above embodiments are realized by executing the program codes which are read by a computer, the present invention includes a case where an OS (Operating System) or the like running on the computer performs a part or entire processes in accordance with instructions of the program codes and realizes functions according to the above embodiments.

Furthermore, the present invention also includes a case where, after the program codes read from the storage medium are written in a function extension board which is inserted into the computer or in a memory provided in a function extension unit which is connected to the computer, CPU or the like contained in the function extension board or unit performs a part or entire process in accordance with designations of the program codes and realizes functions of the above embodiments.

A method of writing storage information when the EEPROM described above is a multi-valued memory capable of storing 2-bit information in each memory cell will be described below. First, to write storage information "11", the drain of the impurity diffusion layers 22 of a memory cell is connected to the ground potential, the source is opened, and a voltage of about 22 V is applied to the control gate electrode 25c (63c, 112c). Consequently, electrons are injected from the drain into the floating gate electrode 25a (63a, 112a) through the gate oxide film 12, and the threshold voltage ($V_T$) goes positive. Accordingly, the threshold voltage of the memory cell rises to about 4 V. This storage state is "11".

To write data "10", the drain of the memory cell is connected to the ground potential, the source is opened, and a voltage of about 20 V is applied to the control gate electrode 25c (63c, 112c). Consequently, electrons are injected from the drain into the floating gate electrode 25a (63a, 112a) through the gate oxide film 12, and the threshold voltage of the memory cell changes to about 3 V. This storage state is "10".

To write data "01", the drain of the memory cell is connected to the ground potential, the source is opened, and a voltage of about 18 V is applied to the control gate electrode 25c (63c, 112c). Consequently, electrons are injected from the drain into the floating gate electrode 25a (63a, 112a) through the gate oxide film 12, and the threshold voltage of the memory cell changes to about 2 V. This storage state is "01".

To write data "00", the drain of the memory cell is connected to the ground potential, the source is opened, and a voltage of about 10 V is applied to the control gate electrode 25c (63c, 112c). Consequently, the electrons injected into the floating gate electrode 25a (63a, 112a) are cleared from the drain, and the threshold voltage of the memory cell changes to about 1 V. This storage state is "00".

Figure 45:
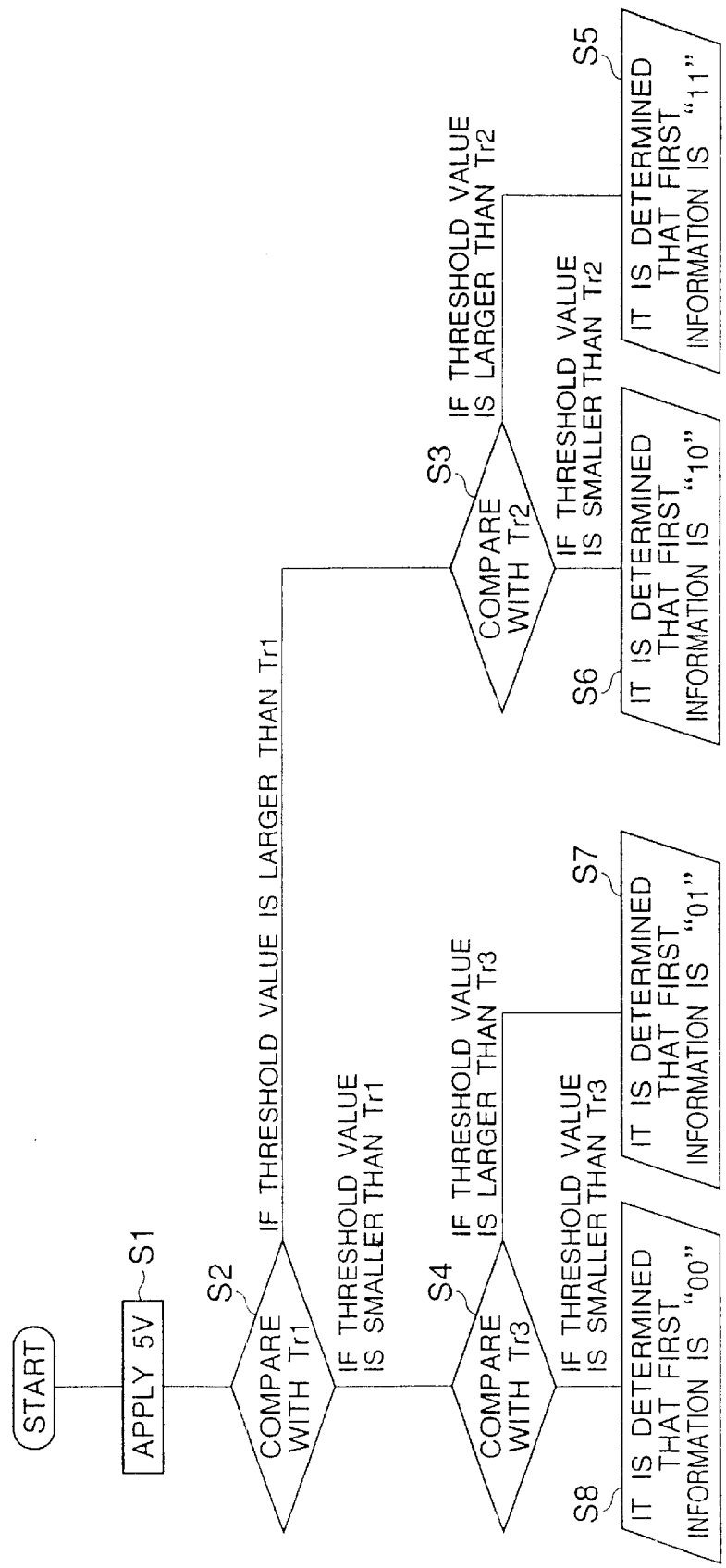
FIG. 45 is a flow chart showing steps of determining and reading out storage information by using a multi-valued EEPROM.

Individual steps of a read method when the EEPROM described above is a multi-valued memory capable of storing 2-bit information in each memory cell will be described below with reference to FIG. 45. First, whether the upper bit of storage information stored in a memory cell is "0" or "1" is checked. To this end, a voltage of about 5 V is applied to the source and the drain (the pair of impurity diffusion layers 22) and the control gate electrode 25c (63c, 112c) (step S1). The drain current is detected by a sense amplifier, and the threshold voltage $V_T$ is compared with the threshold voltage of a comparative transistor Tr1 (step S2). If the threshold voltage $V_T$ is larger than the threshold voltage of the transistor Tr1, it is determined that the upper bit is "1". If the current of the transistor Tr1 is smaller, it is determined that the upper bit is "0".

If the threshold voltage $V_T$ is larger than the threshold voltage of the transistor Tr1, a similar read is performed by using a transistor Tr2, and the current flowing through the memory cell is compared with the current flowing through the transistor Tr2 (step S3). If the threshold voltage $V_T$ is smaller than the threshold voltage of the transistor Tr1, a similar read is performed by using a transistor Tr3 (step S4).

If the threshold voltage $V_T$ is larger than the threshold voltage of the transistor Tr2 in the read performed in step S3, it is determined that the storage information stored in the memory cell is "11" (step S5), and the information is read out from the memory cell. On the other hand, if the threshold voltage $V_T$ is smaller than the threshold voltage of the transistor Tr2 in step S3, it is determined that the storage information stored in the memory cell is "10" (step S6), and the information is read out from the memory cell.

If the threshold voltage of the memory cell is larger than the threshold voltage of the transistor Tr3 in step S4, it is determined that the storage information stored in the memory cell is "01" (step S7), and the information is read out from the memory cell. If the threshold voltage $V_T$ is smaller than the threshold voltage of the transistor Tr3 in step S4, it is determined that the storage information stored in the memory cell is "00" (step S8), and the information is read out from the memory cell.

What is claimed is:

1. A method of fabricating a semiconductor device, comprising:

the first step of forming a first insulating film having a low etching rate on a semiconductor substrate;

the second step of processing said first insulating film and said semiconductor substrate to form a pillar projection having a predetermined width on a surface of said semiconductor substrate;

the third step of forming a second insulating film only on side surfaces of said pillar projection and said first insulating film;

the fourth step of forming a third insulating film having an enough thickness to bury said pillar projection and said first insulating film and polishing said third insulating film by using said first insulating film as a stopper;

the fifth step of partially removing said second and third insulating films together with said first insulating film;

the sixth step of forming narrow gaps by selectively removing portions of said second insulating film, thereby exposing portions of the two side surfaces of said pillar projection and portions of the surface of said semiconductor substrate near said pillar projection;

the seventh step of forming a fourth insulating film covering inner walls of said narrow gaps;

the eighth step of forming a conductive film on said third insulating film so as to bury said narrow gaps via said fourth insulating film and processing said conductive film into a predetermined shape; and the ninth step of doping an impurity into said pillar projection to form a pair of diffusion regions on two sides of said conductive film.

2. A method according to claim 1, further comprising, after the sixth step:

the tenth step of ion-implanting oxygen into an entire surface and performing a heat treatment to form an oxide layer, which divides said pillar projection into upper and lower portions, in a predetermined portion of said pillar projection, wherein a portion of said pillar projection above said buried insulating layer is electrically isolated from said semiconductor substrate.

3. A method according to claim 1, wherein the eighth step comprises the steps of:

processing said conductive film into an island shape on said third insulating film by burying said narrow gaps via said fourth insulating film;

forming a fifth insulating film so as to cover a surface of said conductive film;

forming a second conductive film so as to cover said conductive film via said fifth insulating film and processing said second conductive film and said fifth insulating film into a predetermined shape; and forming a floating gate electrode made of said conductive film and a control gate electrode which opposes said floating gate electrode via a capacitance insulating film made of said fifth insulating film and which is made of said second conductive film.

4. A method according to claim 1, further comprising, after the ninth step:

the eleventh step of forming a capacitor electrode opposing one of said pair of diffusion regions via a capacitance insulating film.

5. A method according to claim 1, wherein a thickness of said pillar projection is less than 0.15 $\mu$m in the second step.

6. A method according to claim 2, wherein the oxygen ion implantation is performed in the tenth step to obtain less than 0.1 $\mu$m as a height of the portion of said pillar projection above said buried insulating layer.

7. A method of fabricating a semiconductor device, comprising:

the first step of forming a first insulating film having a low etching rate on a semiconductor substrate;

the second step of processing said first insulating film and said semiconductor substrate to form a pillar projection having a predetermined width on a surface of said semiconductor substrate;

the third step of forming a second insulating film only on side surfaces of said pillar projection and said first insulating film;

the fourth step of forming a third insulating film having an enough thickness to bury said pillar projection and said first insulating film and polishing said third insulating film by using said first insulating film as a stopper;

the fifth step of partially removing said second and third insulating films together with said first insulating film;

the sixth step of forming narrow gaps by selectively removing portions of said second insulating film, thereby exposing portions of the two side surfaces of said pillar projection and portions of the surface of said semiconductor substrate near said pillar projection;

the seventh step of forming a fourth insulating film covering inner walls of said narrow gaps;

the eighth step of forming a first conductive film on said third insulating film so as to bury said narrow gaps via said fourth insulating film and processing said first conductive film into a predetermined shape;

the ninth step of forming a pair of diffusion regions by doping an impurity into said pillar projection by using said first conductive film as a mask;

the tenth step of processing said first conductive film to divide said first conductive film via said fourth insulating film on said pillar projection; and the eleventh step of forming, by patterning, a second conductive film opposing an upper surface of said pillar projection via said fourth insulating film and insulated from said first conductive film.

8. A method according to claim 7, wherein the eighth step comprises the steps of forming a fifth insulating film on said first conductive film and processing said first conductive film together with said fifth insulating film into a predetermined shape, the tenth step comprises the step of processing said fifth insulating film together with said first conductive film to form a trench, thereby dividing said first conductive film, and the eleventh step comprises the steps of forming a sixth insulating film on side walls of at least said first conductive film exposed in said trench and forming said second conductive film via said sixth insulating film.

9. A method according to claim 7, further comprising, after the eleventh step:

the twelfth step of forming a capacitor electrode opposing one of said pair of diffusion regions via a capacitance insulating film.

10. A method of fabricating a semiconductor device, comprising:

the first step of forming a first insulating film on a semiconductor substrate by patterning and forming a second insulating film so as to cover said first insulating film;

the second step of anisotropically etching an entire surface of said second insulating film to leave said second insulating film behind only on side surfaces of said first insulating film;

the third step of selectively removing only said first insulating film;

the fourth step of processing said semiconductor substrate by using said second insulating film as a mask, thereby forming a pillar projection having a predetermined width on a surface of said semiconductor substrate;

the fifth step of forming a third insulating film only on side surfaces of said pillar projection;

the sixth step of forming a fourth insulating film having an enough thickness to bury said pillar projection and said second insulating film and polishing said fourth insulating film by using said second insulating film as a stopper;

the seventh step of partially removing said third and fourth insulating films together with said second insulating film;

the eighth step of forming narrow gaps by selectively removing portions of said third insulating film, thereby exposing portions near the two side surfaces of said pillar projection and portions of the surface of said semiconductor substrate near the pillar projection;

the ninth step of forming a fifth insulating film covering inner walls of said narrow gaps;

the tenth step of forming a conductive film on said fourth insulating film so as to bury said narrow gaps via said fifth insulating film and processing said conductive film into a predetermined shape; and the eleventh step of forming a pair of diffusion regions by doping an impurity into said pillar projection by using said conductive film as a mask.

11. A method according to claim 10, further comprising, after the eighth step:

the twelfth step of ion-implanting oxygen into an entire surface and performing a heat treatment to form an oxide layer, which divides said pillar projection into upper and lower portions, in a predetermined portion of said pillar projection, wherein a portion of said pillar projection above said buried insulating layer is electrically isolated from said semiconductor substrate.

12. A method according to claim 10, wherein the tenth step comprises the steps of:

processing said conductive film into an island shape on said fourth insulating film by burying said narrow gaps via said fifth insulating film;

forming a sixth insulating film so as to cover a surface of said conductive film;

forming a second conductive film so as to cover said conductive film via said sixth insulating film and processing said second conductive film and said sixth insulating film into a predetermined shape; and forming a floating gate electrode made of said conductive film and a control gate electrode which opposes said floating gate electrode via a capacitance insulating film made of said sixth insulating film and which is made of said second conductive film.

13. A method according to claim 10, further comprising, after the eleventh step:

the thirteenth step of forming a capacitor electrode opposing one of said pair of diffusion regions via a capacitance insulating film.

14. A method of fabricating a semiconductor device, comprising:

the first step of forming a first insulating film having a low etching rate on a semiconductor substrate;

the second step of processing said first insulating film and said semiconductor substrate to form a pillar projection having a predetermined width on a surface of said semiconductor substrate;

the third step of forming a second insulating film only on side surfaces of said pillar projection and said first insulating film;

the fourth step of forming a third insulating film having an enough thickness to bury said pillar projection and said first insulating film and polishing said third insulating film by using said first insulating film as a stopper;

the fifth step of partially removing said second and third insulating films together with said first insulating film;

the sixth step of forming narrow gaps by selectively removing portions of said second insulating film, thereby exposing portions of the two side surfaces of said pillar projection and portions of the surface of said semiconductor substrate near said pillar projection;

the seventh step of forming a fourth insulating film covering inner walls of said narrow gaps;

the eighth step of doping an impurity into an entire surface to form diffusion layers in an upper surface region of said pillar projection and a surface region of said semiconductor substrate;

the ninth step of forming a first conductive film on said third insulating film so as to bury said narrow gaps via said fourth insulating film; and the tenth step of processing said first conductive film to divide said first conductive film.

15. A method according to claim 14, further comprising, after the sixth step and before the seventh step:

the eleventh step of removing an upper portion of said third insulating film, wherein the tenth step comprises the step of dividing said first conductive film by polishing said first conductive film by using an upper surface of said pillar projection as a stopper.

16. A method according to claim 14, further comprising, after the tenth step:

the twelfth step of forming a fifth insulating film covering said first conductive film;

the thirteenth step of processing said fifth and fourth insulating films to partially expose an upper surface of said pillar projection; and the fourteenth step of forming a second conductive film by patterning on said fifth insulating film including the exposed upper surface of said pillar projection and electrically connecting said second conductive film to said diffusion layer formed in the upper surface region of said pillar projection.

17. A method according to claim 14, wherein the ninth step comprises the step of forming a sixth insulating film on said first conductive film, and the tenth step comprises the step of processing said sixth insulating film together with said first conductive film to form a trench, thereby dividing said first conductive film, further comprising, after the tenth step:

the fifteenth step of forming a seventh insulating film on side walls of at least said first conductive film exposed in said trench; and the sixteenth step of forming a second conductive film by patterning on said sixth and seventh insulating films including the exposed upper surface of said pillar projection and electrically connecting said second conductive film to said diffusion layer formed in the upper surface region of said pillar projection.

18. A method of fabricating a semiconductor device comprising a gate, a source, and a drain, comprising:

the first step of forming a cap insulating film having a low etching rate on a semiconductor substrate;

the second step of processing said cap insulating film and said semiconductor substrate to form a pillar projection having a predetermined width on a surface of said semiconductor substrate;

the third step of forming a side-wall insulating film only on side surfaces of said pillar projection and said cap insulating film;

the fourth step of forming an element isolation insulating film having an enough thickness to bury said pillar projection and said cap insulating film and polishing said element isolation insulating film by using said cap insulating film as a stopper;

the fifth step of partially removing said side-wall insulating film and said element isolation insulating film together with said cap insulating film;

the sixth step of forming narrow gaps by selectively removing portions of said side-wall insulating film, thereby exposing portions of the two side surfaces of said pillar projection and portions of the surface of said semiconductor substrate near said pillar projection;

the seventh step of forming a gate insulating film covering inner walls of said narrow gaps;

the eighth step of forming a conductive film on said element isolation insulating film so as to bury said narrow gaps via said gate insulating film;

the ninth step of patterning said conductive film into a gate shape; and the tenth step of forming a source and a drain by doping an impurity into said pillar projection by using said conductive film as a mask.

19. A method according to claim 18, further comprising, after the sixth step:

the eleventh step of ion-implanting oxygen into an entire surface and performing a heat treatment to form an oxide layer, which divides said pillar projection into upper and lower portions, in a predetermined portion of said pillar projection, wherein a portion of said pillar projection above said buried insulating layer is electrically isolated from said semiconductor substrate.

20. A method according to claim 18, wherein the eighth step comprises the steps of:

processing said conductive film into an island shape on said element isolation insulating film by burying said narrow gaps via said gate insulating film;

forming a capacitance insulating film so as to cover a surface of said conductive film;

forming a second conductive film so as to cover said conductive film via said capacitance insulating film and processing said second conductive film and said capacitance insulating film into a predetermined shape; and forming a floating gate electrode made of said conductive film and a control gate electrode which opposes said floating gate electrode via said capacitance insulating film and which is made of said second conductive film.

21. A method according to claim 18, further comprising, after the ninth step:

the twelfth step of forming a capacitor electrode opposing one of said source and drain via a capacitance insulating film.

22. A method of fabricating a semiconductor device comprising a semiconductor substrate and first, second, and third transistors having first, second, and third gates and a source and a drain shared by said first, second, and third gates, comprising:

the first step of forming a cap insulating film having a low etching rate on a semiconductor substrate;

the second step of processing said cap insulating film and said semiconductor substrate to form a pillar projection having a predetermined width on a surface of said semiconductor substrate;

the third step of forming a side-wall insulating film only on side surfaces of said pillar projection and said cap insulating film;

the fourth step of forming an element isolation insulating film having an enough thickness to bury said pillar projection and said cap insulating film and polishing said element isolation insulating film by using said cap insulating film as a stopper;

the fifth step of partially removing said side-wall insulating film and said element isolation insulating film together with said cap insulating film;

the sixth step of forming narrow gaps by selectively removing portions of said side-wall insulating film, thereby exposing portions of the two side surfaces of said pillar projection and portions of the surface of said semiconductor substrate near said pillar projection;

the seventh step of forming a gate insulating film covering inner walls of said narrow gaps;

the eighth step of forming a first conductive film on said element isolation insulating film so as to bury said narrow gaps via said gate insulating film and processing said first conductive film into a predetermined shape;

the ninth step of forming said source and drain by doping an impurity into said pillar projection by using said first conductive film as a mask;

the tenth step of processing said first conductive film to divide said first conductive film on said pillar projection, thereby forming said first and second gates;

the eleventh step of forming an insulating interlayer on said first and second gates and processing said insulating interlayer to expose only a portion of said gate insulating film formed on an upper surface of said pillar projection; and the twelfth step of forming a second conductive film on said insulating interlayer including said exposed gate insulating film and processing said second conductive film to form said third gate by patterning.

23. A method according to claim 22, wherein the twelfth step comprises the steps of:

processing said second conductive film into an island shape on said element isolation insulating film;

forming a capacitance insulating film so as to cover a surface of said second conductive film;

forming a third conductive film so as to cover said second conductive film via said capacitance insulating film and processing said third conductive film and said capacitance insulating film into a predetermined shape; and forming a floating gate electrode made of said second conductive film and a control gate electrode opposing said floating gate electrode via said capacitance insulating film and made of said third conductive film.

24. A method according to claim 22, further comprising, after the twelfth step:

the thirteenth step of forming a capacitor electrode opposing one of said source and drain via a capacitance insulating film.

25. A method of fabricating a semiconductor device comprising a semiconductor substrate and first and second transistors having first and second gates and a source and a drain shared by said first and second gates, comprising:

the first step of forming a cap insulating film having a low etching rate on a semiconductor substrate;

the second step of processing said cap insulating film and said semiconductor substrate to form a pillar projection having a predetermined width on a surface of said semiconductor substrate;

the third step of forming a side-wall insulating film only on side surfaces of said pillar projection and said cap insulating film;

the fourth step of forming an element isolation insulating film having an enough thickness to bury said pillar projection and said cap insulating film and polishing said element isolation insulating film by using said cap insulating film as a stopper;

the fifth step of partially removing said side-wall insulating film and said element isolation insulating film together with said cap insulating film;

the sixth step of forming narrow gaps by selectively removing portions of said side-wall insulating film, thereby exposing portions of the two side surfaces of said pillar projection and portions of the surface of said semiconductor substrate near said pillar projection;

the seventh step of forming a gate insulating film covering inner walls of said narrow gaps;

the eighth step of doping an impurity into an entire surface to form said drain in an upper surface region of said pillar projection and said source in a surface region of said semiconductor substrate;

the ninth step of forming a conductive film on said element isolation insulating film so as to bury said narrow gaps via said gate insulating film; and the tenth step of processing said first conductive film to divide said first conductive film on said pillar projection, thereby forming said first and second gates.

26. A method according to claim 25, further comprising, after the sixth step and before the seventh step:

the eleventh step of removing an upper portion of said third insulating film, wherein the tenth step comprises the step of dividing said conductive film by polishing said conductive film by using an upper surface of said pillar projection as a stopper.

27. A method according to claim 25, further comprising, after the tenth step:

the twelfth step of forming an insulating interlayer covering the exposed upper surface of said pillar projection and said first conductive film;

the thirteenth step of processing said insulating interlayer to again partially expose the upper surface of said pillar projection; and the fourteenth step of forming an interconnecting film by patterning on said insulating interlayer including the exposed upper surface of said pillar projection and electrically connecting said interconnecting film to said drain.

28. A method of fabricating a semiconductor device, comprising:

the first step of forming a first insulating film serving as an element isolation insulating film on a semiconductor substrate;

the second step of processing said first insulating film to form a trench which exposes a portion of a surface of said semiconductor substrate;

the third step of forming a polycrystalline silicon film covering said first insulating film so as to bury said trench;

the fourth step of forming a second insulating film on said polycrystalline silicon film;

the fifth step of processing said polycrystalline silicon film and said second insulating film to form a pillar projection made of said polycrystalline silicon film and a cap insulating film of said pillar projection on said semiconductor substrate in said trench;

the sixth step of performing a heat treatment to change said pillar projection into a single crystal;

the seventh step of forming a third insulating film on the surface of said semiconductor surface exposed in said trench and side surfaces of said pillar projection;

the eighth step of doping an impurity into an entire surface under conditions by which said impurity passes through said cap insulating film and doping an impurity under conditions by which said impurity stops in said cap insulating film, thereby forming a pair of diffusion regions in an upper surface region of said pillar projection and a surface region of said semiconductor substrate;

the ninth step of forming a conductive film on an entire surface and processing said conductive film into a predetermined shape; and the tenth step of polishing said conductive film by using said cap insulating film as a stopper until a surface of said cap insulating film is exposed, thereby dividing said conductive film.

29. A method of fabricating a semiconductor device, comprising:

the first step of forming a first insulating film serving as an element isolation insulating film on a semiconductor substrate;

the second step of processing said first insulating film to form a first trench which exposes a portion of a surface of said semiconductor substrate;

the third step of forming a polycrystalline silicon film covering said first insulating film so as to bury said first trench;

the fourth step of forming a second insulating film on said polycrystalline silicon film;

the fifth step of processing said polycrystalline silicon film and said second insulating film to form a pillar projection, which is made of said polycrystalline silicon film and fills said first trench except for a substantially central portion, and a cap insulating film of said pillar projection on said semiconductor substrate in said first trench;

the sixth step of performing a heat treatment to change said pillar projection into a single crystal;

the seventh step of forming a third insulating film on the surface of said semiconductor substrate exposed in said first trench and side surfaces of the substantially central portion of said pillar projection;

the eighth step of forming a first conductive film on an entire surface so as to bury an exposed portion in said first trench;

the ninth step of processing said first conductive film and said cap insulating film to expose an upper surface of said pillar projection on two sides of said first conductive film and said cap insulating film;

the tenth step of forming a pair of diffusion layers by doping an impurity into said pillar projection from the exposed upper surface of said pillar projection by using said first conductive film as a mask; and the eleventh step of polishing said first conductive film by using said cap insulating film as a stopper to divide said first conductive film by said cap insulating film.

30. A method according to claim 29, further comprising, after the eleventh step:

the twelfth step of forming a fourth insulating film so as to cover said first conductive film;

the thirteenth step of processing said fourth insulating film, said first conductive film, and said cap insulating film to form a second trench which exposes the upper surface of said pillar projection;

the fourteenth step of forming a fifth insulating film covering side surfaces of at least said first conductive film exposed in said second trench; and the fifteenth step of forming a second conductive film burying said second trench by patterning.

* * * * *